United States Patent
Zhu

(10) Patent No.: US 7,701,013 B2
(45) Date of Patent: Apr. 20, 2010

(54) NANOELECTROMECHANICAL TRANSISTORS AND METHODS OF FORMING SAME

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 11/775,558

(22) Filed: Jul. 10, 2007

(65) Prior Publication Data
US 2009/0014803 A1 Jan. 15, 2009

(51) Int. Cl.
*H01L 29/80* (2006.01)
(52) U.S. Cl. .......... 257/368; 257/213; 257/288; 257/E27.06; 257/E29.255
(58) Field of Classification Search .......... 257/213, 257/288, 368, E27.06, E29.255
See application file for complete search history.

(56) References Cited

U.S. PATENT DOCUMENTS

| | | | |
|---|---|---|---|
| 6,348,295 B1 | 2/2002 | Griffith et al. | |
| 6,472,705 B1 | 10/2002 | Bethune et al. | |
| 6,509,605 B1 * | 1/2003 | Smith | 257/316 |
| 6,574,130 B2 | 6/2003 | Segal et al. | |
| 6,643,165 B2 | 11/2003 | Segal et al. | |
| 6,664,027 B2 | 12/2003 | Griffith et al. | |
| 6,706,402 B2 | 3/2004 | Rueckes et al. | |
| 6,750,471 B2 | 6/2004 | Bethune et al. | |
| 6,784,028 B2 | 8/2004 | Rueckes et al. | |
| 6,803,260 B2 | 10/2004 | Shin et al. | |
| 6,835,591 B2 | 12/2004 | Rueckes et al. | |
| 6,836,424 B2 | 12/2004 | Segal et al. | |
| 6,887,450 B2 | 5/2005 | Chen et al. | |
| 6,911,682 B2 | 6/2005 | Rueckes et al. | |
| 6,919,592 B2 | 7/2005 | Segal et al. | |
| 6,924,538 B2 | 8/2005 | Jaiprakash et al. | |
| 6,942,921 B2 * | 9/2005 | Rueckes et al. | 428/408 |
| 6,944,054 B2 | 9/2005 | Rueckes et al. | |
| 6,962,839 B2 | 11/2005 | Wei et al. | |
| 6,979,590 B2 | 12/2005 | Rueckes et al. | |
| 6,982,903 B2 | 1/2006 | Bertin et al. | |
| 6,990,009 B2 * | 1/2006 | Bertin et al. | 365/151 |
| 6,995,046 B2 | 2/2006 | Rueckes et al. | |
| 7,115,901 B2 | 10/2006 | Bertin et al. | |

(Continued)

OTHER PUBLICATIONS

Rueckes et al., "Carbon Nanotube-Based Nonvolatile Random Access Memory for Molecular Computing," www.sciencemag.org, vol. 289, Jul. 7, 2000, pp. 94-97.

(Continued)

*Primary Examiner*—Bradley K Smith
*Assistant Examiner*—Marvin Payen
(74) *Attorney, Agent, or Firm*—Ian MacKinnon; Hoffman Warnick LLC

(57) ABSTRACT

Nanoelectromechanical transistors (NEMTs) and methods of forming the same are disclosed. In one embodiment, an NEMT may include a substrate including a gate adjacent thereto, a source region and a drain region; an electromechanically deflectable nanotube member; and a channel member electrically insulatively coupled to the nanotube member so as to be aligned with the source region and the drain region, wherein electromechanical deflection of the nanotube member is controllable, in response to an electrical potential applied to the gate and the nanotube member, between an off state and an on state, the on state placing the channel member in electrical connection with the source region and the drain region to form a current path.

19 Claims, 90 Drawing Sheets

U.S. PATENT DOCUMENTS

| | | |
|---|---|---|
| 7,115,960 B2 | 10/2006 | Bertin et al. |
| 7,161,218 B2 * | 1/2007 | Bertin et al. ................ 257/415 |
| 2002/0175408 A1 | 11/2002 | Mujumdar et al. |
| 2004/0144972 A1 | 7/2004 | Dai et al. |
| 2005/0035786 A1 | 2/2005 | Bertin et al. |
| 2005/0035787 A1 | 2/2005 | Bertin et al. |
| 2005/0104085 A1 | 5/2005 | Pinkerton et al. |
| 2005/0179339 A1 | 8/2005 | Pinkerton et al. |
| 2005/0270824 A1 | 12/2005 | Bertin et al. |
| 2005/0282515 A1 | 12/2005 | Bertin |
| 2006/0061389 A1 | 3/2006 | Bertin |
| 2006/0193093 A1 | 8/2006 | Bertin et al. |

OTHER PUBLICATIONS

Ward et al., "A Non-Volatile Nanoelectromechanical Memory Element Utilizing a Fabric of Carbon Nanotubes," IEEE, 2004, pp. 34-38.

Abelé et al., "Suspended-Gate MOSFET: bringing new MEMS functionality into solid-state MOS transistor," IEEE, 2005, pp. 1-3.

Kam et al., "A New Nano-Electro-Mechanical Field Effect Transistor (NEMFET) Design for Low-Power Electronics," IEEE, 2005, pp. 1-4.

Jang et al., "Nanoelectromechanical DRAM for ultra-large-scale integration (ULSI)," IEEE, 2005, pp. 1-4.

* cited by examiner

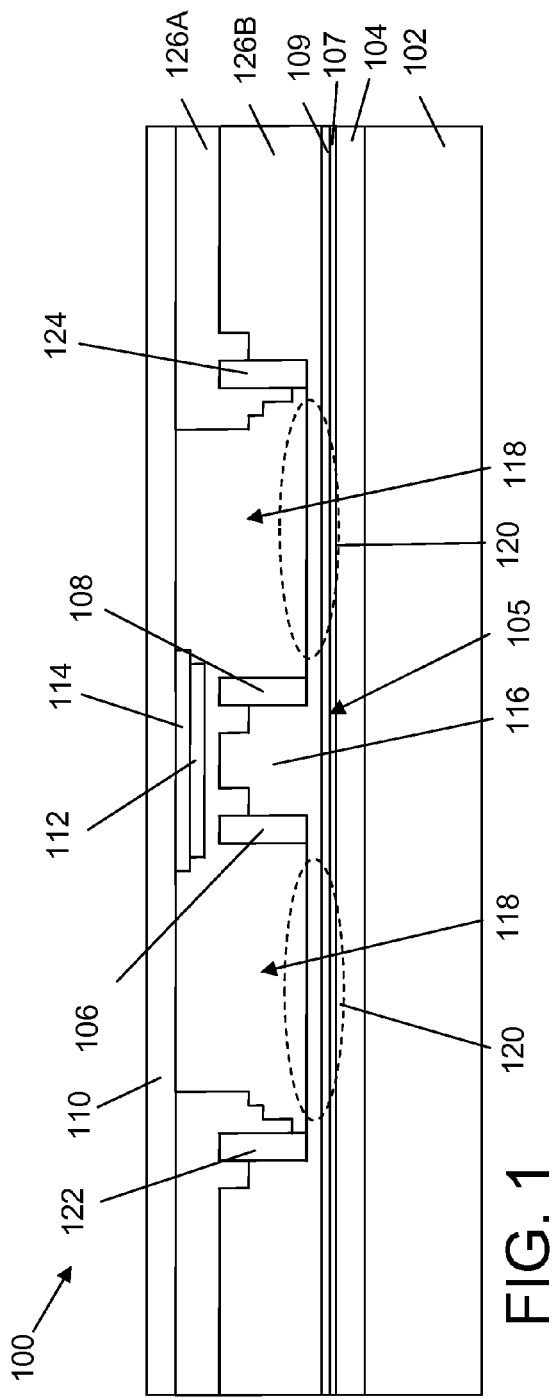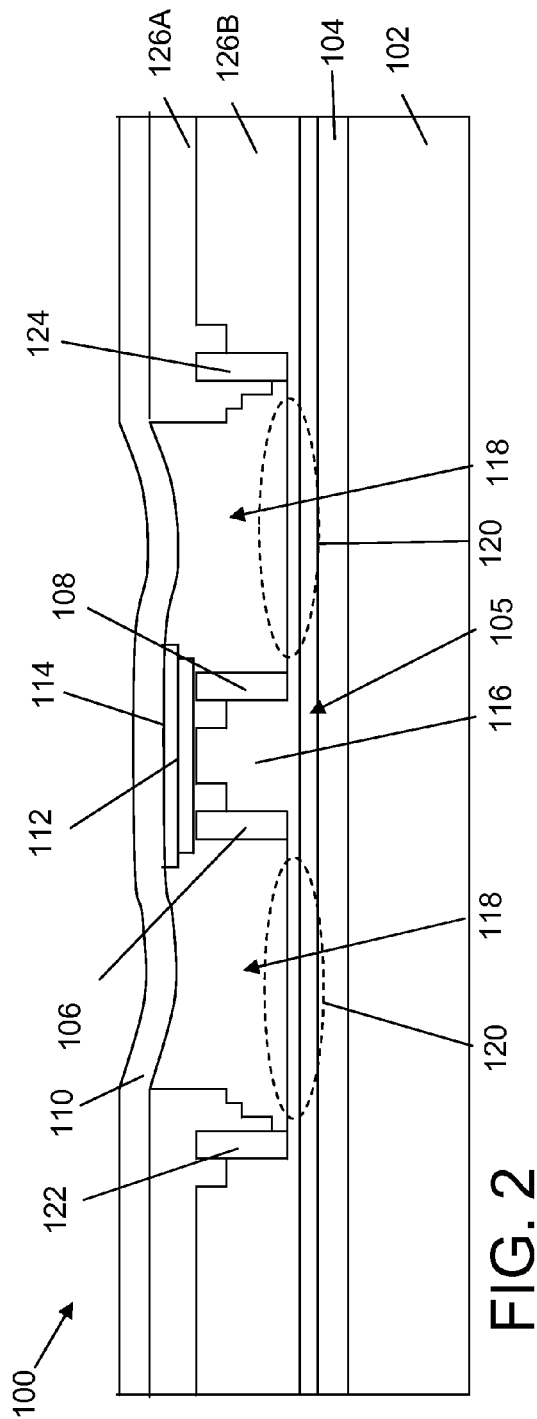

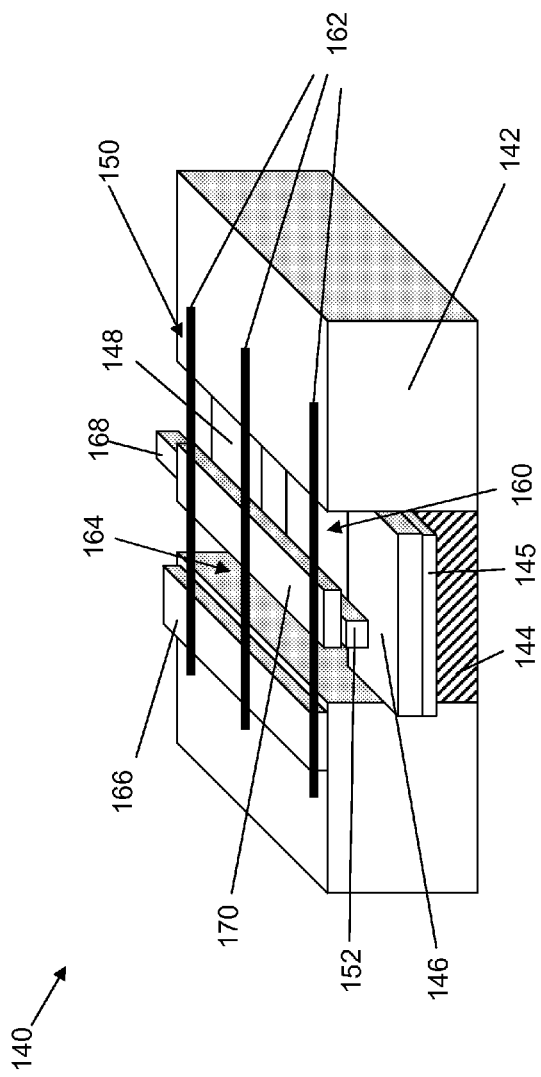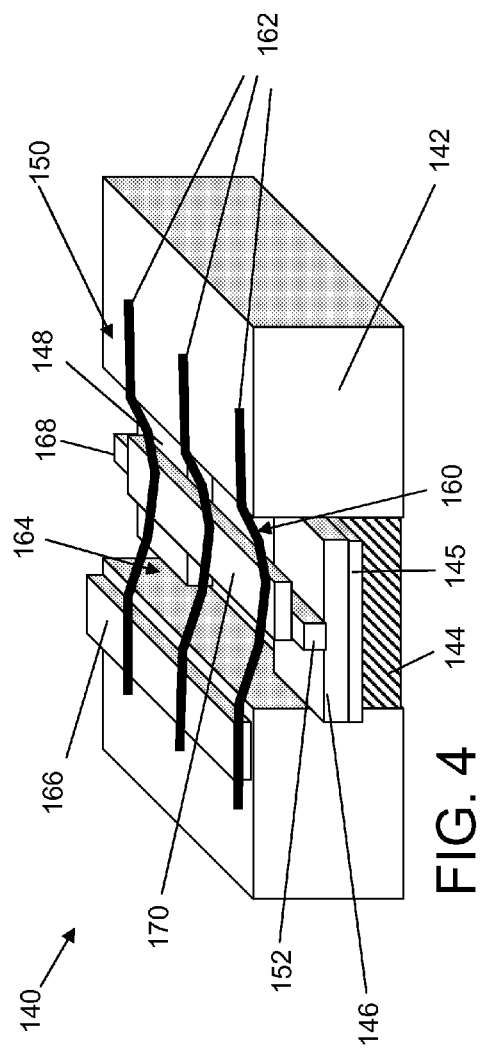

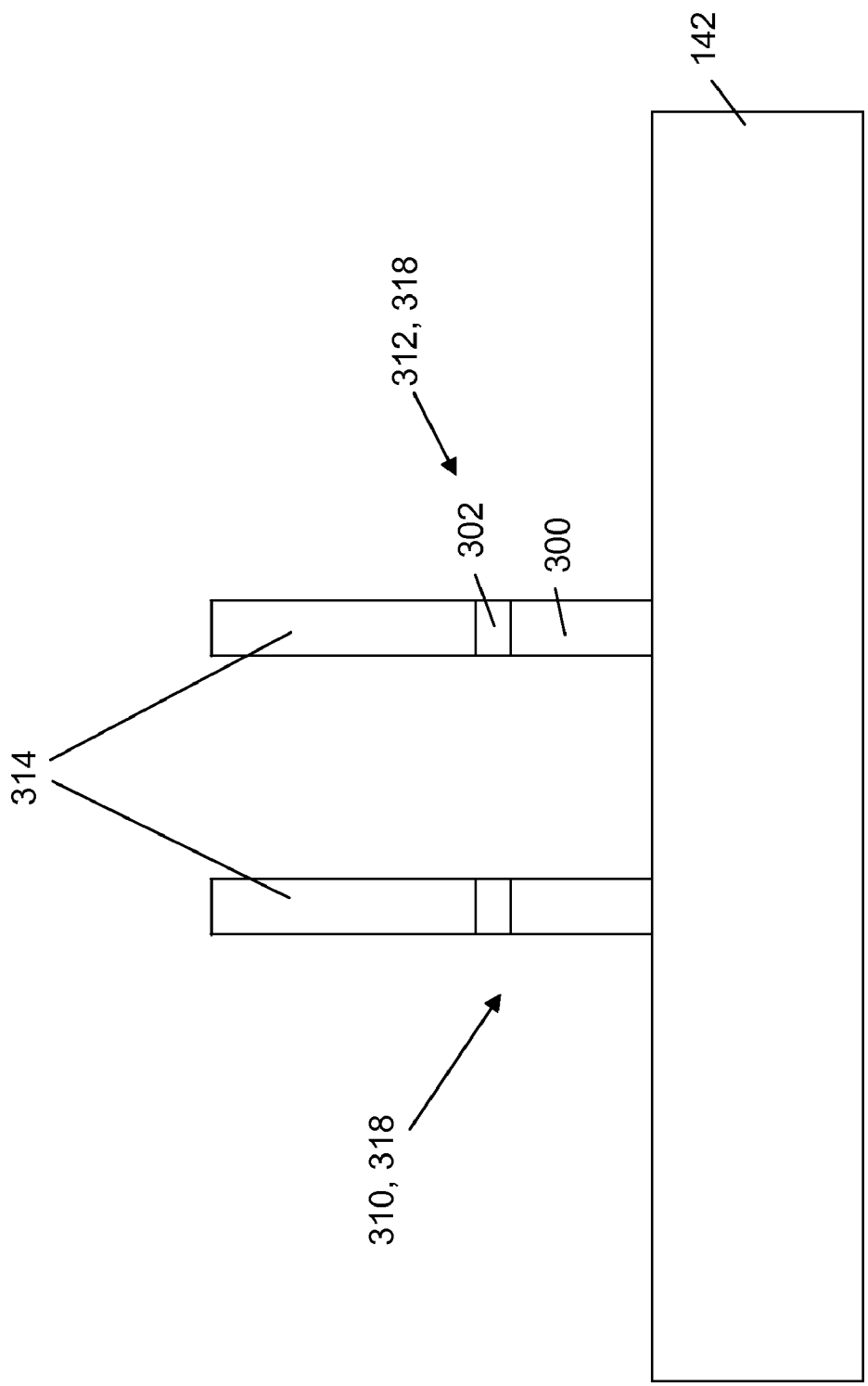

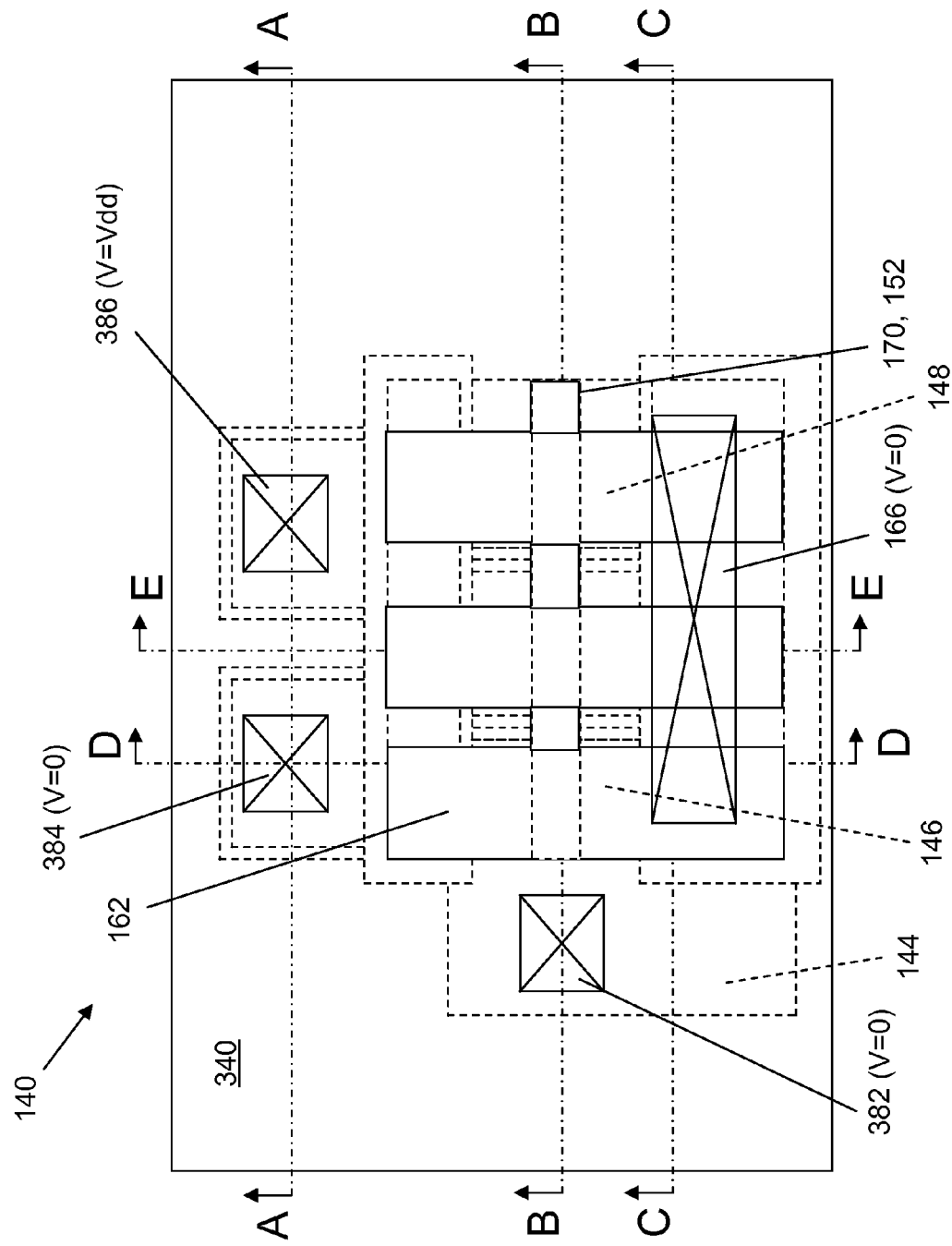

NANOELECTROMECHANICAL TRANSISTORS AND METHODS OF FORMING SAME

This application relates to U.S. Ser. No. 11/776,160, having the same title.

BACKGROUND

1. Technical Field

The disclosure relates generally to integrated circuit (IC) chip fabrication, and more particularly, to nanoelectromechanical transistors and methods of forming the same.

2. Background Art

In the integrated circuit (IC) chip fabrication industry, interest is growing regarding the use of nanoelectromechanical transistors (NEMT) or switches. NEMTs use carbon nanotubes to form switch structures. For example, U.S. Pat. No. 6,990,009 to Bertin et al. discloses one nanotube-based switching element with multiple controls. In this switch, the carbon nanotube is drawn downwardly by a potential applied to a gate and acts as a contact between the source and drain of the switch. Hence, the carbon nanotube constitutes an integral part of the switch and must be conductive. One issue limiting the use of NEMTs is that it is difficult to control the resistance of the nanotube. In particular, current techniques for growing carbon nanotubes typically result in some nanotubes having metal-like characteristics and some having semiconductor characteristics. Unfortunately, the unpredictability prevents the necessary amount of manufacturing control over the ratio of the on-current to off-current. Hence, use of carbon nanotubes for massive manufacturing of nanoelectromechanical switches or transistors is currently impracticable.

SUMMARY

Nanoelectromechanical transistors (NEMTs) and methods of forming the same are disclosed. In one embodiment, an NEMT may include a substrate including a gate adjacent thereto, a source region and a drain region; an electromechanically deflectable nanotube member; and a channel member electrically insulatively coupled to the nanotube member so as to be aligned with the source region and the drain region, wherein the electromechanical deflection of the nanotube member is controllable, in response to an electrical potential applied to the gate and the nanotube member, between an off state and an on state, the on state placing the channel member in electrical connection with the source region and the drain region to form a current path.

A first aspect of the disclosure provides a nanoelectromechanical transistor (NEMT) comprising: an insulative substrate including a gate adjacent thereto, and a source region and a drain region separated from the gate by an insulator; an electromechanically deflectable nanotube member; and a channel member electrically insulatively coupled to the nanotube member so as to be aligned with the source region and the drain region, wherein the electromechanical deflection of the nanotube member is controllable, in response to an electrical potential applied to the gate and the nanotube member, between an off state and an on state, the on state placing the channel member in electrical connection with the source region and the drain region to form a current path.

A second aspect of the disclosure provides a nanoelectromechanical transistor (NEMT) comprising: a substrate including a gate adjacent thereto, a metal source region and a metal drain region; an electromechanically deflectable nanotube member; and a metal channel member coupled to the nanotube member so as to be aligned with the metal source region and the metal drain region, wherein the electromechanical deflection of the nanotube member is controllable, in response to an electrical potential applied to the gate and the nanotube member, between an off state and an on state, the on state placing the metal channel member in electrical connection with the metal source region and the metal drain region to form a current path.

A third aspect of the disclosure provides a nanoelectromechanical transistor (NEMT) comprising: an insulative substrate including a gate adjacent thereto, a source region and a drain region separated from the gate by an insulator, the source region and the drain region positioned at one of: a) a distance from a central region over the gate, and b) adjacent to a pedestal area in a central region over the gate; an electromechanically deflectable nanotube member; and a channel member electrically insulatively coupled to the nanotube member so as to be aligned with the source region and the drain region, wherein the electromechanical deflection of the nanotube member is controllable, in response to an electrical potential applied to the gate and the nanotube member, between an off state and an on state, the on state placing the channel member in electrical connection with the source region and the drain region to form a current path.

A fourth aspect of the disclosure provides an inverter comprising: a first nanoelectromechanical transistor (NEMT) and a second NEMT, each NEMT including: a substrate including a gate adjacent thereto, a source region and a drain region; an electromechanically deflectable nanotube member; and a channel member electrically insulatively coupled to the nanotube member so as to be aligned with the source region and the drain region, wherein the electromechanical deflection of the nanotube member is controllable, in response to an electrical potential applied to the gate and the nanotube member, between an off state and an on state, the on state placing the channel member in electrical connection with the source region and the drain region to form a current path, and wherein the source region and the nanotube member of the first NEMT are electrically connected to a power source, the drain region and the nanotube member of the second NEMT are electrically grounded, the drain region of the first NEMT and the source region of the second NEMT are electrically connected to an output potential, and the gates of the first NEMT and the second NEMT are electrically coupled to an input potential.

A fifth aspect of the disclosure provides a method of forming a nanoelectromechanical transistor (NEMT), the method comprising: providing an insulative substrate having a metal gate layer over the insulative substrate and at least one insulator layer over the metal gate layer; forming a first opening and a second opening through the at least one first insulator layer, leaving a pedestal area therebetween; forming a source region within one of the first and second openings adjacent to the pedestal area and a drain region within the other of the first and second openings adjacent to the pedestal area; forming a metal channel member; and forming a nanotube member insulatively coupled to the metal channel member, wherein, in response to an electrical potential applied to the gate and the nanotube member, the nanotube member is electromechanically deflectable between an off state and an on state, the on state placing the channel member in electrical connection with the source region and the drain region to form a current path.

A sixth aspect of the disclosure provides a method of forming a nanoelectromechanical transistor (NEMT), the method comprising: providing an insulative substrate having a first metal layer over the insulative substrate and a first insulator layer over the first metal layer; forming a source region and a drain region within an opening of the insulative substrate, the source region and the drain region being distanced from one another; forming a gate from a second metal layer; forming an elongated channel member having an insulator member coupled thereto; and forming a plurality of nanotube elements coupled to the elongated channel member such that the insulator member electrically insulates the plurality of nanotube elements from the elongated channel member, wherein, in response to an electrical potential applied to the gate and the nanotube elements, the nanotube elements are electromechanically deflectable between an off state and an on state, the on state placing the elongated channel member in electrical connection with the source region and the drain region to form a current path.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 1 and 2 show an off and an on state, respectively, of embodiments of a nanoelectromechanical transistor (NEMT) according to the disclosure.

FIGS. 3 and 4 show an off and an on state, respectively, of other embodiments of a NEMT according to the disclosure.

FIGS. 6-20A show embodiments of a method of forming the NEMT of FIGS. 1-2.

FIGS. 21A-40E show embodiments of a method of forming NEMT 140 of FIGS. 3-4.

Figure 5:
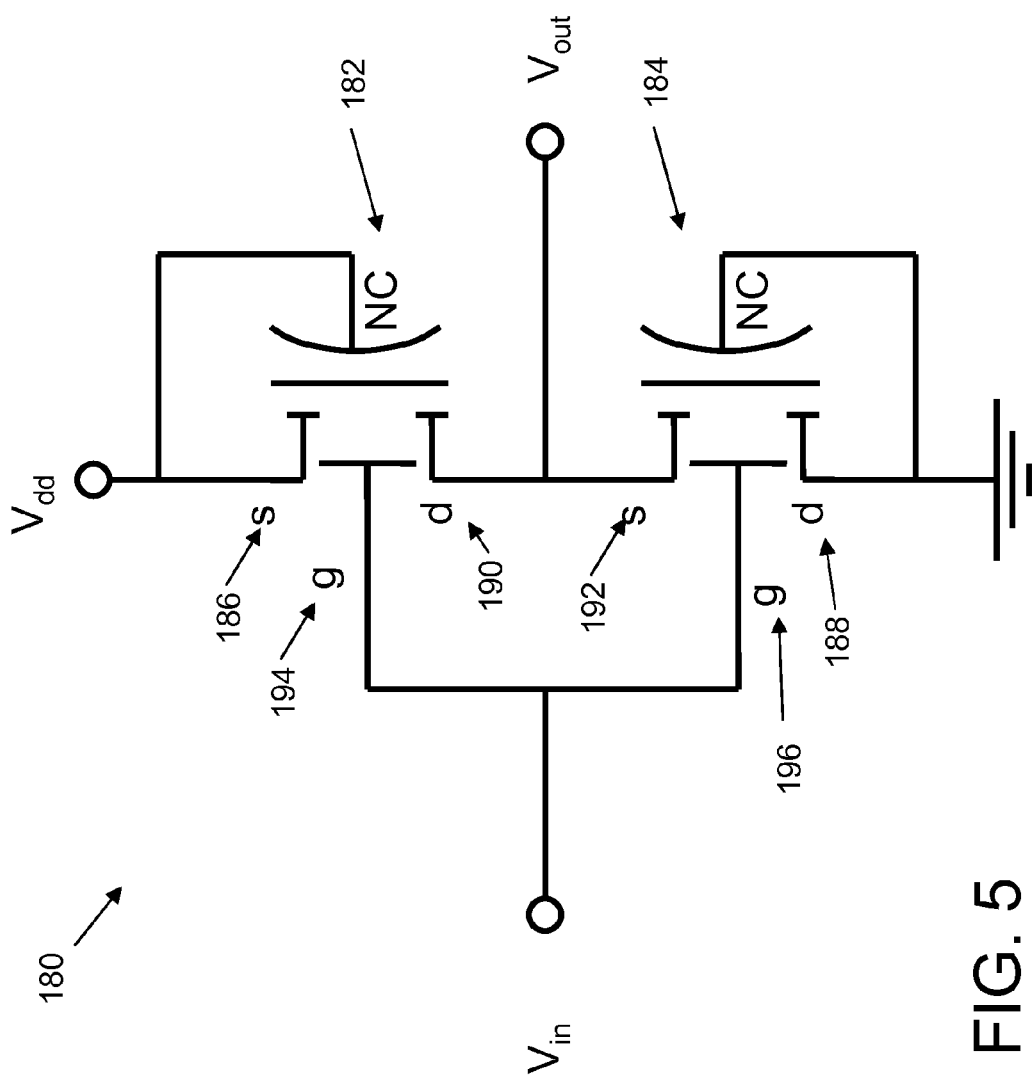
FIG. 5 shows one illustrative application of NEMTs according to FIGS. 1-4.

In the drawings, the following convention has been employed relative to FIGS. 6-40E for clarity and uniformity among the drawings. A series of figures (e.g., FIG. 36, 36B, 36D, 36E) having the same number indicate a particular stage of processing. The figure with only the number is a top view, while those with a number and letter indicate the cross-sectional view as indicated in the top view. Although a number of cross-sectional views may be indicated in the top view, a corresponding figure for each may not have been necessary and, hence, may not have been provided.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

1$^{st}$ Embodiment of NEMT

Turning to FIGS. 1-4, various embodiments of a nanoelectromechanical transistor (NEMT) are shown. FIGS. 1-2 show one embodiment in which an NEMT 100 includes an insulative substrate 102 including a gate 104 thereover, and a source region 106 and a drain region 108 separated from gate 104 by an insulator 105. In one embodiment, insulator 105 may include a layer 107 of, for example, silicon nitride ($Si_3N_4$) and a high dielectric (high-k) layer 109 (e.g., hafnium oxide $HfO_2$); however, the latter may be omitted in some instances. (Note, only 105 is shown in figures other than FIG. 1). Substrate 102 may include an insulator material such as, but not limited to: silicon oxide ($SiO_2$), silicon nitride ($Si_3N_4$), fluorinated $SiO_2$ (FSG), hydrogenated silicon oxycarbide (Si-COH), porous SiCOH, boro-phosho-silicate glass (BPSG), silicon oxide, silsesquioxanes, carbon (C) doped oxides (i.e., organosilicates) that include atoms of silicon (Si), carbon (C), oxygen (O), and/or hydrogen (H), thermosetting polyarylene ethers, a polyarylene ether (e.g., SiLK™ available from Dow Chemical Corporation), a spin-on silicon-carbon containing polymer material (available from JSR Corporation), other low dielectric constant (k<3.9) material, or layers thereof.

NEMT 100 also includes an electromechanically deflectable nanotube member 110 (hereinafter "nanotube member 110"). Nanotube member 110 may be in the form of a patterned portion of a carbon nanotube layer (FIGS. 18-18A), which may be formed using any now known or later developed process. A channel member 112 is electrically insulatively coupled to nanotube member 110 so as to be aligned with source region 106 and drain region 108. In one embodiment, channel member 112, gate 104, source region 106 and drain region 108, as is described in greater detail herein, may include a metal such as titanium or titanium nitride (TiN). Channel member 112 may be electrically insulatively coupled to nanotube member 110 by an insulator member 114, which may include silicon nitride ($Si_3N_4$), silicon oxide ($SiO_2$) or low-k (k<3.9) materials. As is described in greater detail herein, channel member 112 may be self-aligned to source region 106 and drain region 108, collectively.

Source region 106 and drain region 108 are in close proximity to one another, e.g., less than 100 nm, which provides faster performance, requires less power to deflect nanotube member 110 and minimizes the space required for NEMT 100. In this embodiment, source region 106 and drain region 108 are positioned adjacent to a pedestal area 116 (e.g., of silicon nitride ($Si_3N_4$) or other insulator) in a generally central region of gate 104. An area outside of source region 106 and drain region 108 may include a void 118, which provides space for deflection of nanotube member 110.

Electromechanical deflection of nanotube member 110 is controllable, in response to an electrical potential applied to gate 104 and nanotube member 110, between an off or off state (FIG. 1) and an on or on state (FIG. 2). As shown in FIG. 2, the on state places channel member 112 in electrical connection with source region 106 and drain region 108 to form a current path. In one embodiment, an opposite polarity is applied to gate 104 and nanotube member 110 to create an electromechanical attraction sufficient to deflect nanotube member 110. A capacitor region 120 is formed on an opposite side of source and drain region 106, 108 from pedestal area 116, i.e., within voids 118, by the potentials.

Contacts (not shown in FIGS. 1-2) may be made to source region 106, drain region 108 and/or gate 104 using any now known or later developed techniques, e.g., wiring and/or contact vias. Note, that source region 106 and drain region 108 may include outer portions 122, 124, respectively, allowing contact thereto. Source region 106 and drain region 108 are surrounded by an insulator layer(s) 126A-B, which may include, for example, silicon nitride ($Si_3N_4$), silicon oxide ($SiO_2$) and/or other insulator materials.

2$^{nd}$ Embodiment of NEMT

Referring to FIGS. 3-4, another embodiment of an NEMT 140 is shown. NEMT 140 includes an insulative substrate 142 including a gate 144, and a source region 146 and a drain region 148 separated from gate 144 by an insulator layer 145.

Unless otherwise stated, components of NEMT 140 include the same materials as their counterparts in NEMT 100. In this embodiment, source region 146 and drain region 148 are distanced from a central region over gate 144, which provides a capacitor region 160 in between source region 146 and drain region 148.

NEMT 140 also includes an electromechanically deflectable nanotube member 150 (hereinafter "nanotube member 150"). In this embodiment, nanotube member 150 includes a plurality of nanotube elements 162 extending across an opening 164 in which source region 146 and drain region 148 are positioned within substrate 102. (Note, nanotubes elements 162 are shown more slender compared to the surrounding structure than they may actually be generated for clarity purposes and to foster understanding of the surrounding structure. Compare FIGS. 3-4 with FIG. 38). A nanotube contact 166 may be provided for electrically connecting each of the plurality of nanotube elements 162. Alternatively, nanotube contact 166 may be omitted, and each nanotube element 162 contacted separately. A channel member 152 is electrically insulatively coupled to nanotube elements 162 so as to be aligned with source region 146 and drain region 148. In this embodiment, channel member 152 includes an elongated conductive element 168 (e.g., a bar) electrically insulatively coupled to each of the plurality of nanotube elements 162. Channel member 152 may be electrically insulatively coupled to nanotube elements 162 by an insulator member 170, which may include silicon nitride ($Si_3N_4$), oxynitride, etc. (Note: channel member 152 is shown longer than it may be formed so that it is visible in the figures below insulator member 170, i.e., it may be the same length as or shorter than insulator member 170.)

Electromechanical deflection of nanotube member 150 is controllable, in response to an electrical potential applied to gate 144 and nanotube member 150 (e.g., via nanotube contact 166), between an off or off state (FIG. 3) and an on or on state (FIG. 4). In the on state shown in FIG. 4, channel member 168 is placed in electrical connection with source region 146 and drain region 148 to form a current path. In one embodiment, an opposite polarity is applied to gate 144 and nanotube member 150 to create an electromechanical attraction sufficient to deflect nanotube member 150. A capacitor region 160 is formed between source and drain region 146, 148, i.e., within a void in substrate 142, by the potentials.

Contacts (not shown in FIGS. 3-4) may be made to source region 146, drain region 148 and gate 144 using any now known or later developed techniques, e.g., wiring and/or contact vias.

Illustrative Application: Inverter

FIG. 5 shows one illustrative application of NEMTs 100, 140 according to FIGS. 1-4. In this case, an inverter 180 includes a first NEMT 182 and a second NEMT 184. Each NEMT 182, 184 may take the form of either NEMT 100, 140, described above. Each NEMT 182, 184 includes a substrate 102, 142 including a gate 104, 144, a source region 106, 146 and a drain region 108, 148, an electromechanically deflectable nanotube member 110, 150, and a channel member 112, 152 electrically insulatively coupled to the nanotube member so as to be aligned with source region 106, 146 and drain region 108, 148. As described above, electromechanical deflection of nanotube member 110,150 is controllable, in response to an electrical potential applied to gate 104, 144 and nanotube member 110, 150, between an off or off state (FIGS. 1 and 3) and an on or on state (FIGS. 2 and 4), the on state placing channel member 112, 152 in electrical connection with the source region and the drain region to form a current path.

Inverter 180 is configured to have: source region 186 and the nanotube member of first NEMT 182 electrically connected to a power source ($V_{dd}$); drain region 188 and the nanotube member of second NEMT 184 electrically grounded; drain region 190 of first NEMT 182 and source region 192 of second NEMT 184 electrically connected to an output potential ($V_{out}$), and gates 194, 196 of first NEMT 182 and second NEMT 184 electrically coupled to an input potential ($V_{in}$).

First Embodiments of Method

Figure 6:
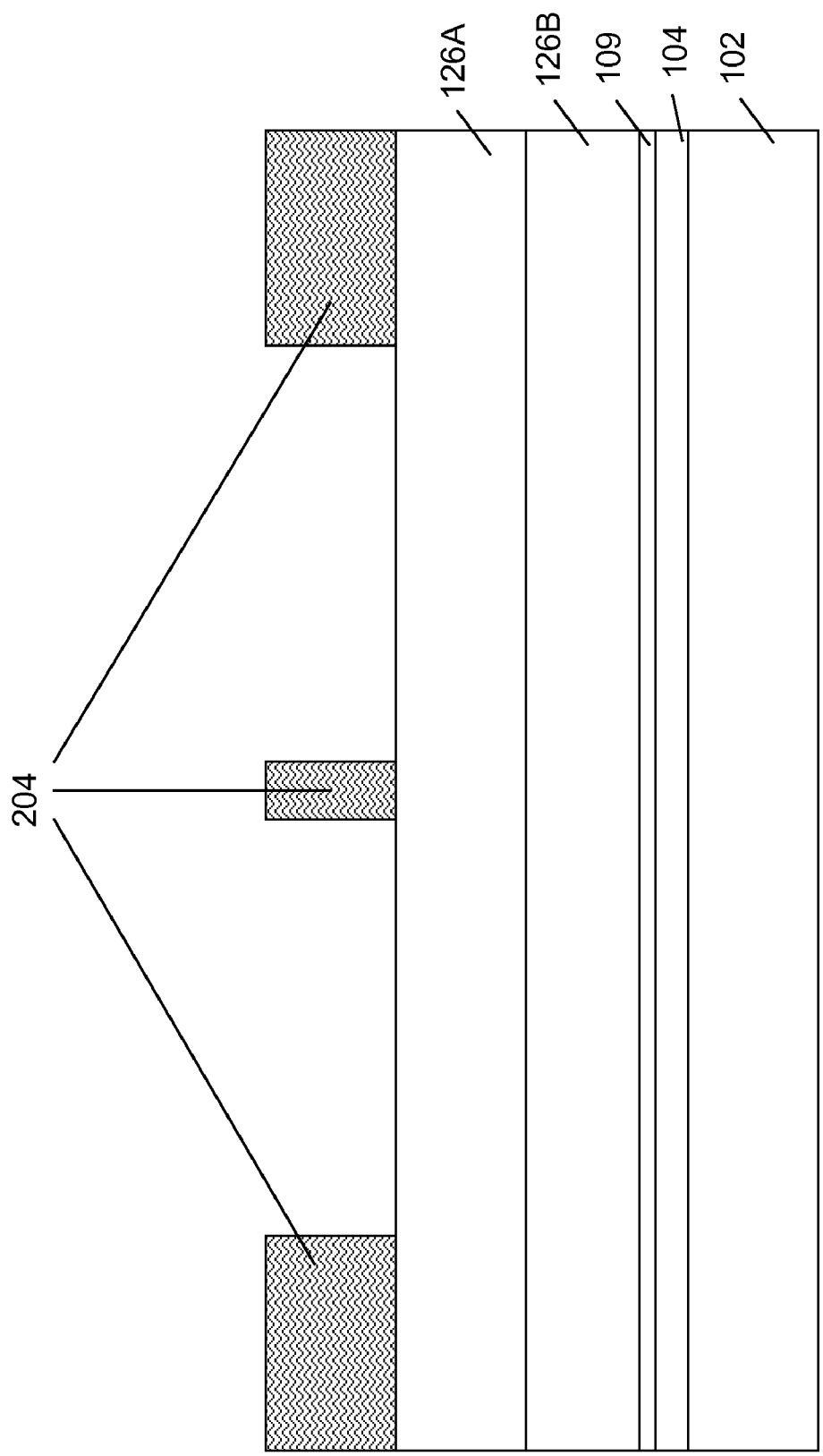

Turning to FIGS. 6-20A, embodiments of a method of forming NEMT 100 of FIGS. 1-2 are shown. In FIG. 6, an insulative substrate 102 is provided having a metal gate layer 104 over the insulative substrate and at least one insulator layer 126A-B over metal gate layer 104. Insulative substrate 102 may include an insulator material such as, but not limited to: silicon oxide ($SiO_2$), silicon nitride ($Si_3N_4$), fluorinated $SiO_2$ (FSG), hydrogenated silicon oxycarbide (SiCOH), porous SiCOH, boro-phosho-silicate glass (BPSG),silicon oxide, silsesquioxanes, carbon (C) doped oxides (i.e., organosilicates) that include atoms of silicon (Si), carbon (C), oxygen (O), and/or hydrogen (H), thermosetting polyarylene ethers, a polyarylene ether (e.g., SiLK™ available from Dow Chemical Corporation), a spin-on silicon-carbon containing polymer material (available from JSR Corporation), other low dielectric constant (k<3.9) material, or layers thereof. In one embodiment, insulative substrate 102 includes silicon oxide ($SiO_2$). Gate metal layer 104 may be formed, for example, by atomic layer deposition of a metal such as titanium to a thickness of, for example, approximately 10-20 nm. As shown in FIG. 6, a high-k layer 109 may optionally be provided, but may not be necessary. Insulator layer(s) 126A-B, in one embodiment, may include a nitride layer 126A, e.g., silicon nitride ($Si_3N_4$) chemical vapor deposited to a thickness of approximately 20-50 nm over metal gate layer 104, and an oxide layer 126B, e.g., silicon oxide ($SiO_2$), chemical vapor deposited to a thickness of approximately 40-80 nm over nitride layer 126A.

It is understood that descriptions of particular deposition techniques are only illustrative and that a variety of different deposition techniques may be applied in any particular case. Further, where no deposition technique is stated, any now known or later developed deposition technique appropriate for the specific material may be employed. For example, as used herein, "deposition" includes any now known or later developed techniques appropriate for the material to be deposited including but are not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating and evaporation. Furthermore, while particular thicknesses of materials have been disclosed, the size of structures may vary and remain within the scope of the disclosure.

Figure 7:
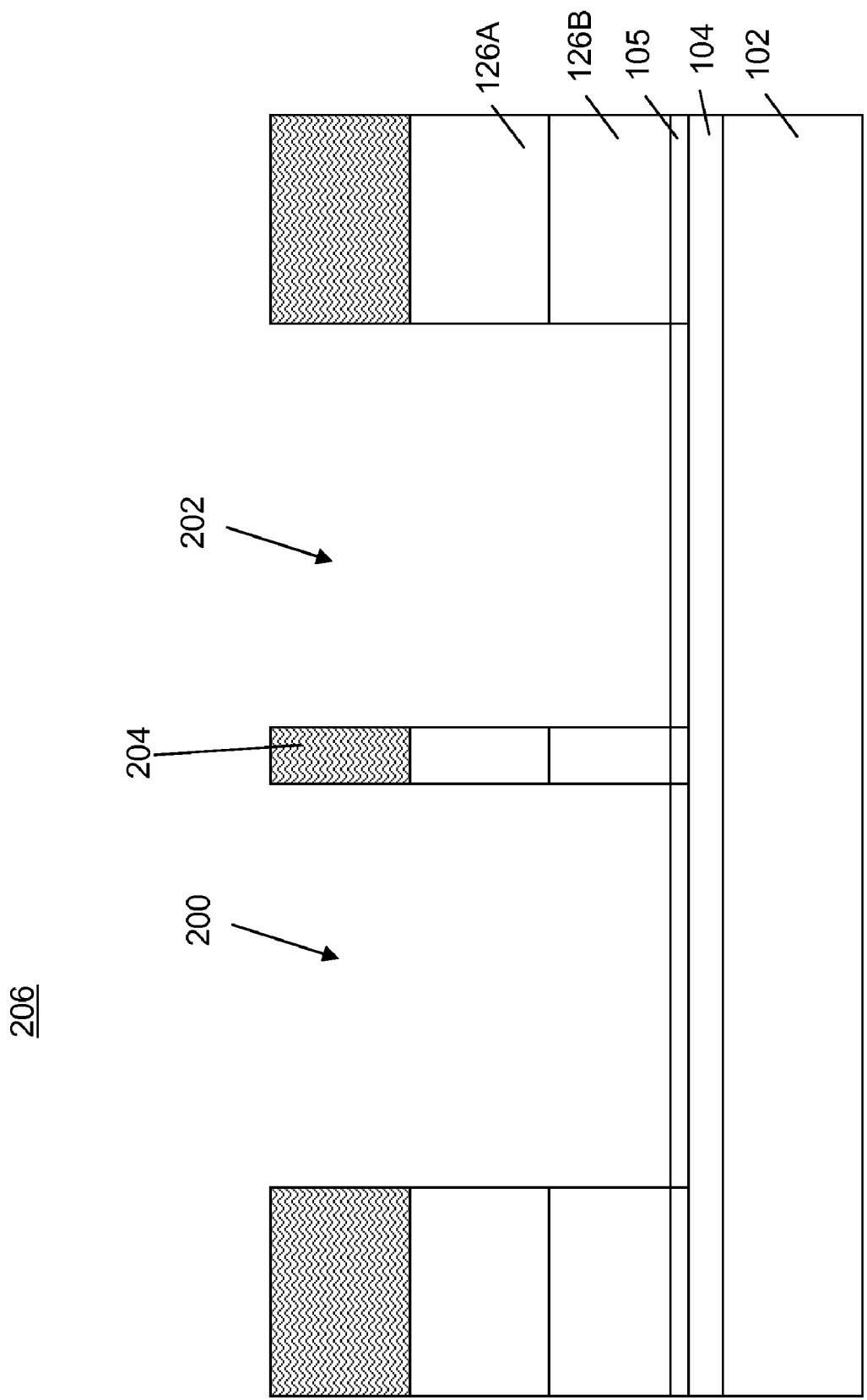

FIG. 6 also shows the beginning of a process to form a first opening 200 (FIG. 7) and a second opening 202 (FIG. 7)

through first insulator layer(s) 126. In particular, FIG. 6 shows a patterned photoresist 204. As shown in FIG. 7, an etching process 206 appropriate for insulator layer(s) 126A-B is performed to form openings 200, 202, e.g., an oxide reactive ion etch (RIE) for oxide layer 126A and a nitride RIE for nitride layer 126B, leaving a pedestal area 116 (FIG. 8) therebetween. As shown in FIG. 7, etching 206 stops on high-k layer 109, if provided, or it may stop upon reaching metal gate layer 104. Photoresist 204 is then removed using any now known or later developed appropriate technique. For brevity, the remaining processes are described as if high-k layer 109 (FIG. 6) is omitted.

Figure 8:
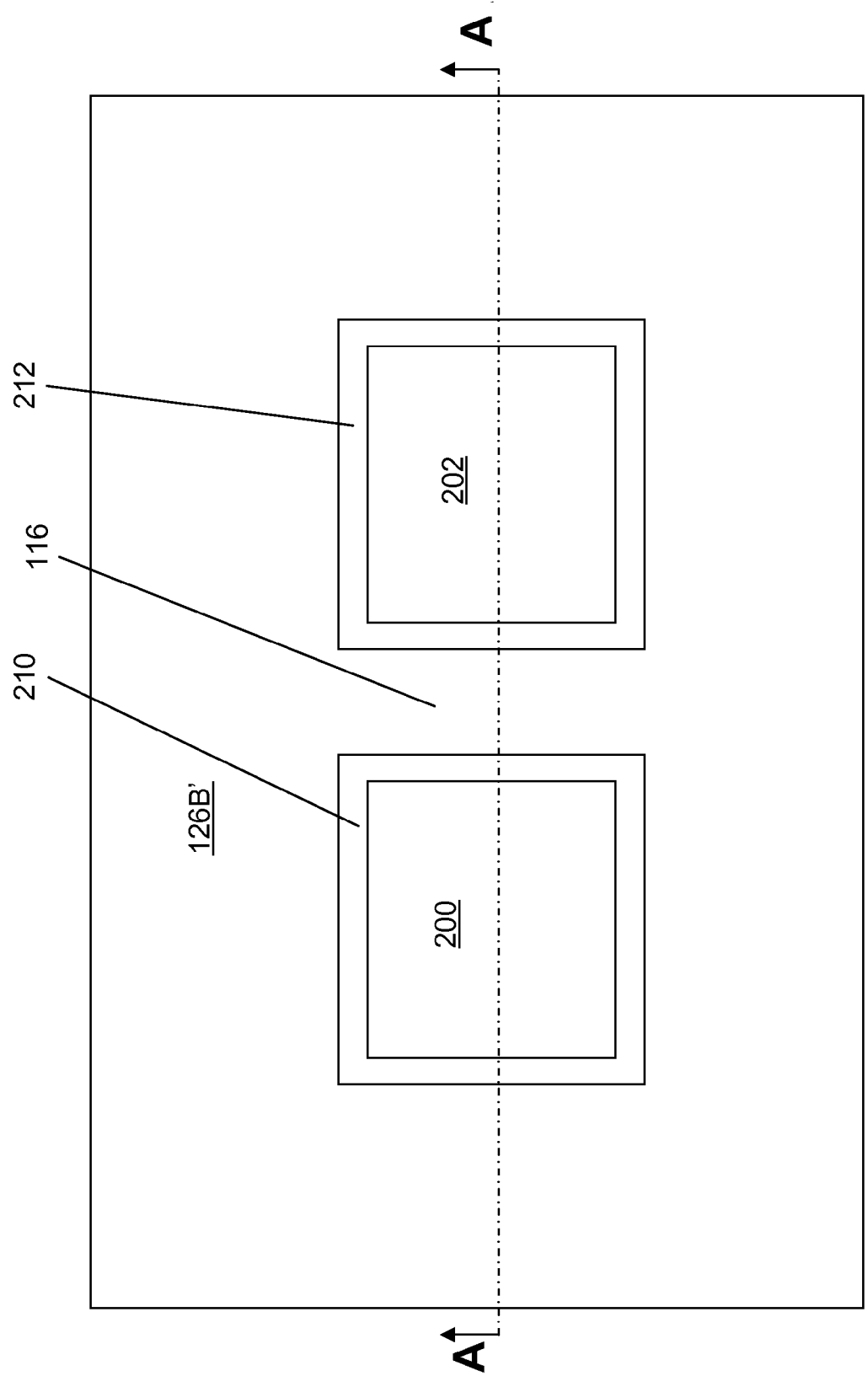
Figure 8A:
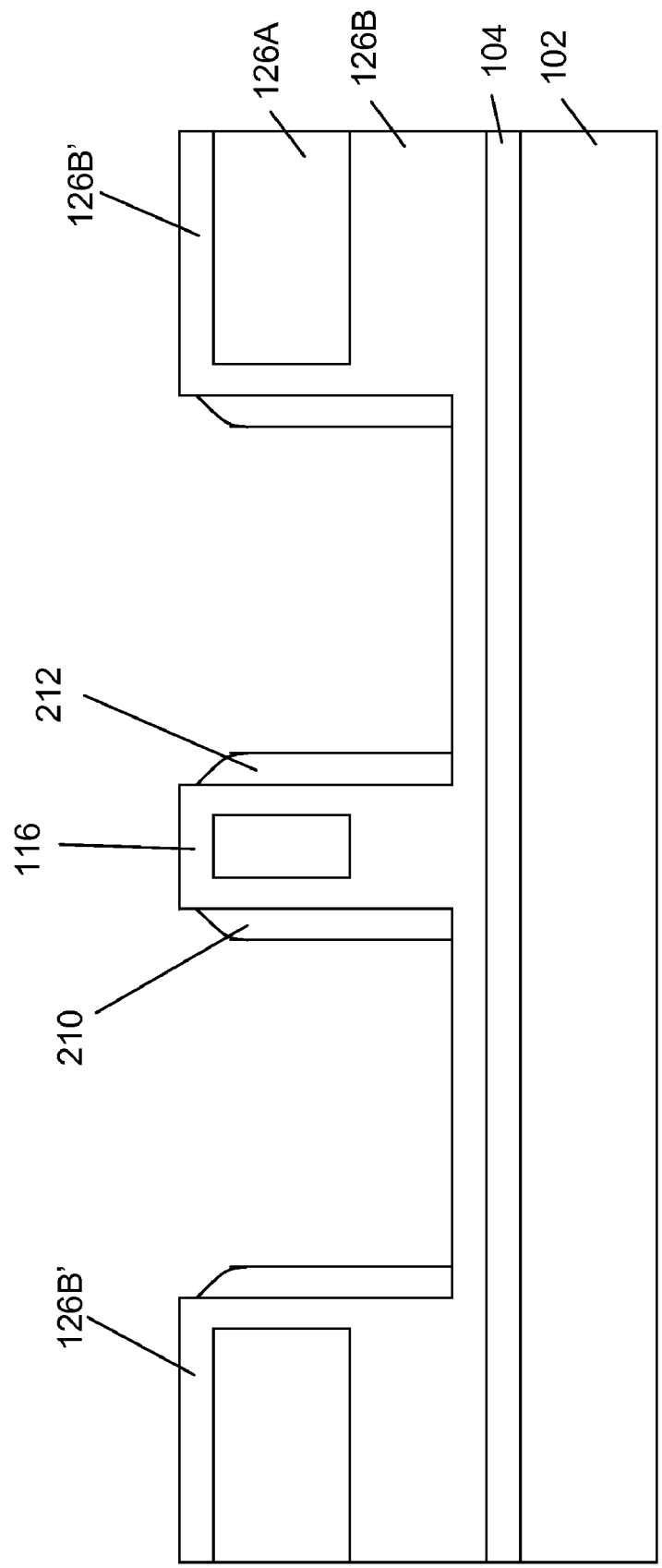
Figure 9:
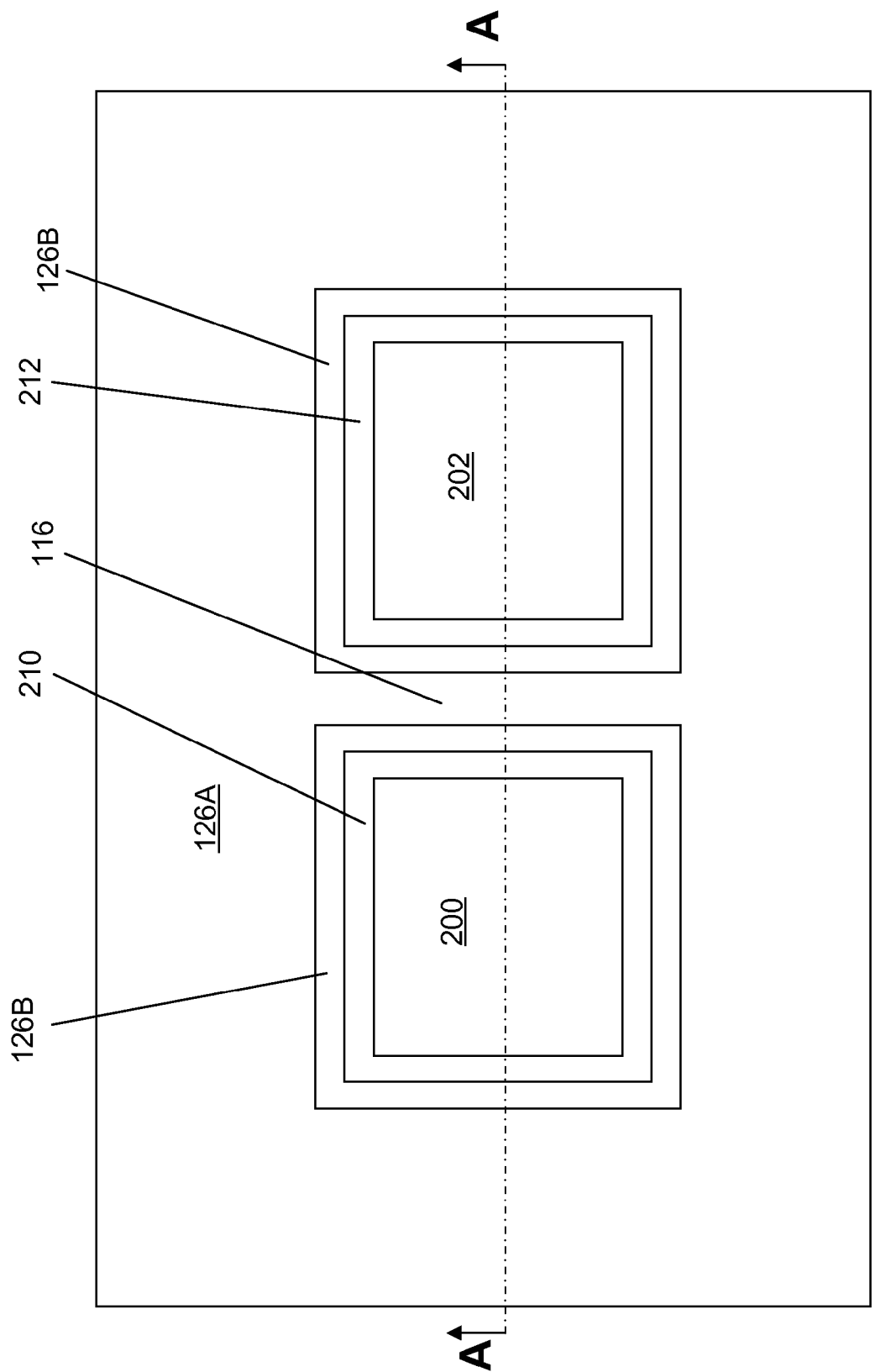
Figure 9A:
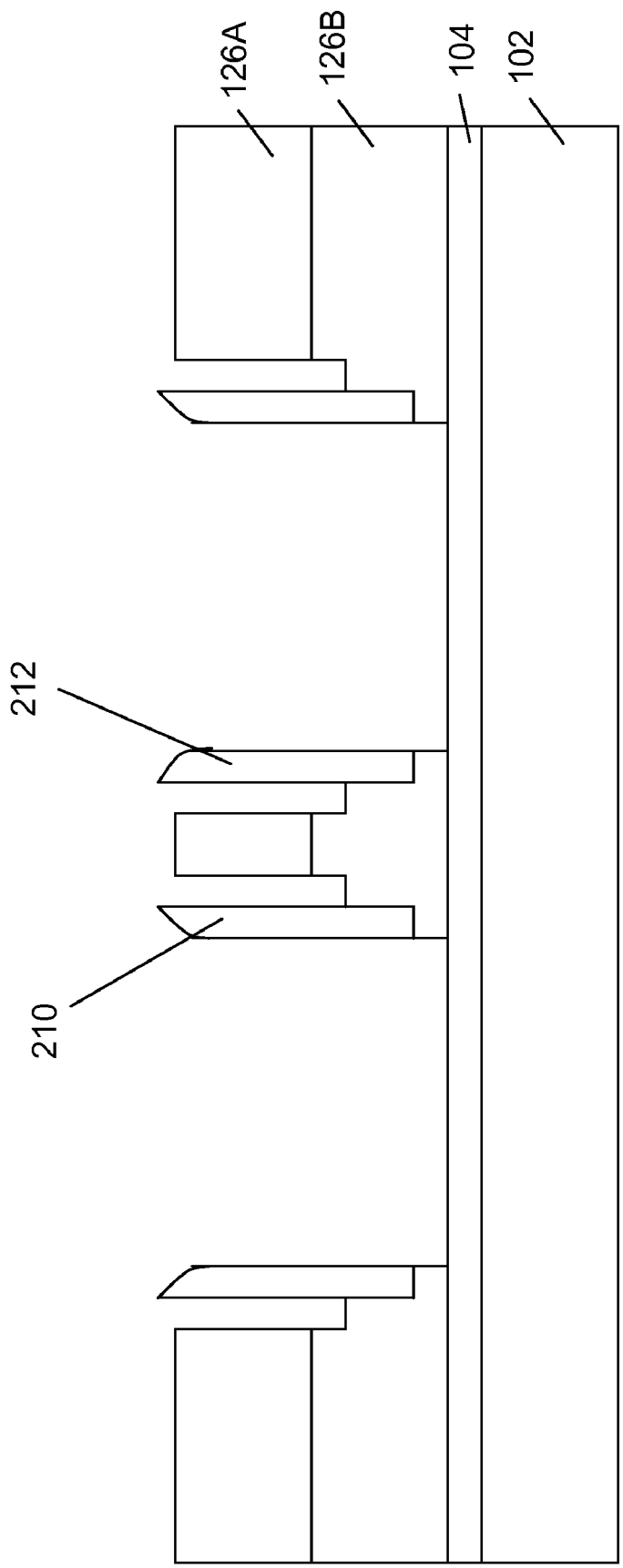

FIGS. 8-11A show forming a source region 106 (FIG. 11A) within one of first and second openings 200, 202 (200 as shown) adjacent to pedestal area 116, and forming a drain region 108 (FIG. 11A) within the other of first and second openings 200, 202 (202 as shown) adjacent to pedestal area 116. FIG. 8 shows a top view of the structure and FIG. 8A a cross-sectional view along line A-A in FIG. 8. In FIGS. 8-8A, a sacrificial layer 126B' is formed over first and second openings 200, 202. In one embodiment, sacrificial layer 126B' includes a thin layer, e.g., approximately 10 nm, of nitride. Hence, as shown in FIG. 8A, sacrificial layer 126B' melds with nitride layer 126B. FIGS. 8-8A also show forming a source region spacer 210 in first opening 200 adjacent to pedestal area 116 and a drain region spacer 212 within second opening 202 adjacent to pedestal area 116. In one embodiment, each spacer 210, 212 may be formed by depositing a metal such as titanium (Ti), and performing a RIE to form the respective spacer. FIGS. 9-9A show removing sacrificial layer 126B' (FIGS. 8-8A), e.g., by a nitride RIE, leaving source region spacer 210 and drain region spacer 212 freestanding.

Figure 10A:
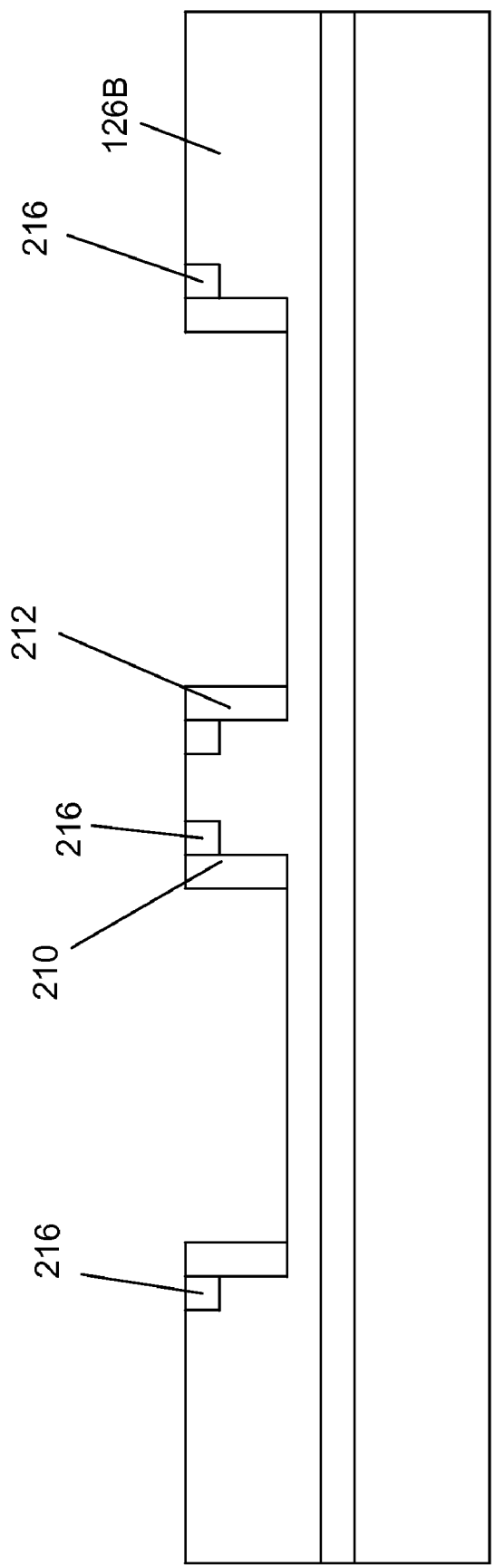
Figure 11A:
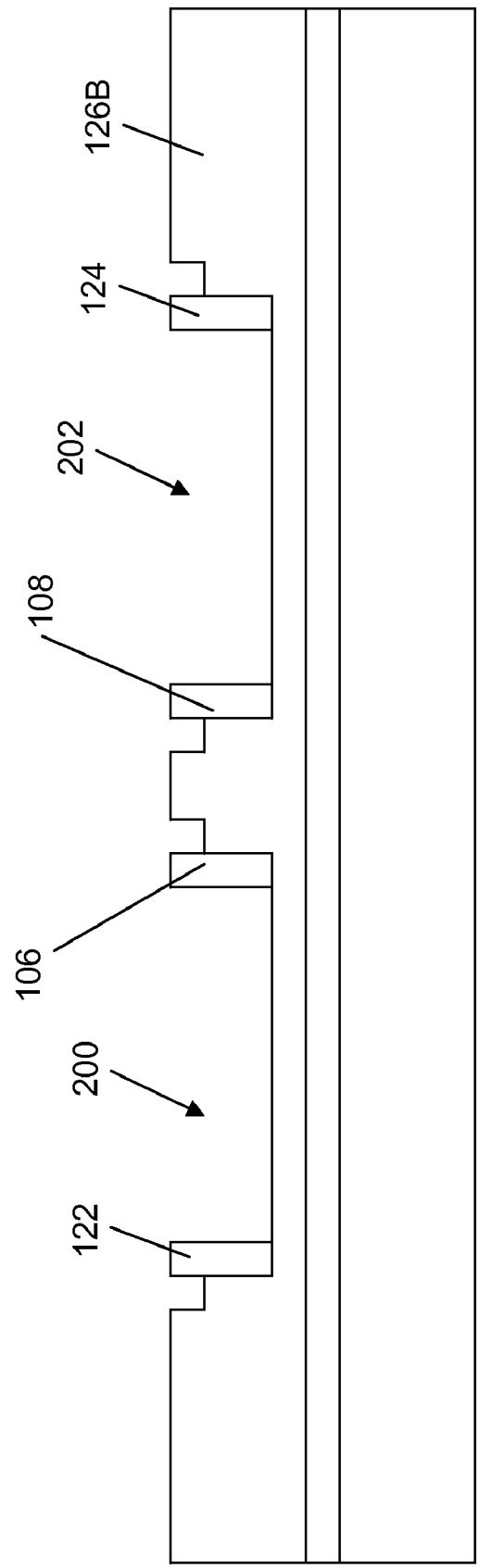

FIG. 10A shows planarizing tops of source region spacer 210 (FIG. 9A) and drain region spacer 212 (FIG. 9A) by: forming a sacrificial spacer support layer 216 (not shown completely) and planarizing (e.g., by chemical mechanical polishing (CMP)) sacrificial spacer support layer 216 to insulator layer(s) 126 (126B as shown). Sacrificial spacer support layer 216 may include an insulator material such as silicon oxide ($SiO_2$). FIG. 11A shows removing sacrificial spacer support layer 216 selective to insulator layer(s) 126 (126B as shown). This process may include, for example, a wet oxide etch such as diluted hydrofluoric (DHF) acid selective to nitride layer 126B, or other etching processes. FIG. 11A shows the resulting source region 106 with outer portion 122 and drain region 108 with outer portion 124. It is understood that the structures that form a "source" or a "drain" herein may be switched without departing from the scope of the disclosure.

Figure 12A:
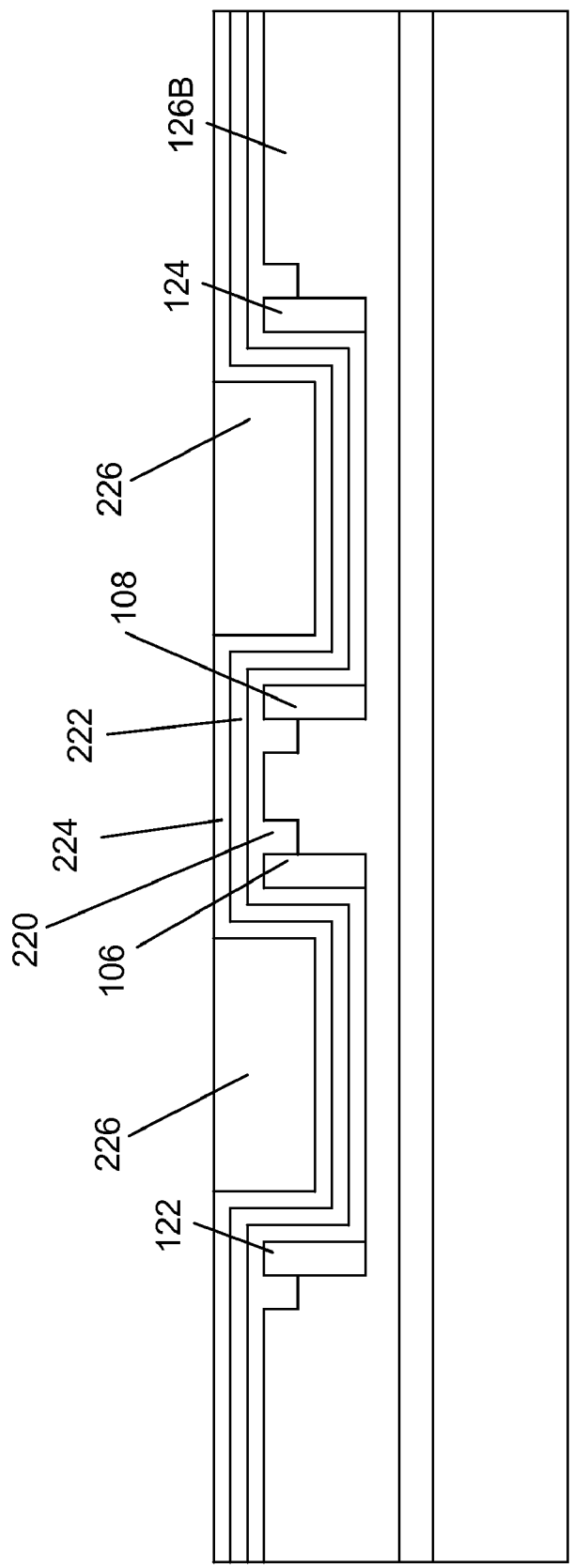
Figure 16A:
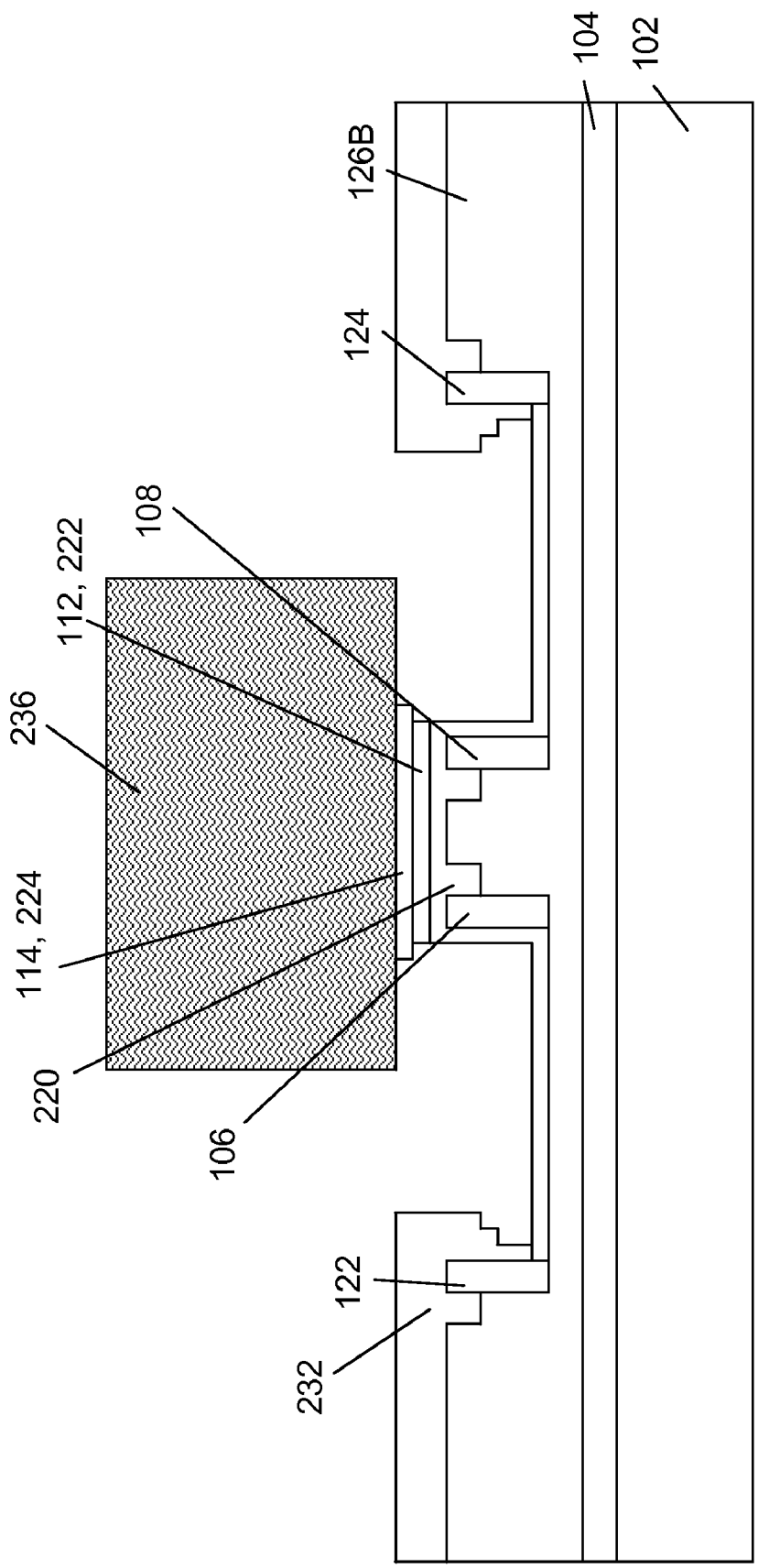
Figure 17A:
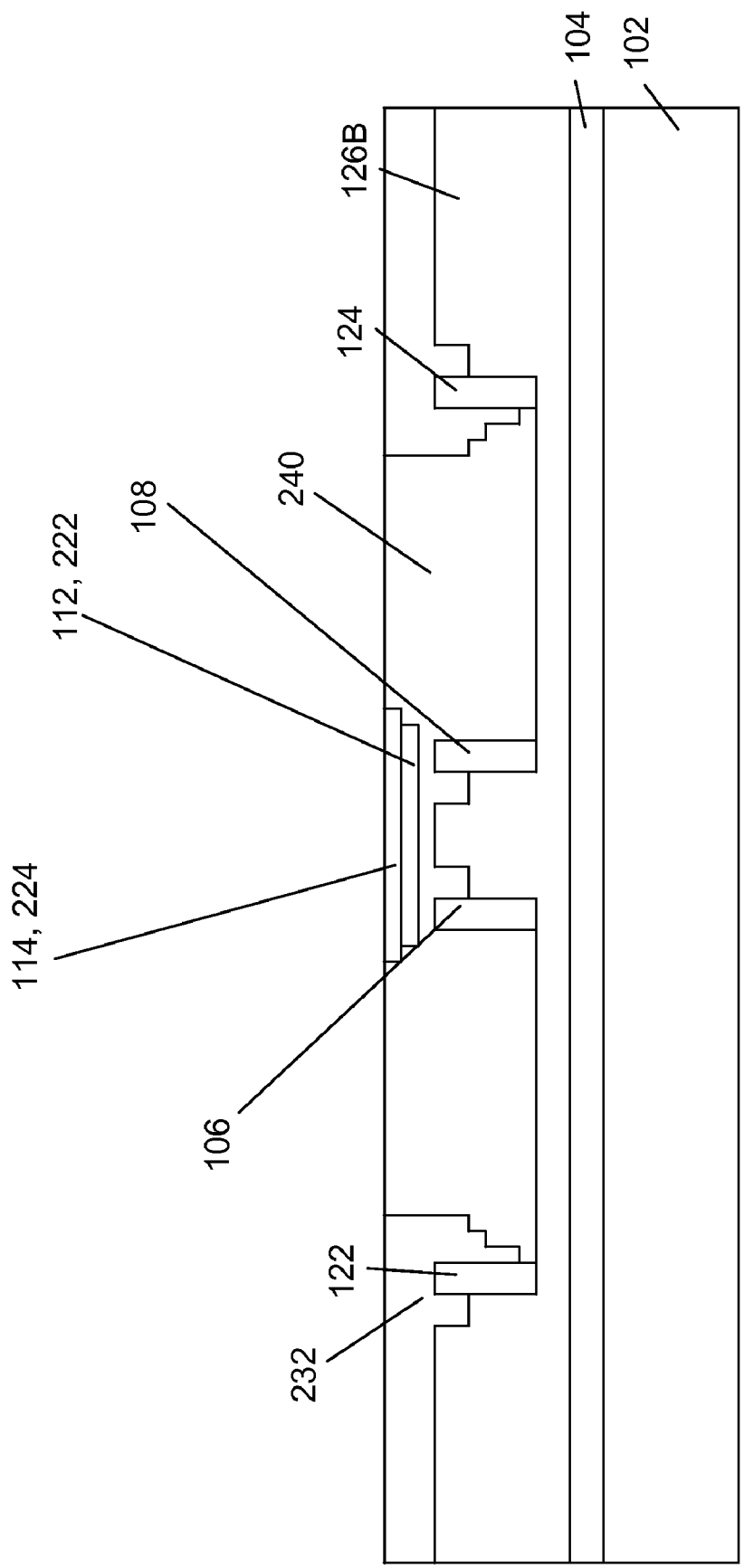

FIGS. 12A-17A show forming a metal channel member 112 (FIG. 17A). FIG. 12A shows depositing a sacrificial layer 220, e.g., of aluminum oxide ($Al_2O_3$) or other sacrificial material that can be removed selectively, depositing a metal channel member layer 222, depositing a second insulator layer 224, and depositing sacrificial silicon germanium (SiGe) 226 filling first and second openings 200, 202 (FIG. 11A), and planarizing to second insulator layer 224. Sacrificial layer 220 may have a thickness of approximately 10-20 nm. Metal channel member layer 222 may include titanium (Ti) having a thickness of, for example, approximately 2-5 nm. Second insulator layer 224 may include a nitride (e.g., silicon nitride) and may have a thickness of approximately 5-10 nm.

Figure 13A:
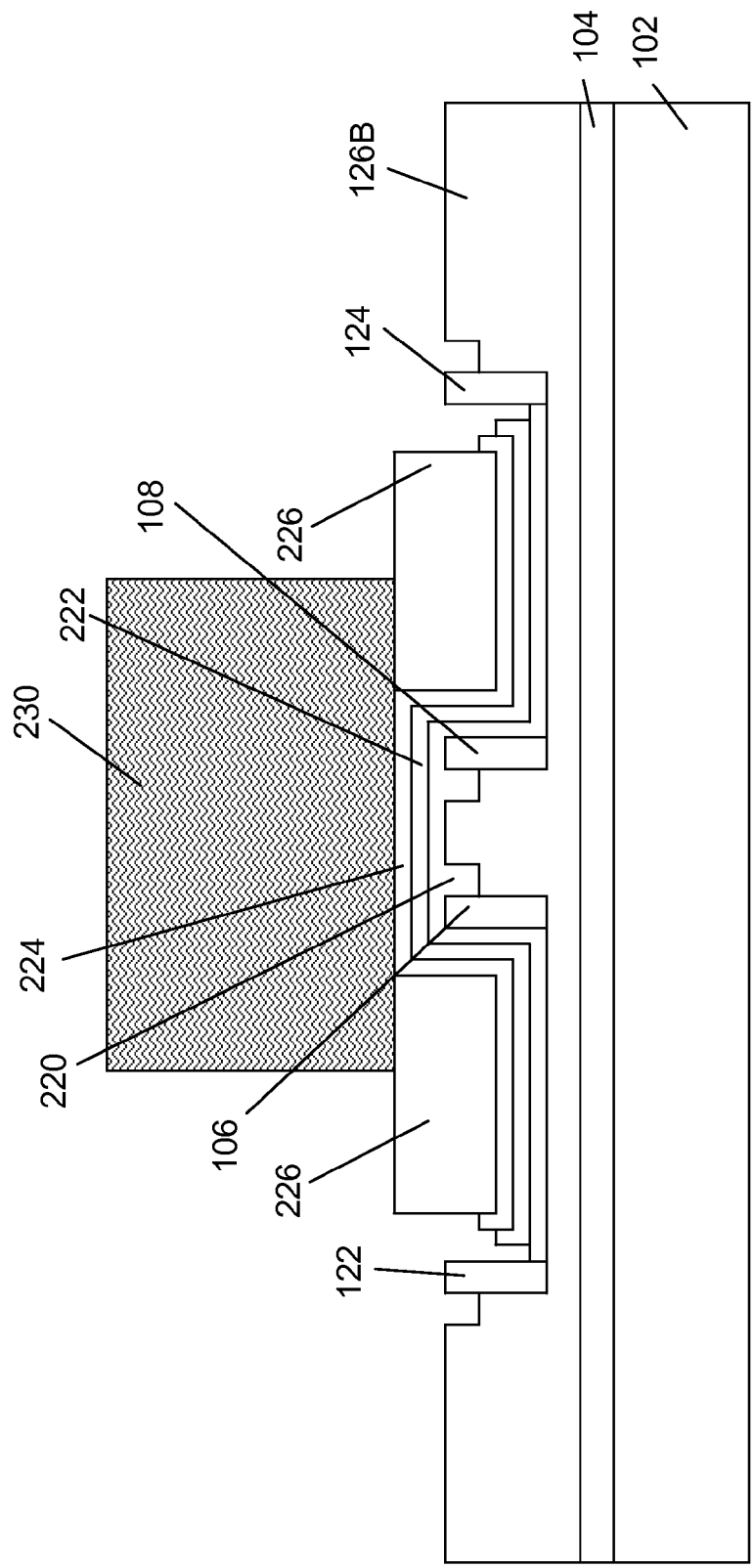
Figure 14A:
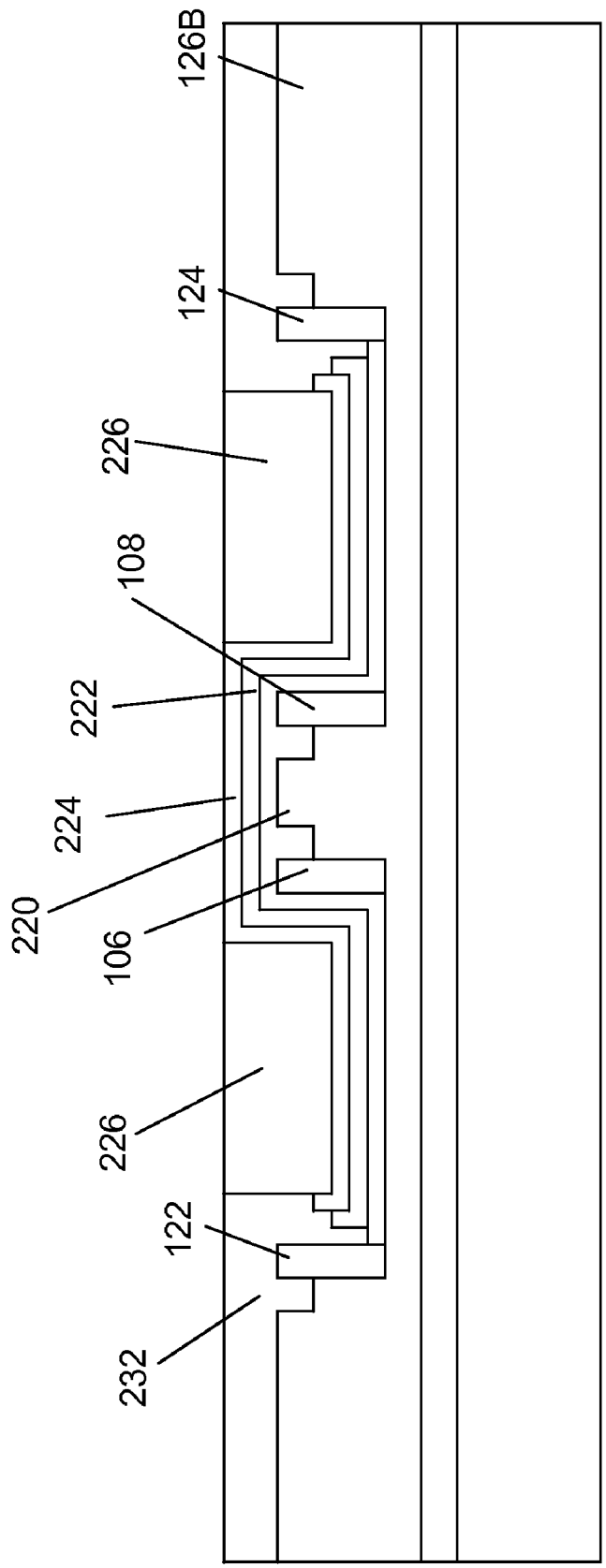
Figure 15A:
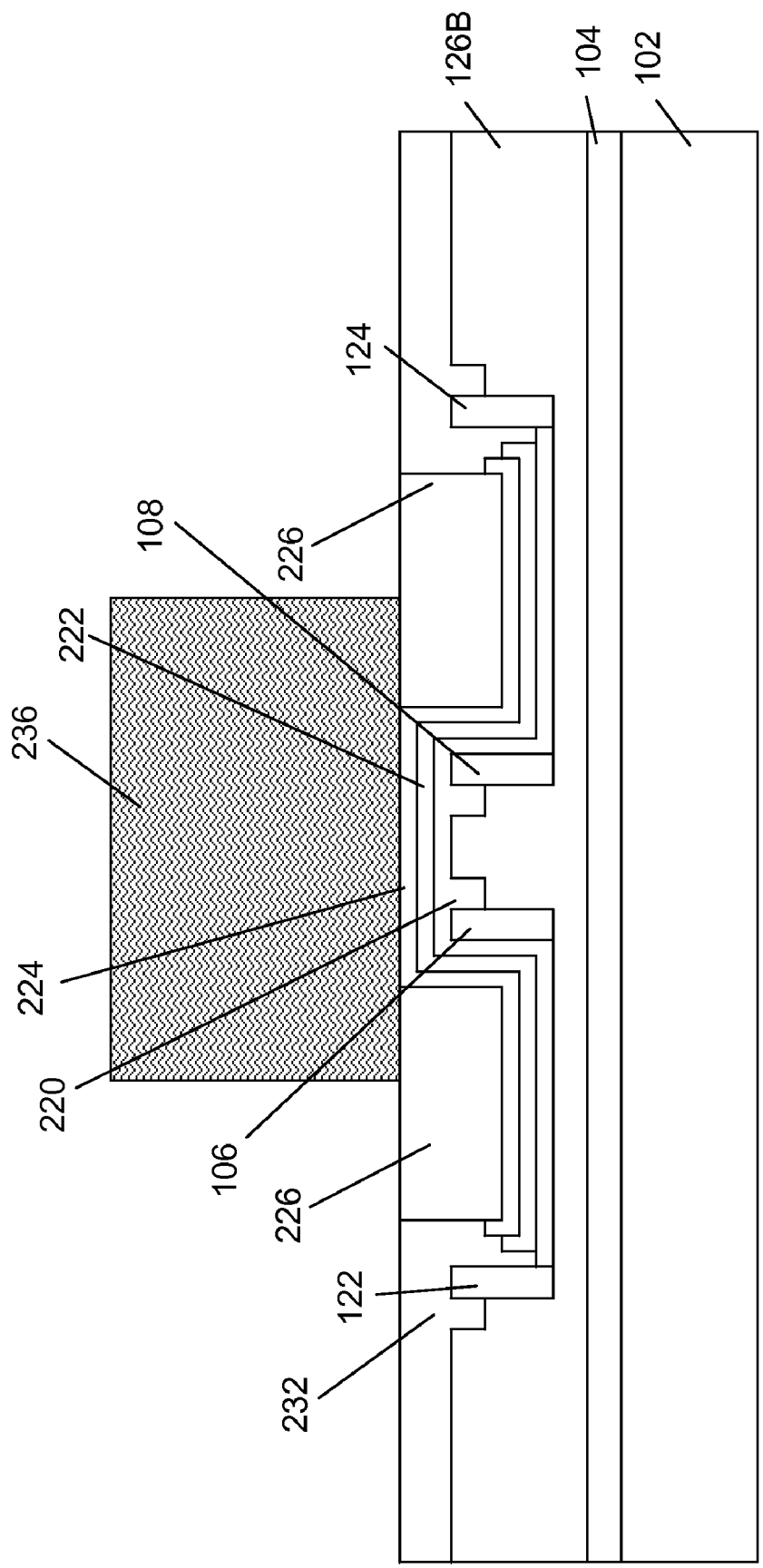

FIG. 13A shows removing (etching) sacrificial layer 220, metal channel member layer 222 and second insulator layer 224 at a distance from pedestal area 116. This process may include patterning a photoresist 230 and performing appropriate etches and then removing the photoresist 230. FIG. 14A shows depositing an oxide layer and planarizing to second insulator layer 224. FIGS. 15A-16A show removing sacrificial silicon germanium 226, e.g., by patterning a photoresist 236 and performing RIE, and removing second insulator layer 224 (FIG. 15A) and metal channel member layer 222 (FIG. 15A) outside of source region 106 and drain region 108 adjacent to pedestal area 116. This process may include, for example, patterning a photoresist 236, and performing a RIE of second insulator layer 224 and metal channel member layer 222, and then removing photoresist 236 (FIG. 17A). After this process, as shown in FIG. 16A, channel member 112 and insulator member 114 are complete.

Figure 18:
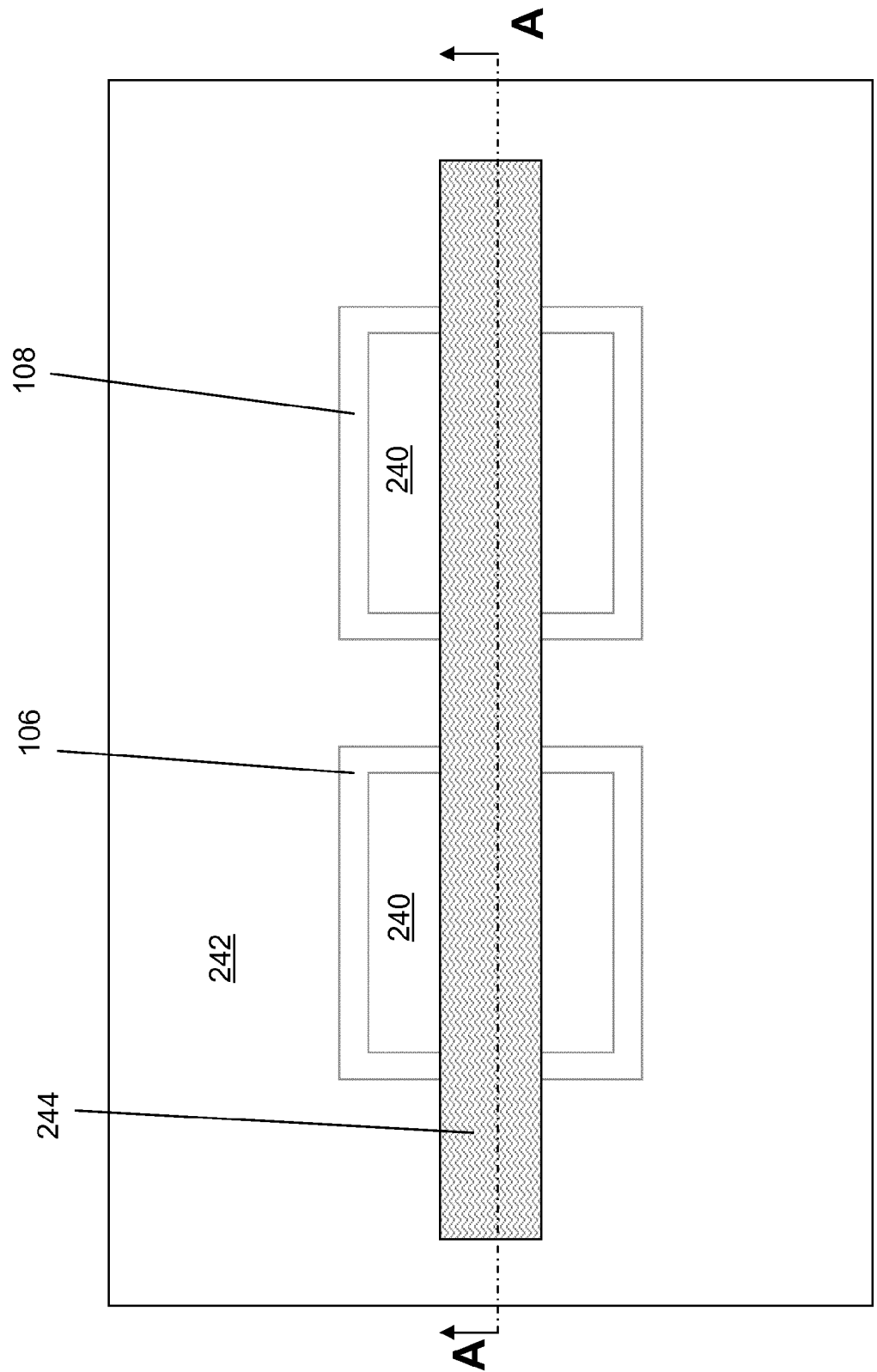
Figure 18A:
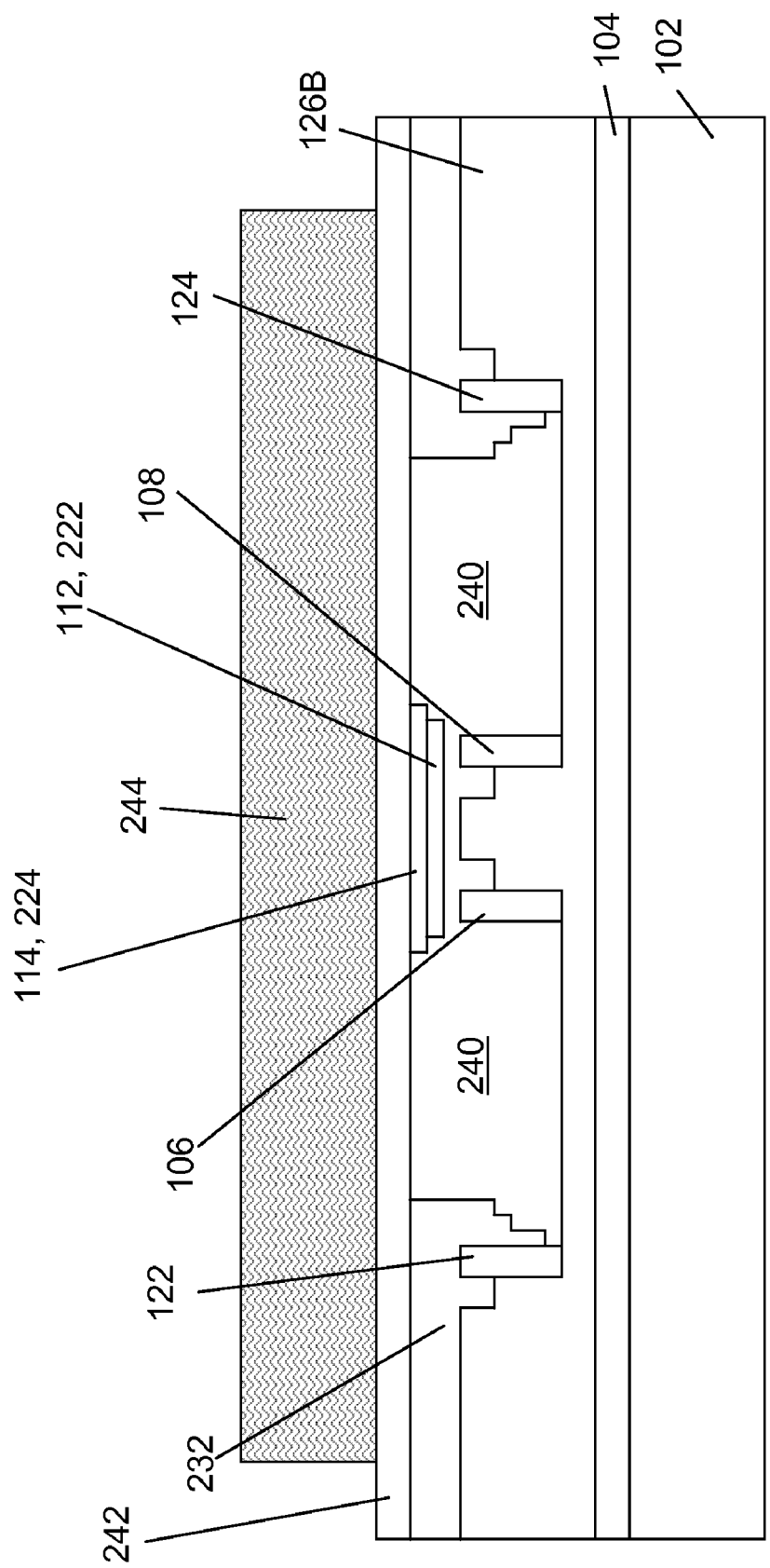
Figure 19:
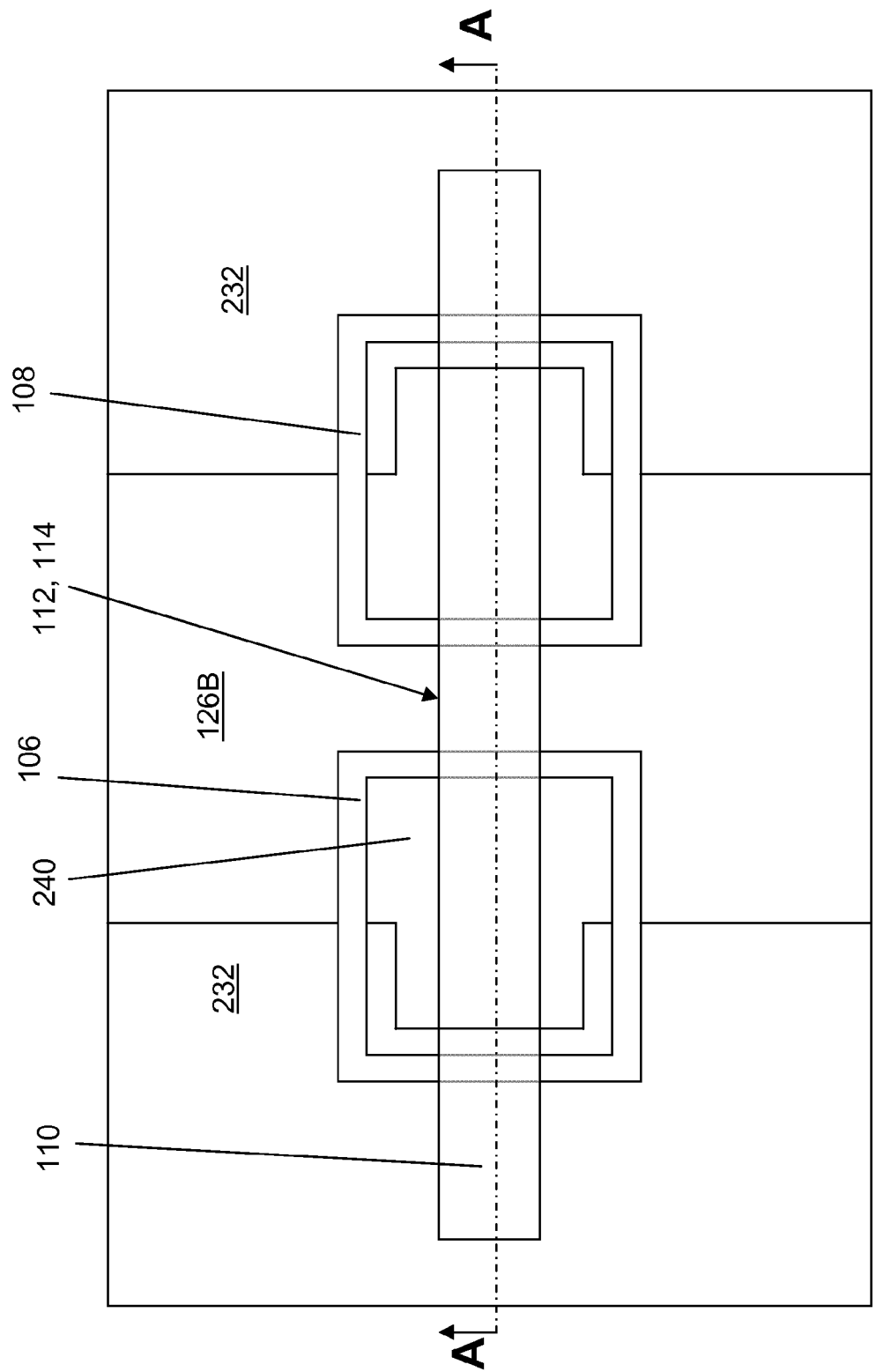
Figure 19A:
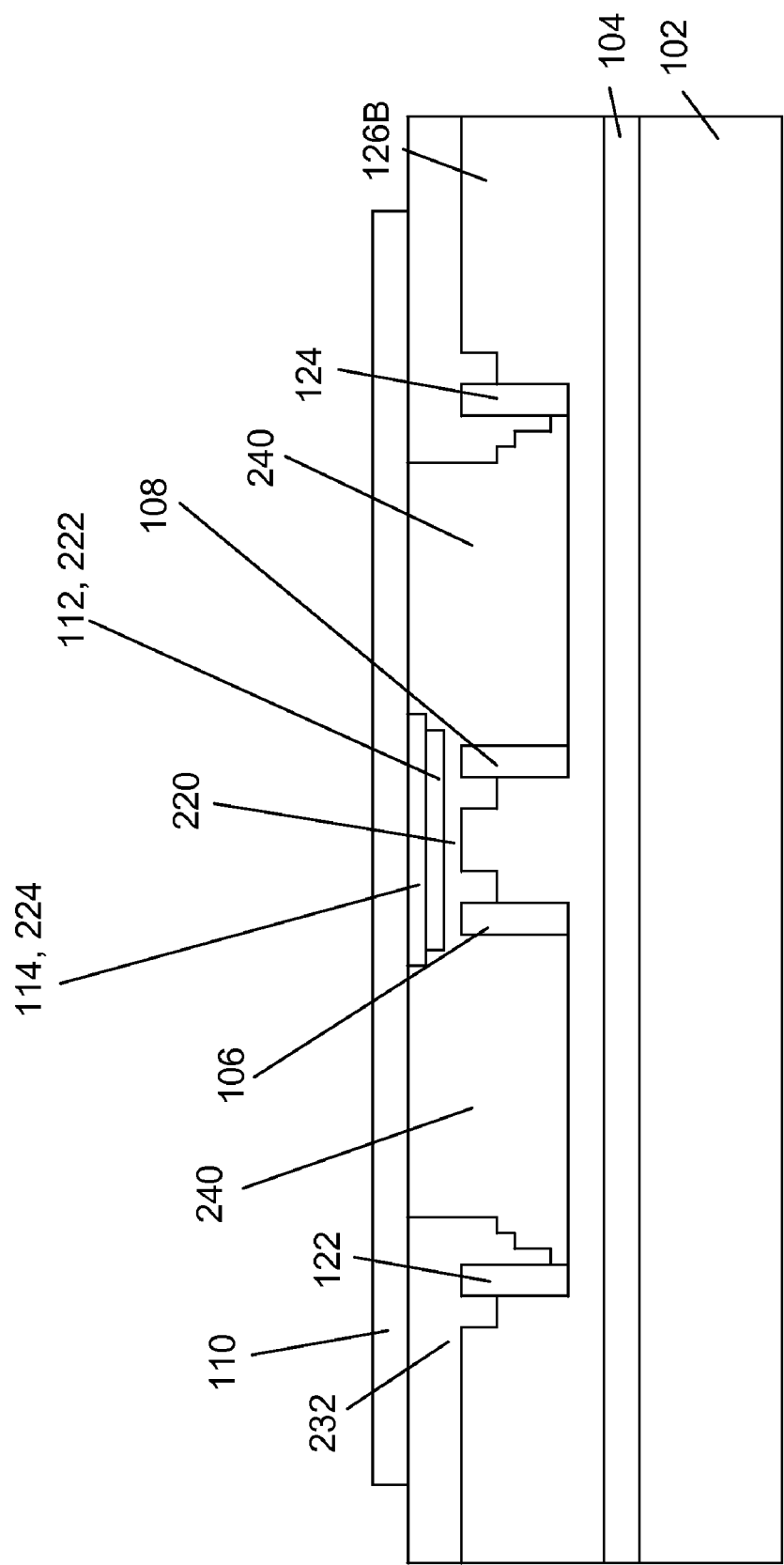

FIGS. 17A-20A show forming a nanotube member 110 (FIGS. 19-19A) insulatively coupled to metal channel member 112. FIG. 17A shows depositing another sacrificial layer 240, e.g., aluminum oxide ($Al_2O_3$), etc., and planarizing to second insulator layer 224, i.e., insulator member 114. FIGS. 18-18A show forming a carbon nanotube layer 242 across at least the exposed aluminum oxide 240 and the second insulator layer 224. Carbon nanotube layer 242 may be formed using any now known or later developed technique. FIGS. 18-18A show patterning a photoresist 244 used to form nanotube member 110, as shown in FIGS. 19-19A, from carbon nanotube layer 242, e.g., by performing a RIE of carbon nanotube layer 242 by isotropic ashing in an oxygen plasma. Photoresist 244 is then removed.

Figure 20A:
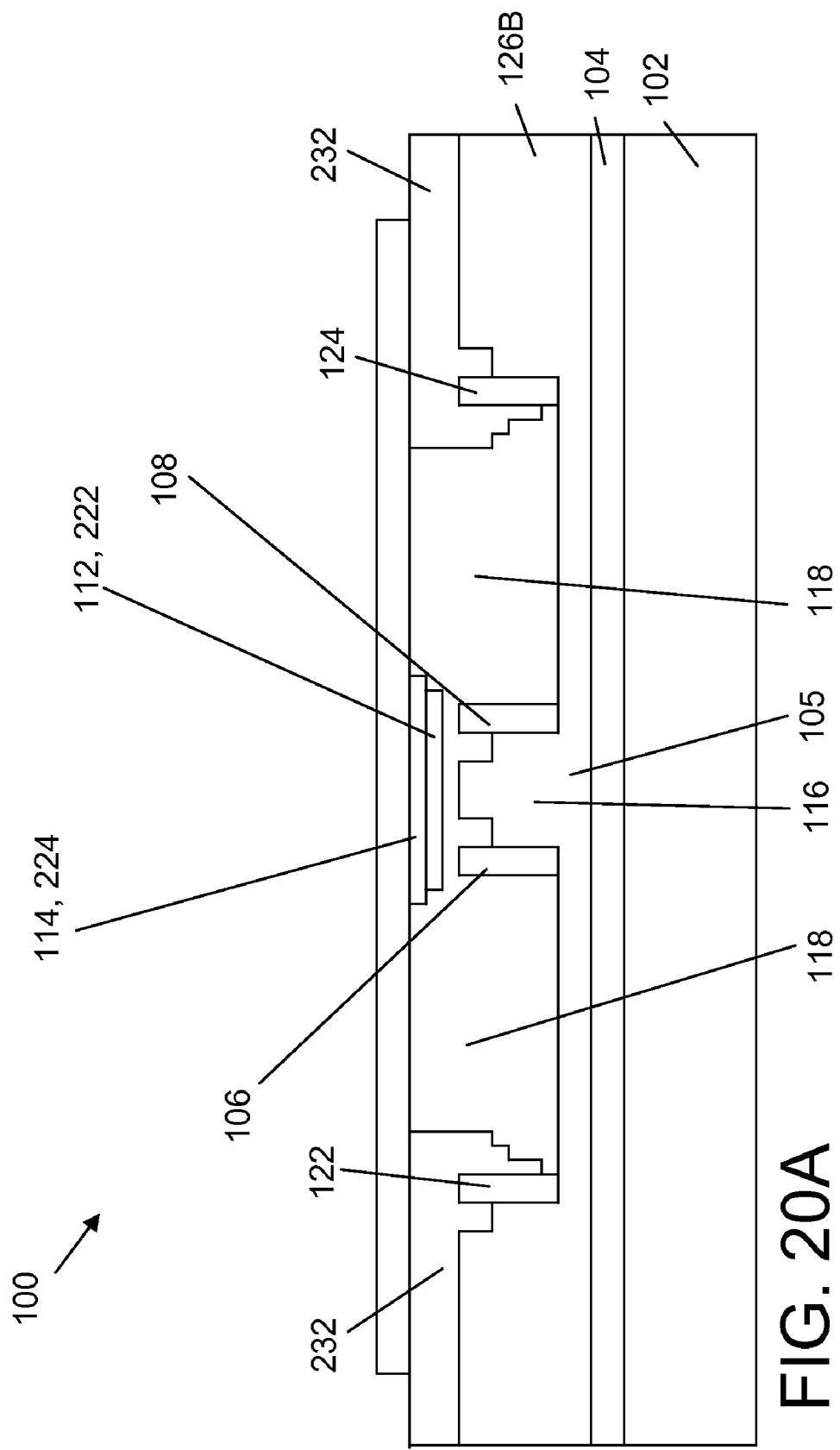

FIG. 20A shows removing sacrificial layer(s) 220, 240 (FIG. 19A), e.g., by etching with tetra-methyl ammonium hydroxide (TMAH), forming voids 118. Insulator member 114 and channel member 112 may be further etched at this stage, if desired, e.g., to make channel member 112 more self-aligned with source region 106 and drain region 108. FIG. 20A shows NEMT 100 in a finished state in which, in response to an electrical potential applied to gate 104 and nanotube member 110, the nanotube member is electromechanically deflectable between an off or off state (FIG. 1 and 20A) and an on or on state (FIG. 2). In the on state, shown in FIG. 2, channel member 112 is placed in electrical connection with source region 106 and drain region 108 to form a current path. Gate 104 (metal gate layer), source region 106 and drain region 108 include a metal such as titanium.

Second Embodiments of Method

Figure 21A:
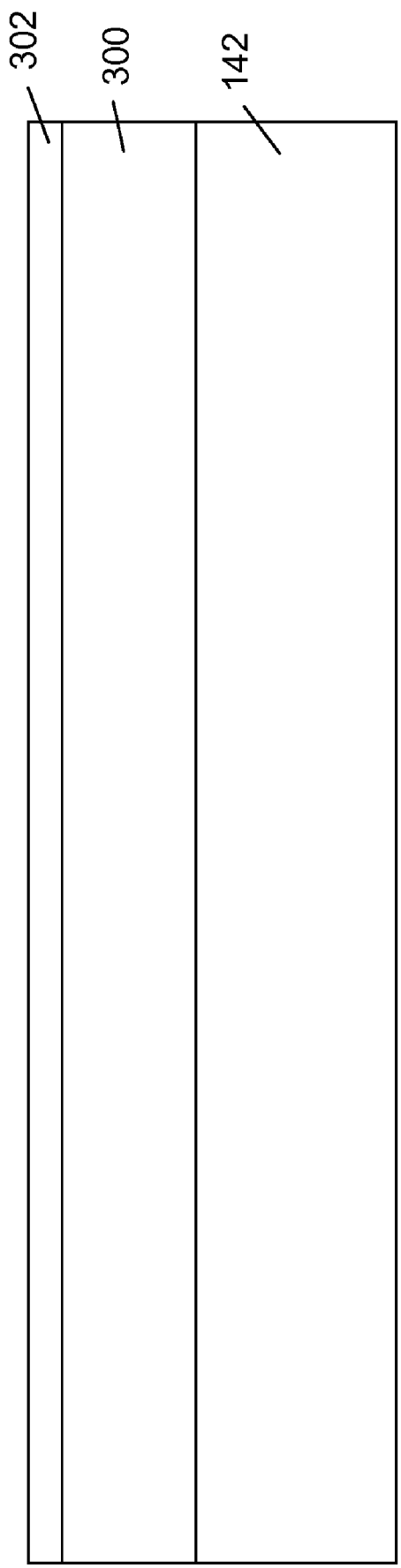

Turning to FIGS. 21A-41E embodiments of a method of forming NEMT 140 of FIGS. 3-4 are shown. FIG. 21A shows providing an insulative substrate 142 having a first metal layer 300 over insulative substrate 142 and a first insulator layer 302 over first metal layer 300. Insulative substrate 142 may include an insulator material such as, but not limited to: silicon oxide ($SiO_2$), silicon nitride ($Si_3N_4$), fluorinated $SiO_2$ (FSG), hydrogenated silicon oxycarbide (SiCOH), porous SiCOH, boro-phospho-silicate glass (BPSG), silicon oxide, silsesquioxanes, carbon (C) doped oxides (i.e., organosilicates) that include atoms of silicon (Si), carbon (C), oxygen (O), and/or hydrogen (H), thermosetting polyarylene ethers, a polyarylene ether (e.g., SiLK™ available from Dow Chemical Corporation), a spin-on silicon-carbon containing polymer material (available from JSR Corporation), other low dielectric constant (k<3.9) material, or layers thereof. In one embodiment, insulative substrate 142 includes silicon oxide ($SiO_2$). First metal layer 300 may be formed, for example, by atomic layer deposition of a metal such as titanium to a thickness of, for example, approximately 40-50 nm. Insulator layer 302, in one embodiment, may include a nitride layer, e.g., silicon nitride ($Si_3N_4$) chemical vapor deposited (CVD) or plasma enhanced CVD (PECVD) over first metal layer 300.

Figure 22:
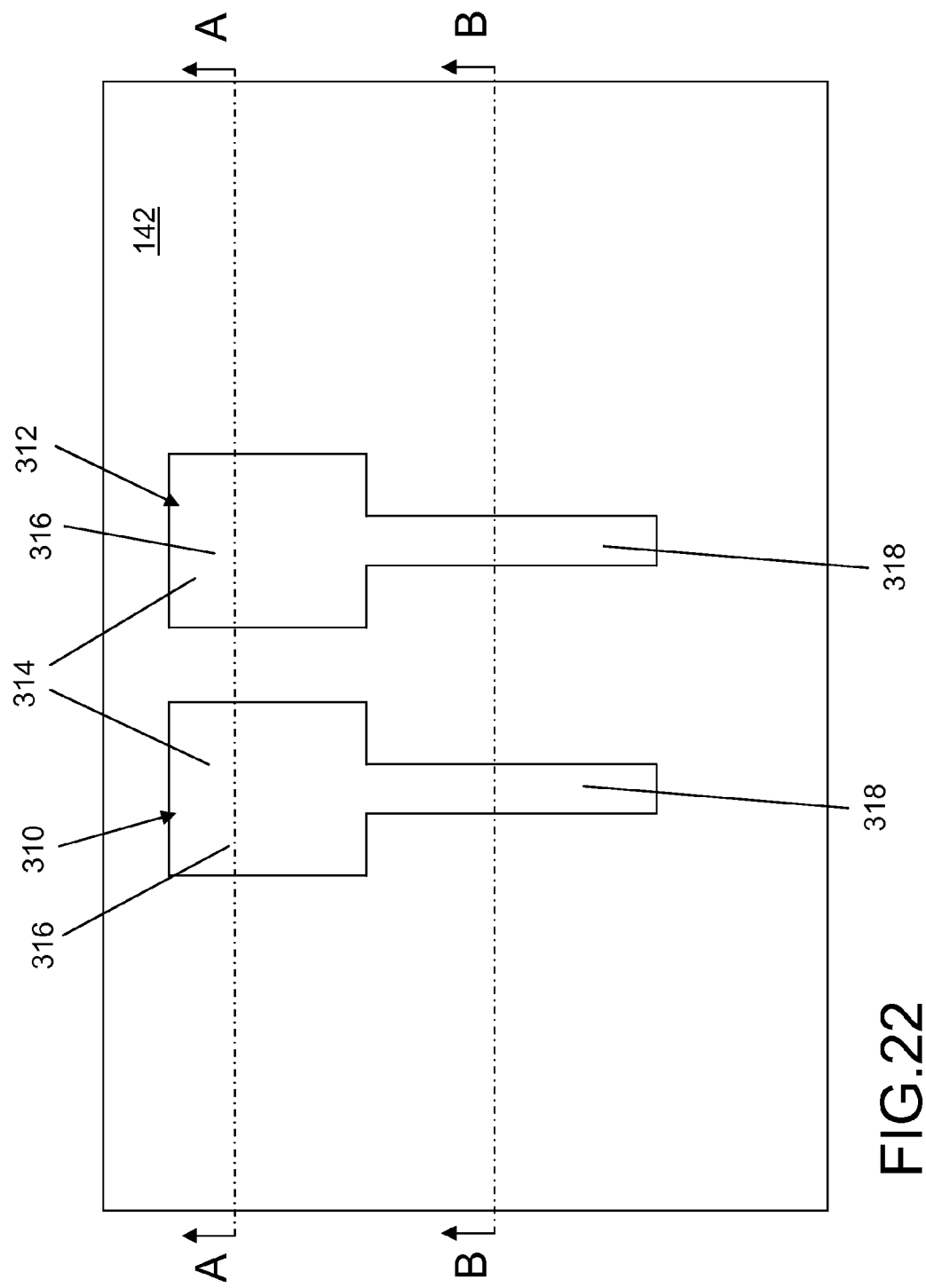
Figure 22A:
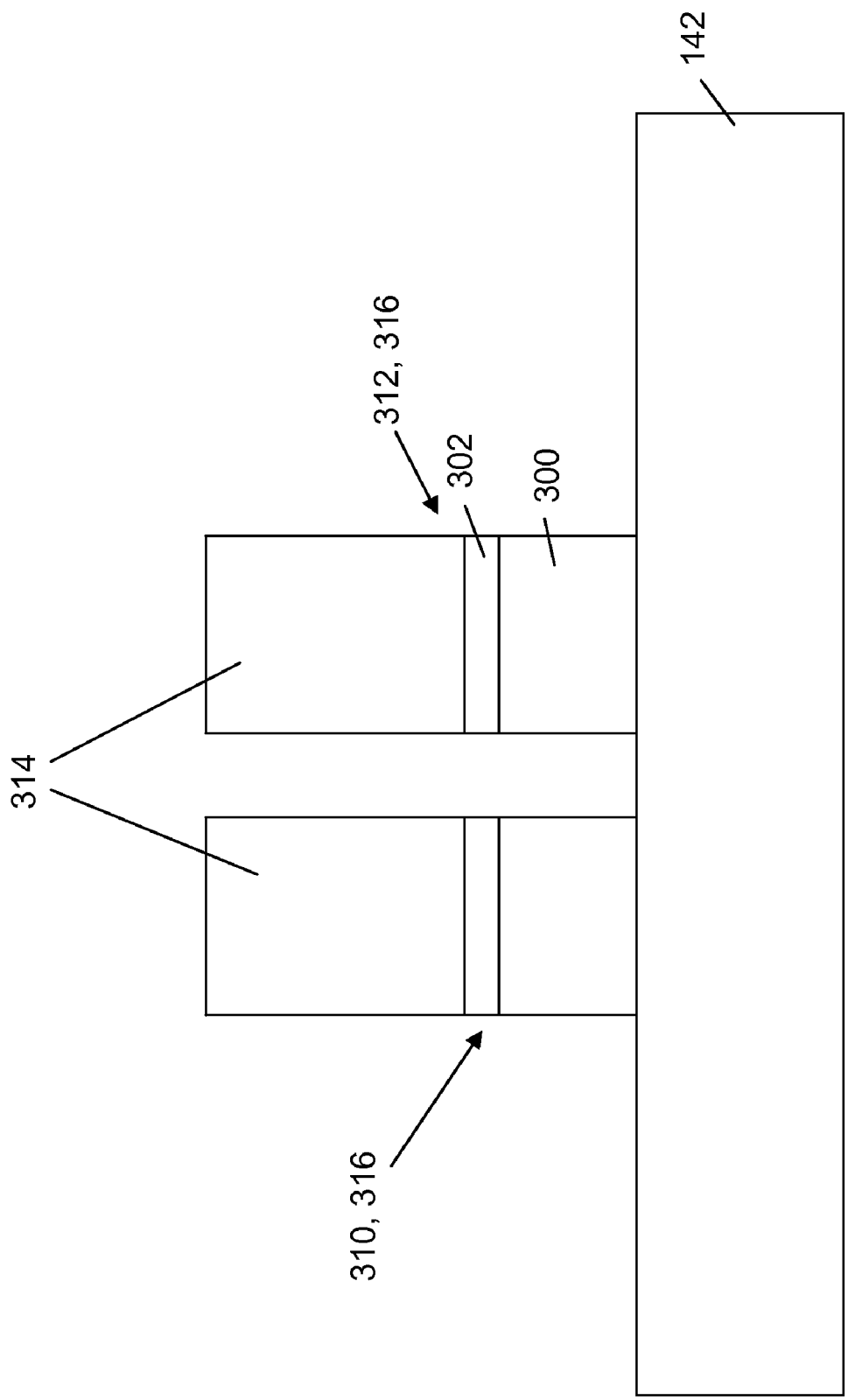

FIGS. 22-27B show forming a source region 146 (FIG. 27B) and a drain region 148 (FIG. 27B) within an opening 164 (FIGS. 3-4) of insulative substrate 142. Source region 146 and drain region 148 are distanced from one another, compared to source region 106 and drain region 108 in the embodiment of FIGS. 1-2. FIGS. 22-22B show forming a first pedestal 310 and an adjacent second pedestal 312 from first insulator layer 302 and first metal layer 300, stopping on insulative substrate 142. This process may include patterning a photoresist 314 and performing appropriate etching(s), e.g., a nitride RIE for first insulator layer 302 and a titanium RIE for first metal layer 300. Photoresist 314 is then removed using any appropriate removal process. As shown in FIG. 22, pedestals 310, 312, in one embodiment, have a substantially T-shape with a wide portion 316 and a narrow portion 318. However, this shape is not necessary in all instances.

Figure 23:
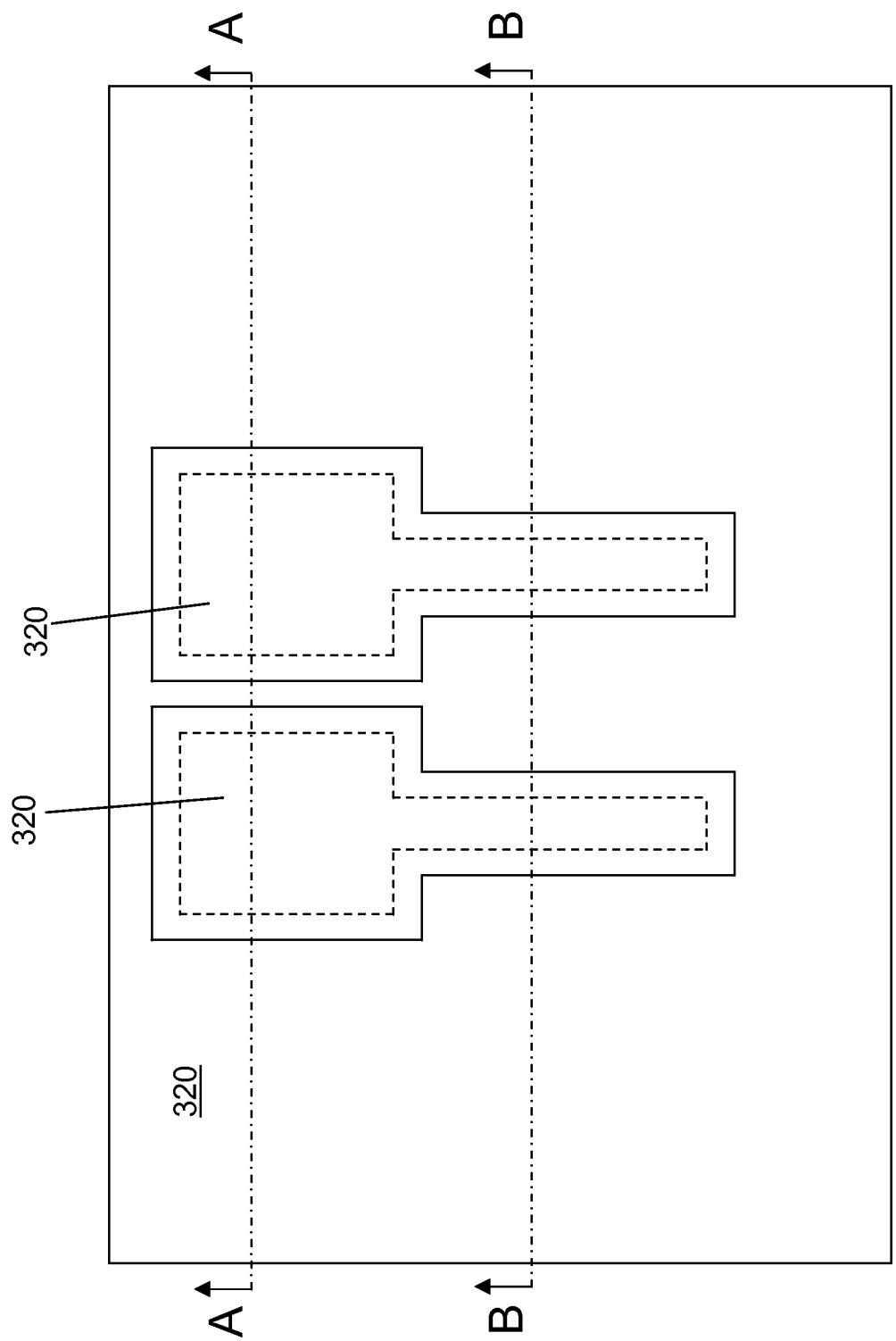
Figure 23A:
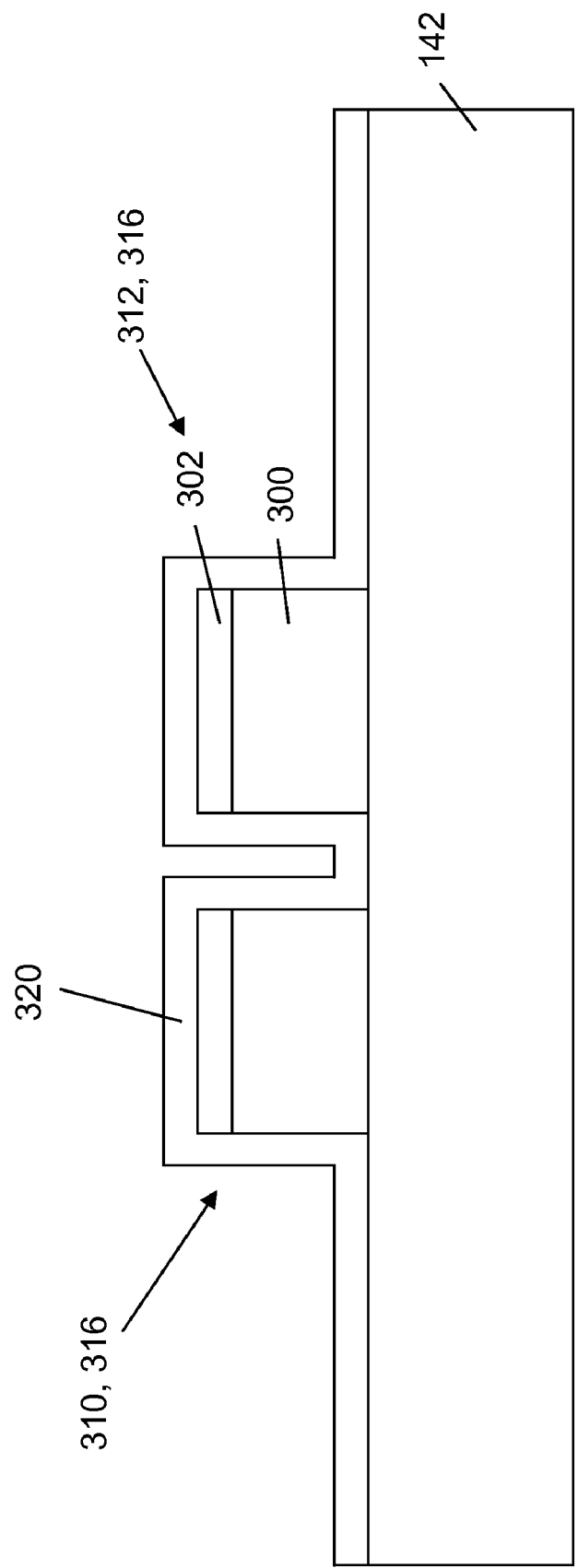
Figure 23B:
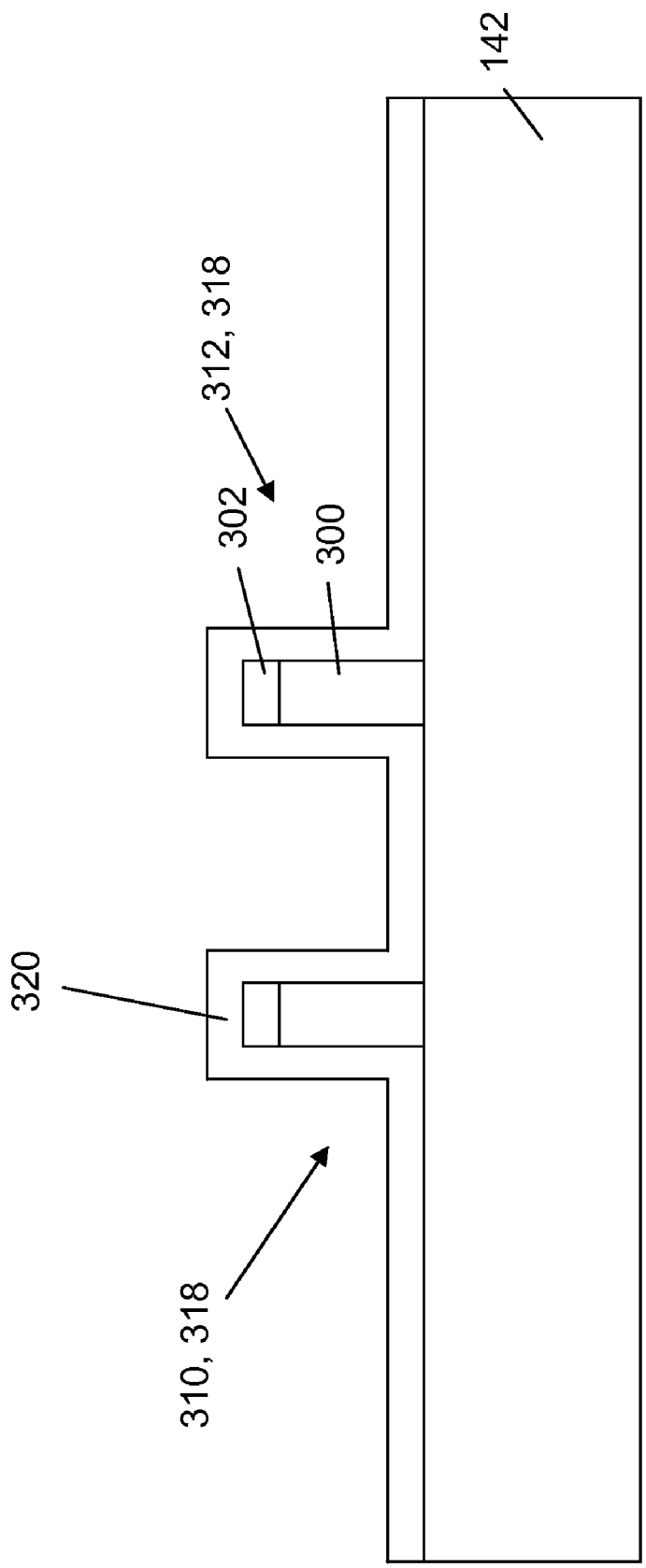
Figure 24:
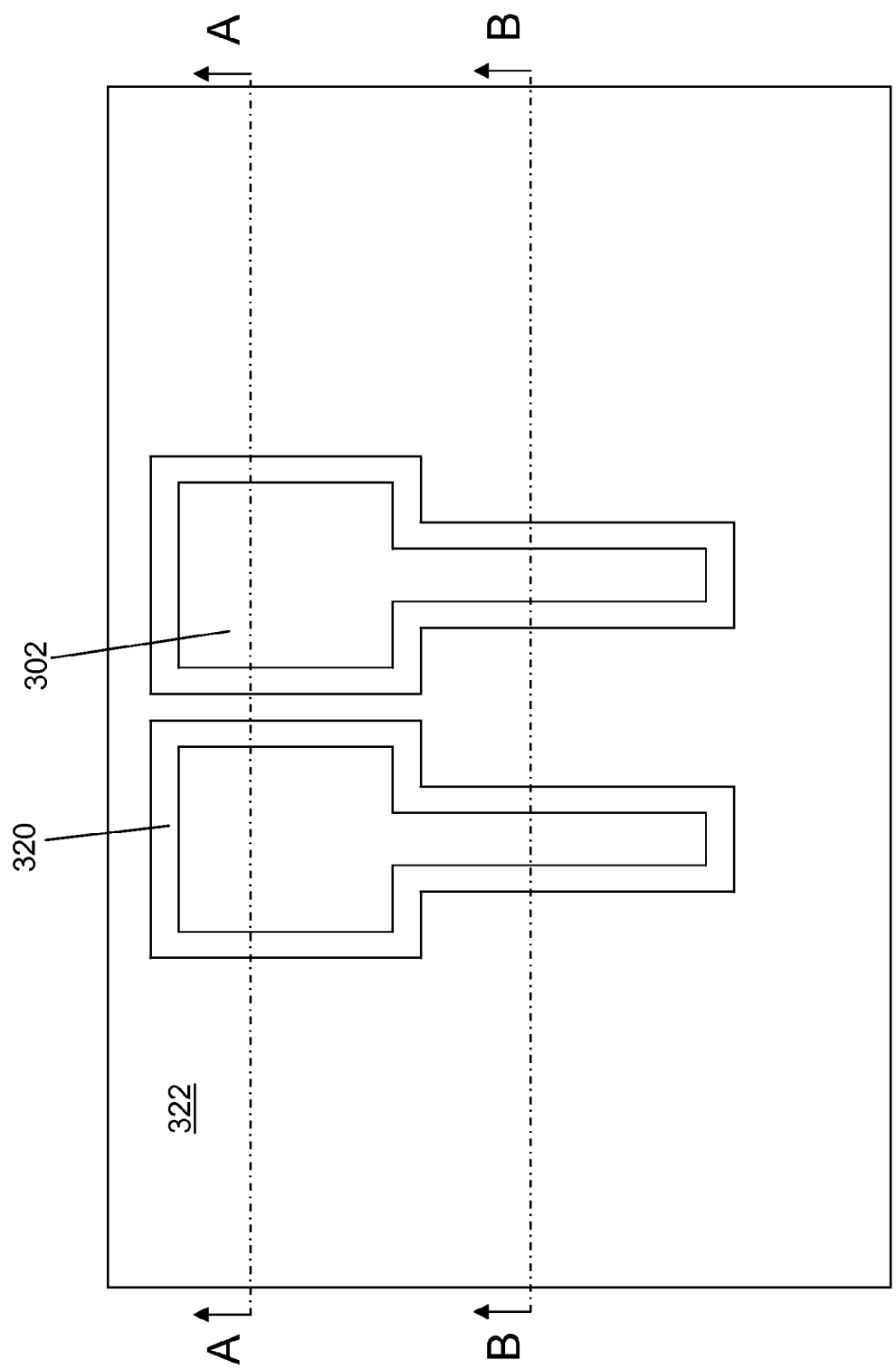
Figure 24A:
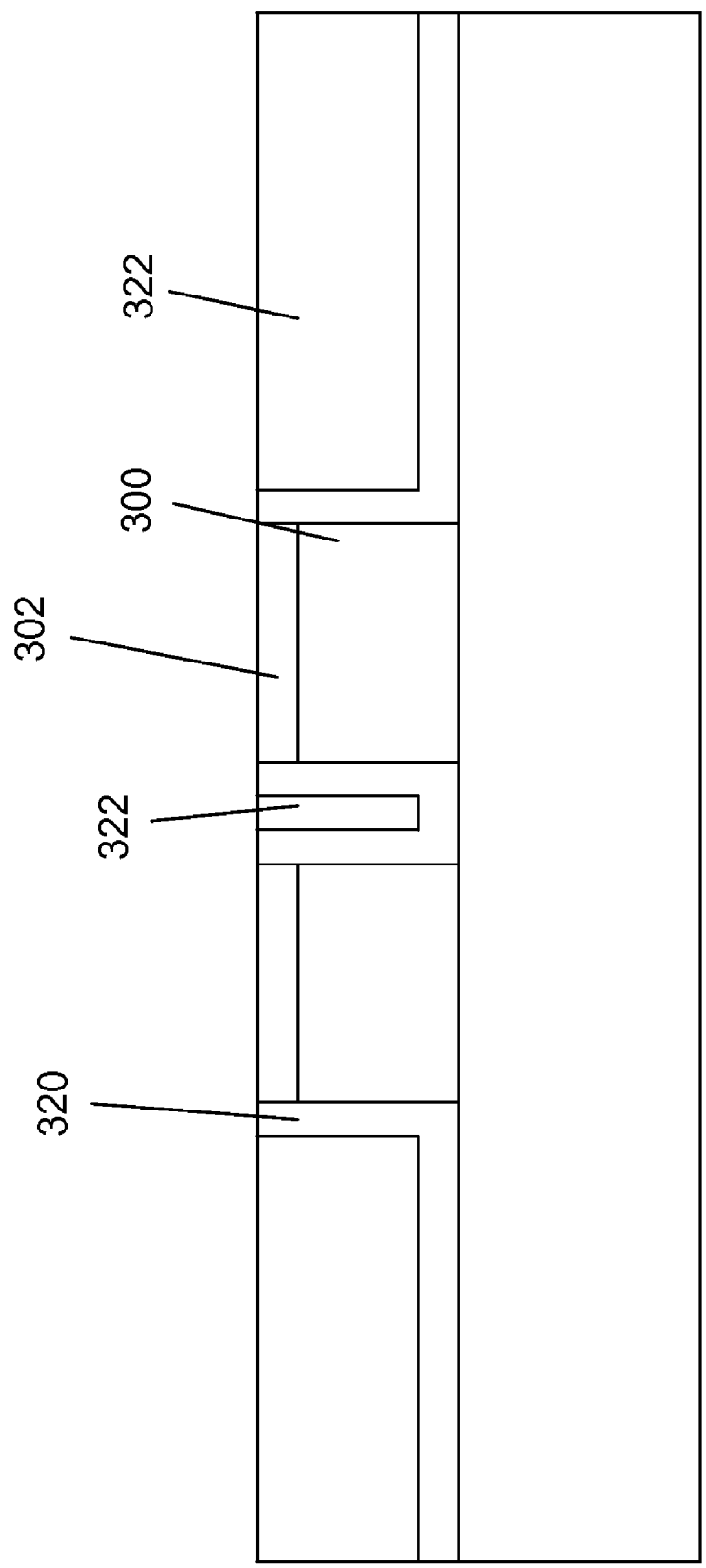
Figure 24B:
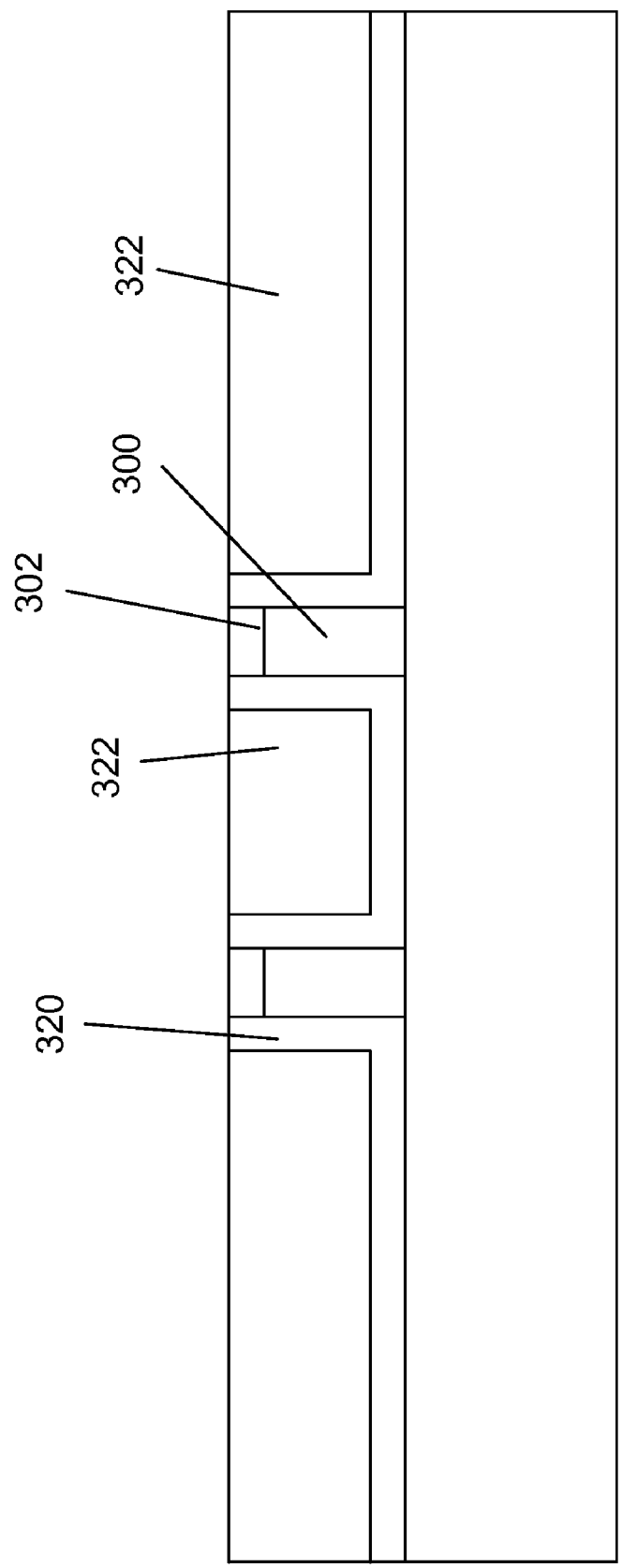
Figure 25:
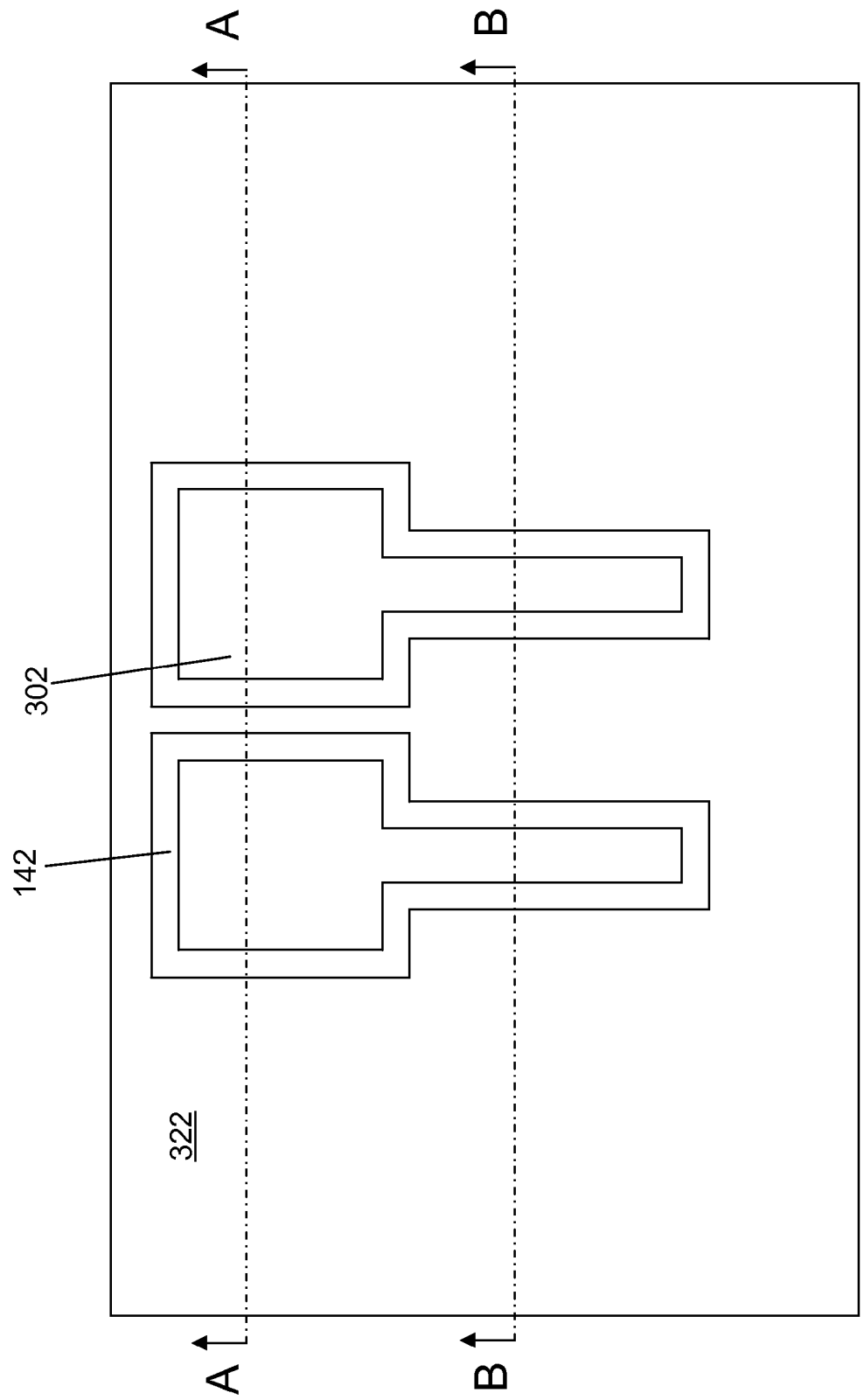
Figure 25A:
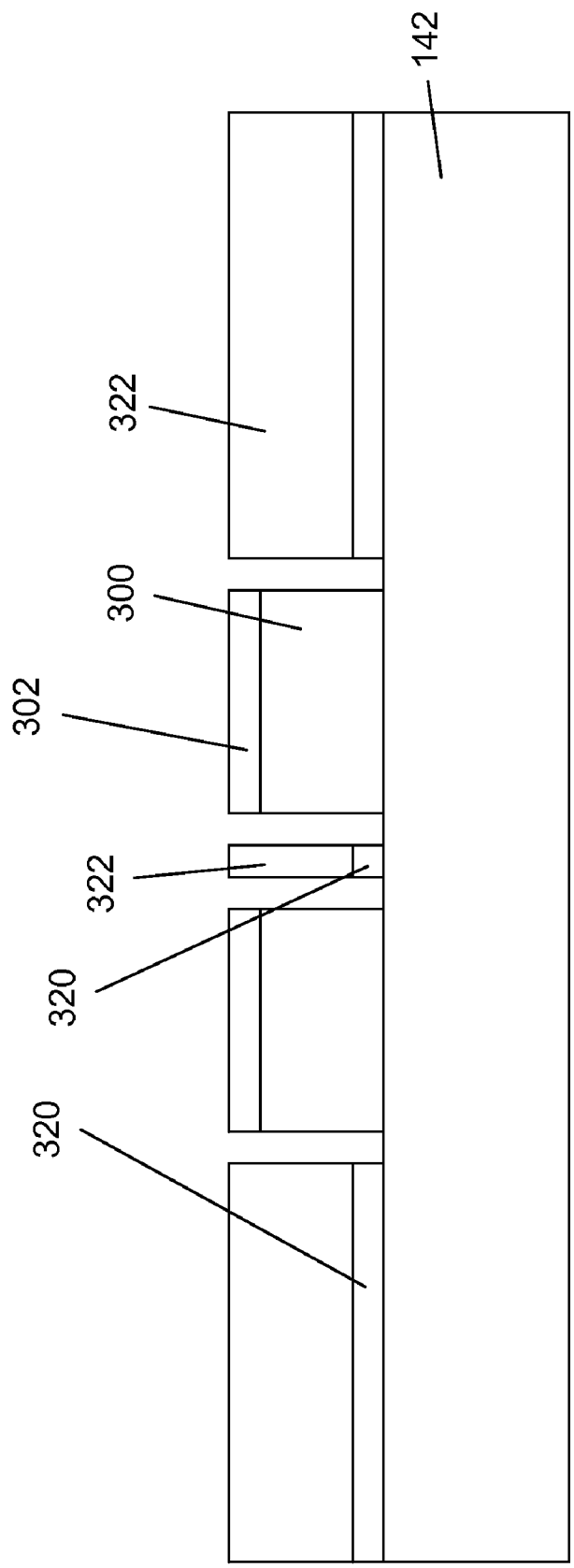
Figure 25B:
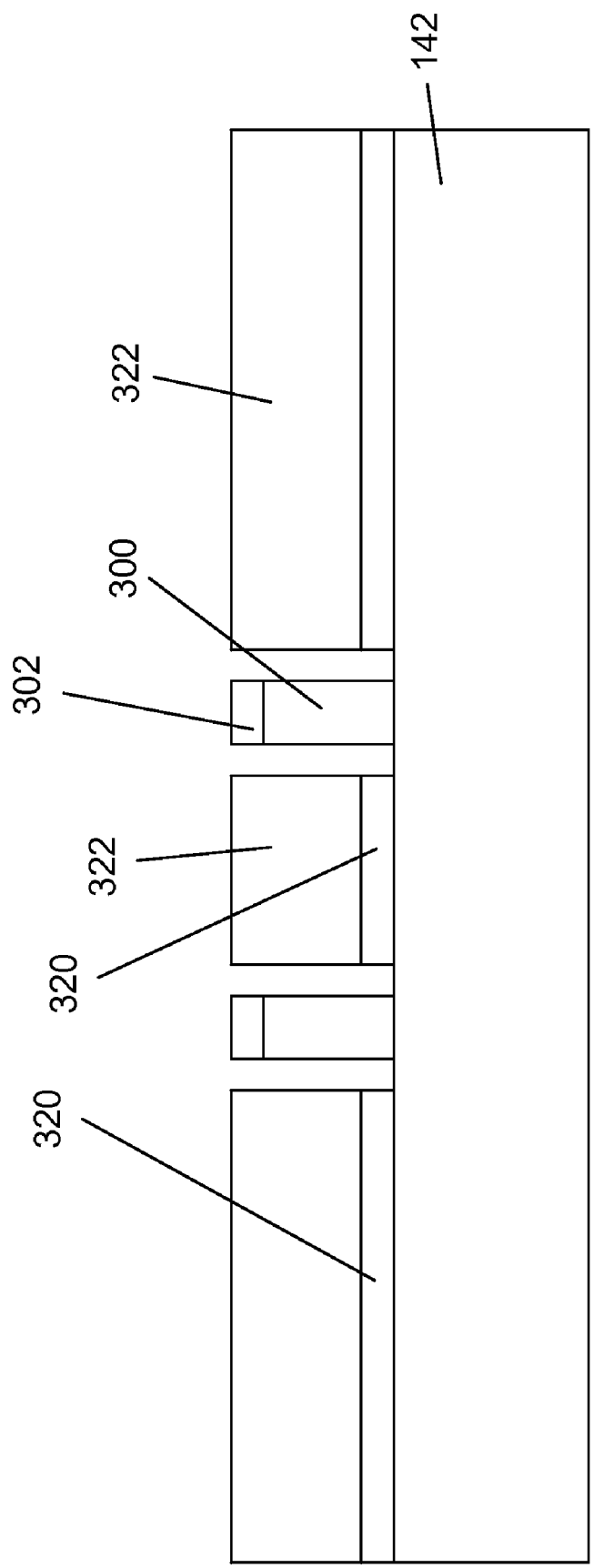
Figure 26A:
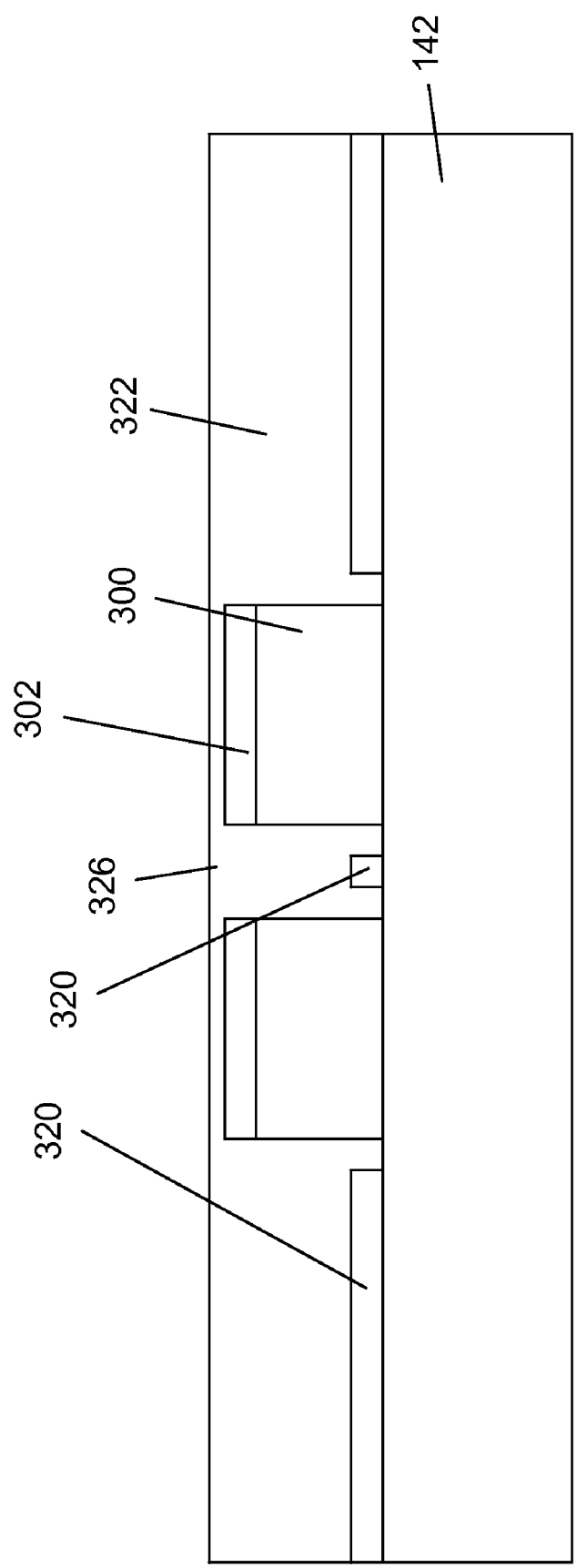
Figure 26B:
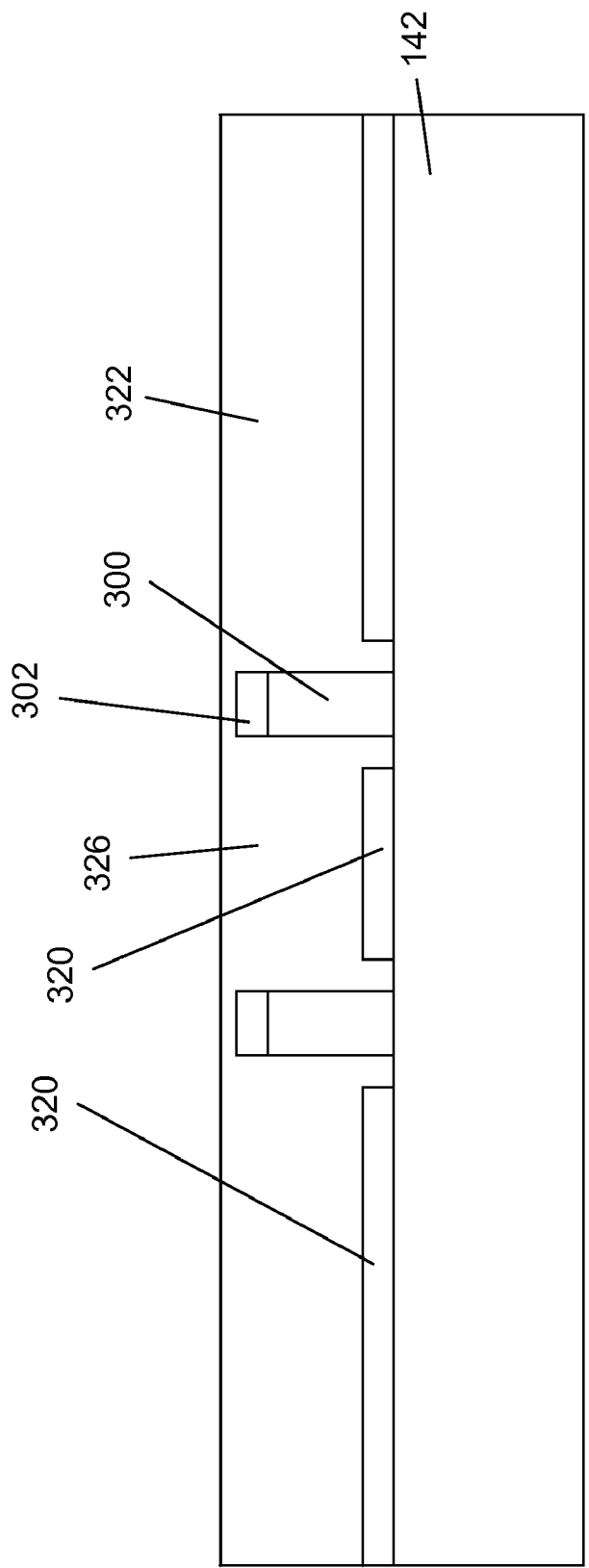
Figure 27A:
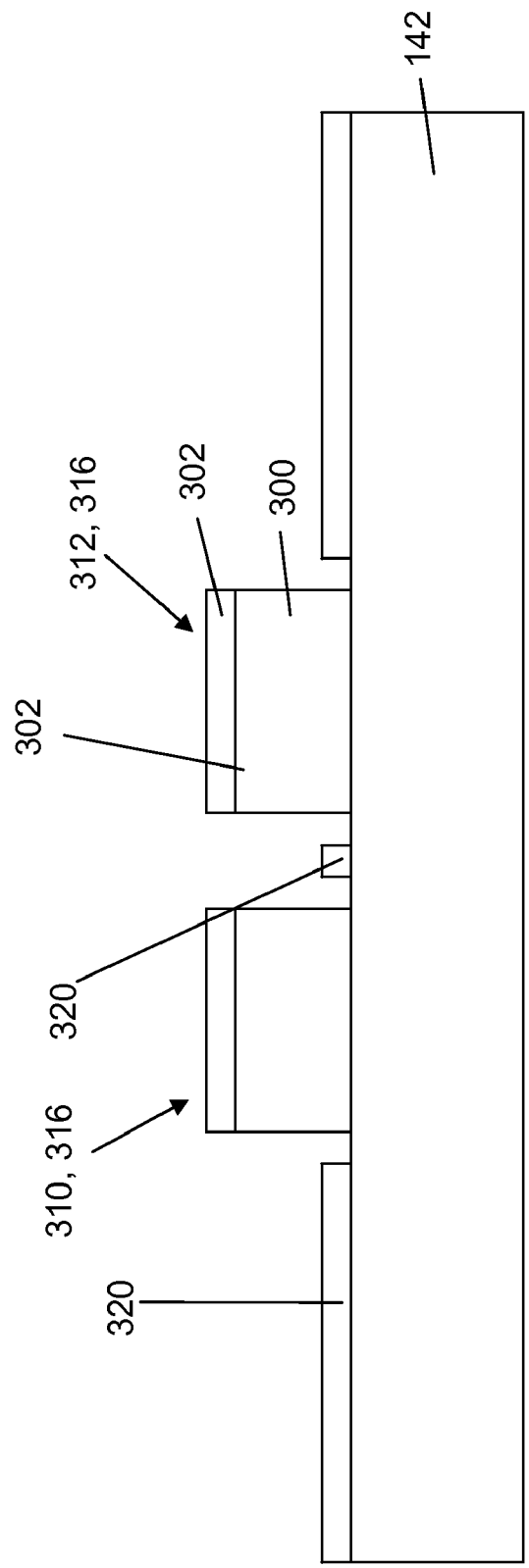
Figure 27B:
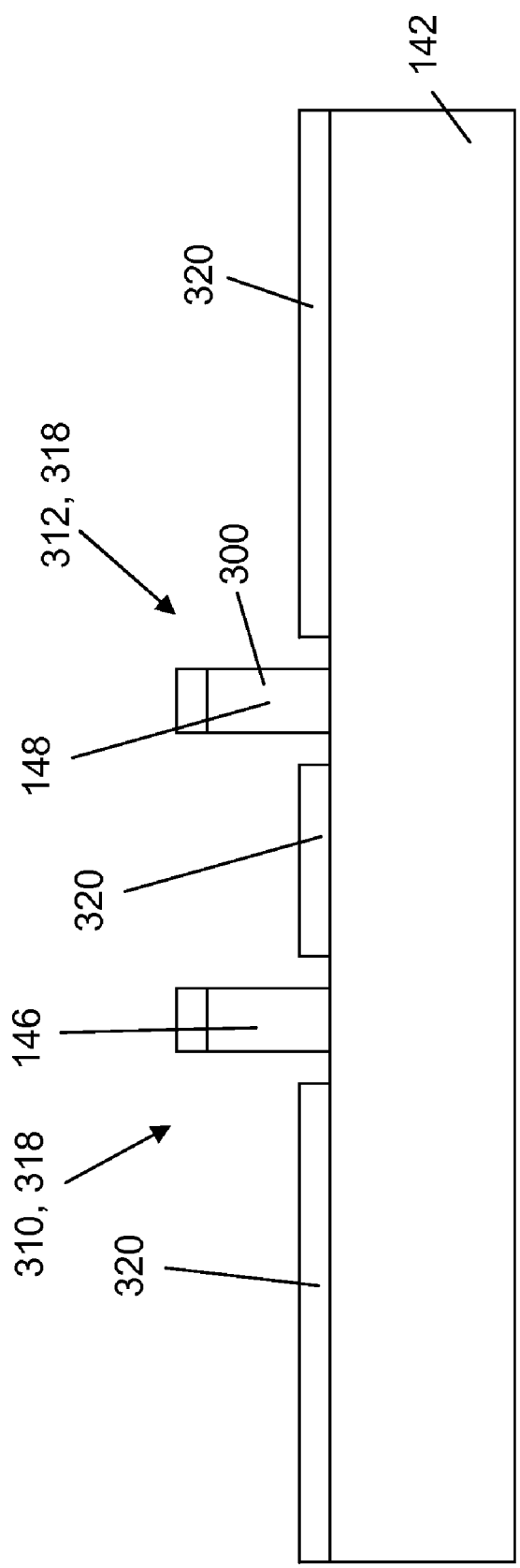

FIGS. 23-23B show depositing a second metal layer 320. Second metal layer 320 may include titanium having a thickness of approximately 10-30 nm, i.e., thinner than first metal layer 300 (FIG. 21A). FIGS. 24-24B show depositing a second insulator layer 322, such as silicon oxide ($SiO_2$) and planarizing (CMP) to first insulator layer 302, which exposes a portion of second metal layer 320. FIGS. 25-25B show removing the exposed portion of second metal layer 320 to insulative substrate 142 (FIGS. 25A-B), e.g., by performing a RIE. FIGS. 26A-B show filling a space previously filled by second metal layer 320 (FIGS. 24A-B) with a third insulator layer 326, e.g., silicon oxide ($SiO_2$). As will become apparent, third insulator layer 326 avoids overetch of second insulator layer 322. FIGS. 27A-B show removing second and third insulator layers 322, 326 (FIG. 26B) to expose first metal layer 300, first insulator 302 and a remaining portion of second metal layer 320. As shown in FIG. 27B, first metal layer 300 ultimately provides source region 146 and drain region 148 in the narrow portions 318 of the T-shape pedestals 310, 312, respectively.

Figure 28:
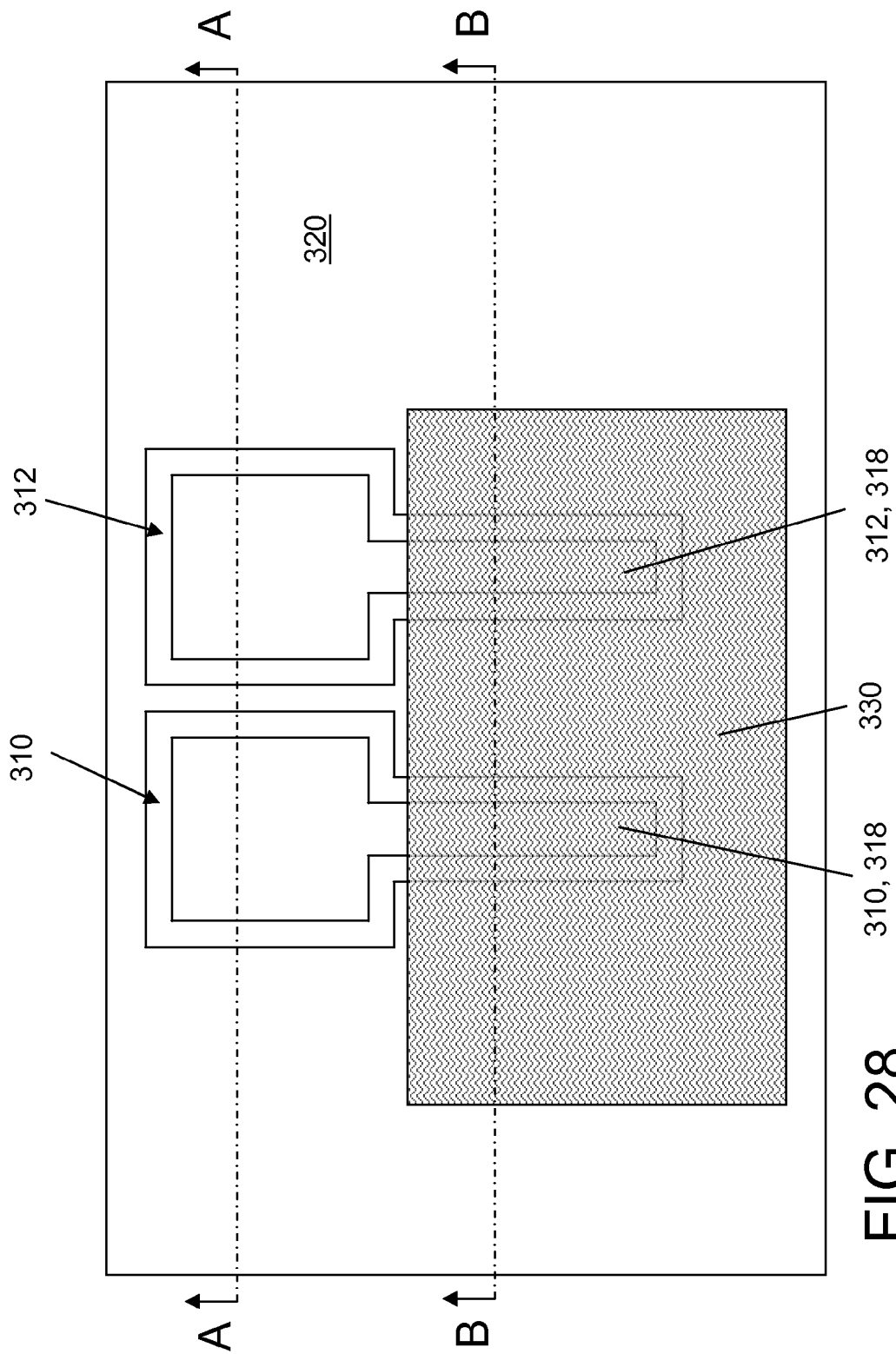
Figure 28B:
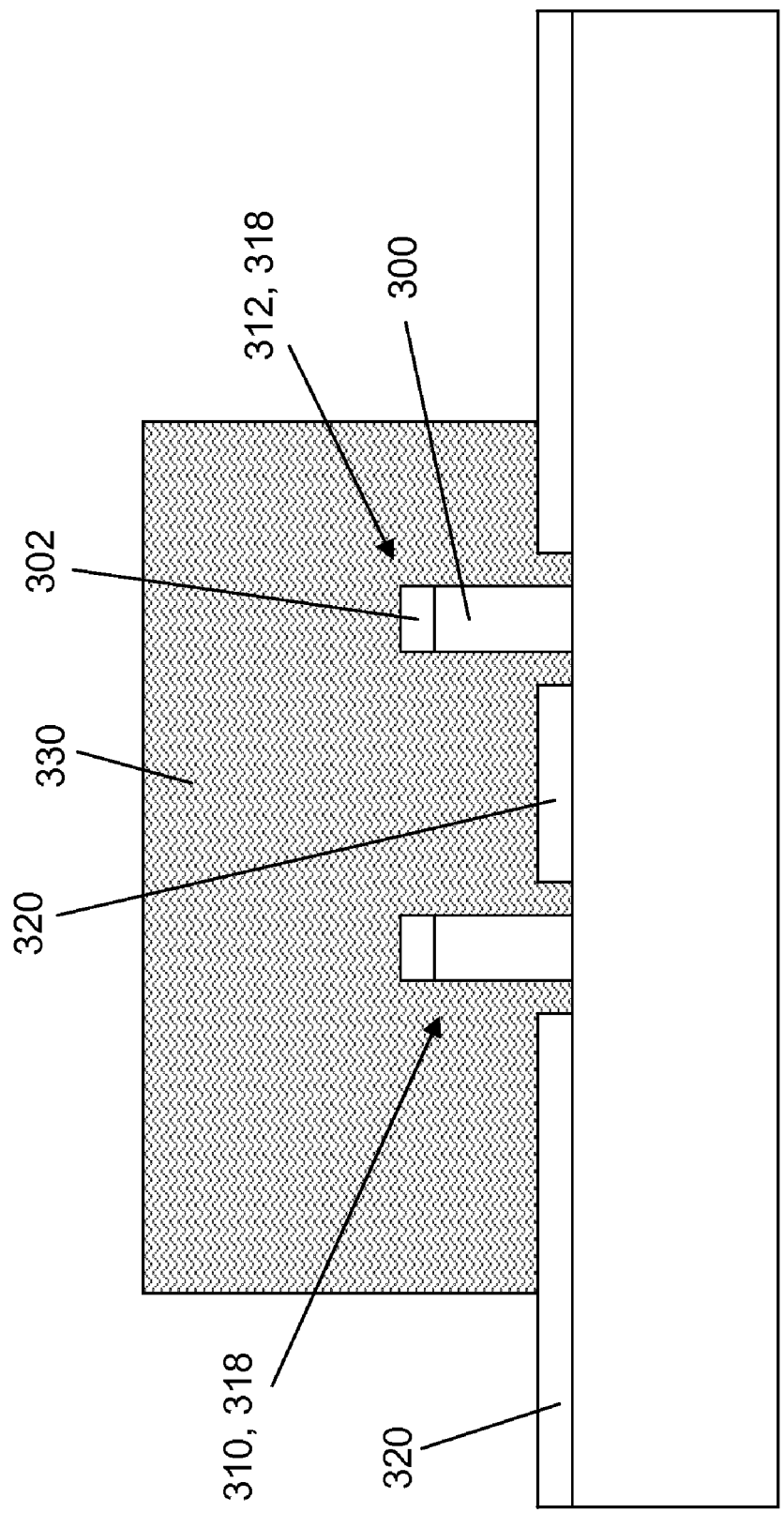
Figure 29:
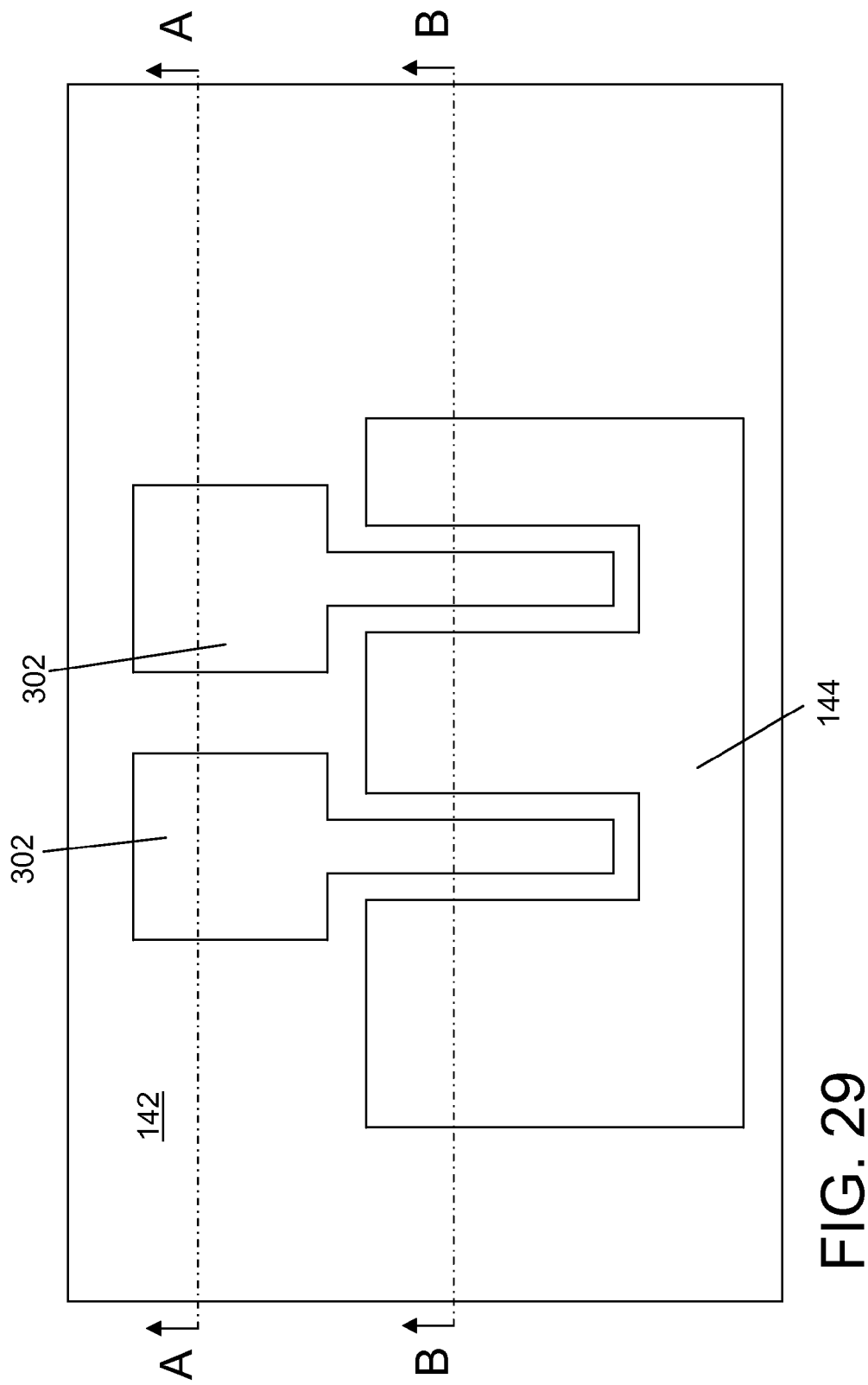
Figure 29A:
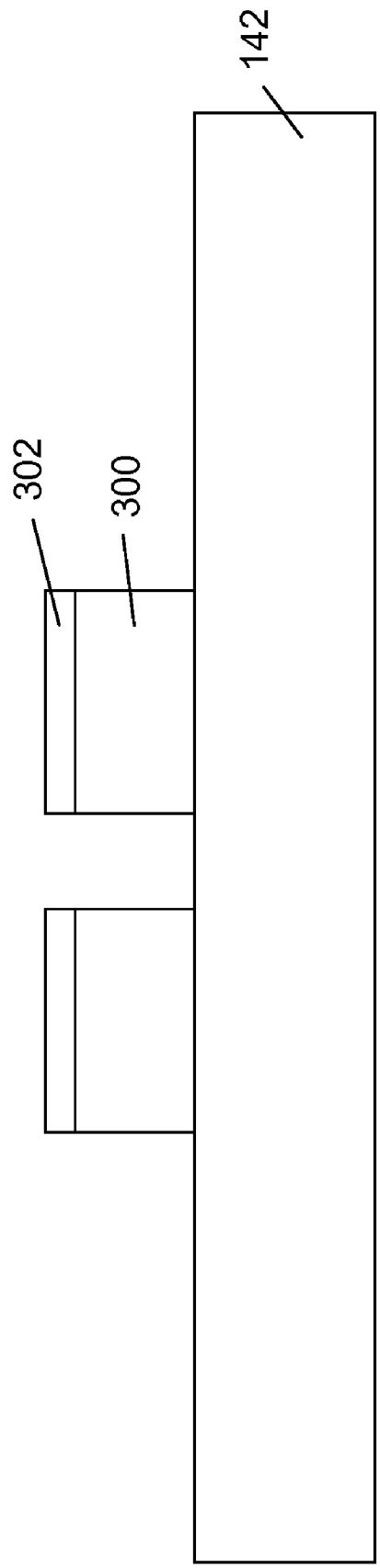
Figure 29B:
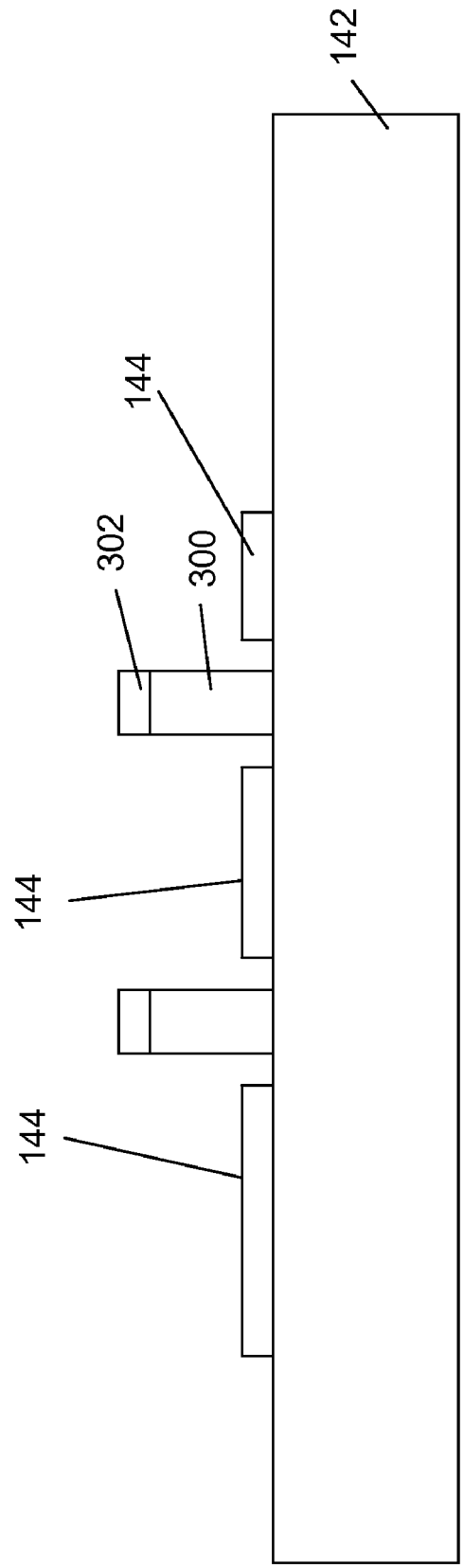

FIGS. 28-29B show forming a gate 144 (FIG. 29B) from the remaining portion of second metal layer 320. FIGS. 28 and 28B show patterning a photoresist 330 over narrow portion 318 of pedestals 310, 312 and removing exposed second metal layer 320, e.g., by performing a RIE. Photoresist 330 is then removed using any appropriate removal process. FIG. 29 shows a top view of gate 144 so formed (substantially W-shaped), and FIG. 29B shows a cross-sectional view along line B-B in FIG. 29 of gate 144 (view cuts through the legs of the W-shape). FIG. 29A shows that second metal layer 320 (FIG. 27A) is removed.

Figure 30A:
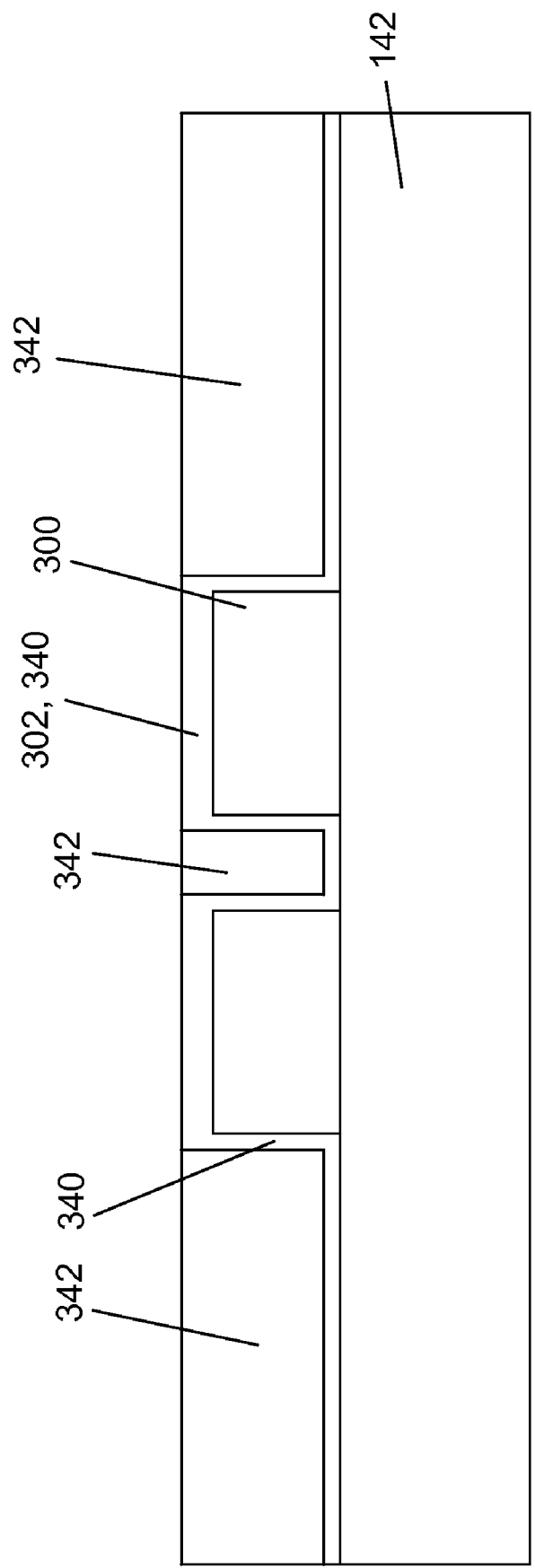
Figure 30B:
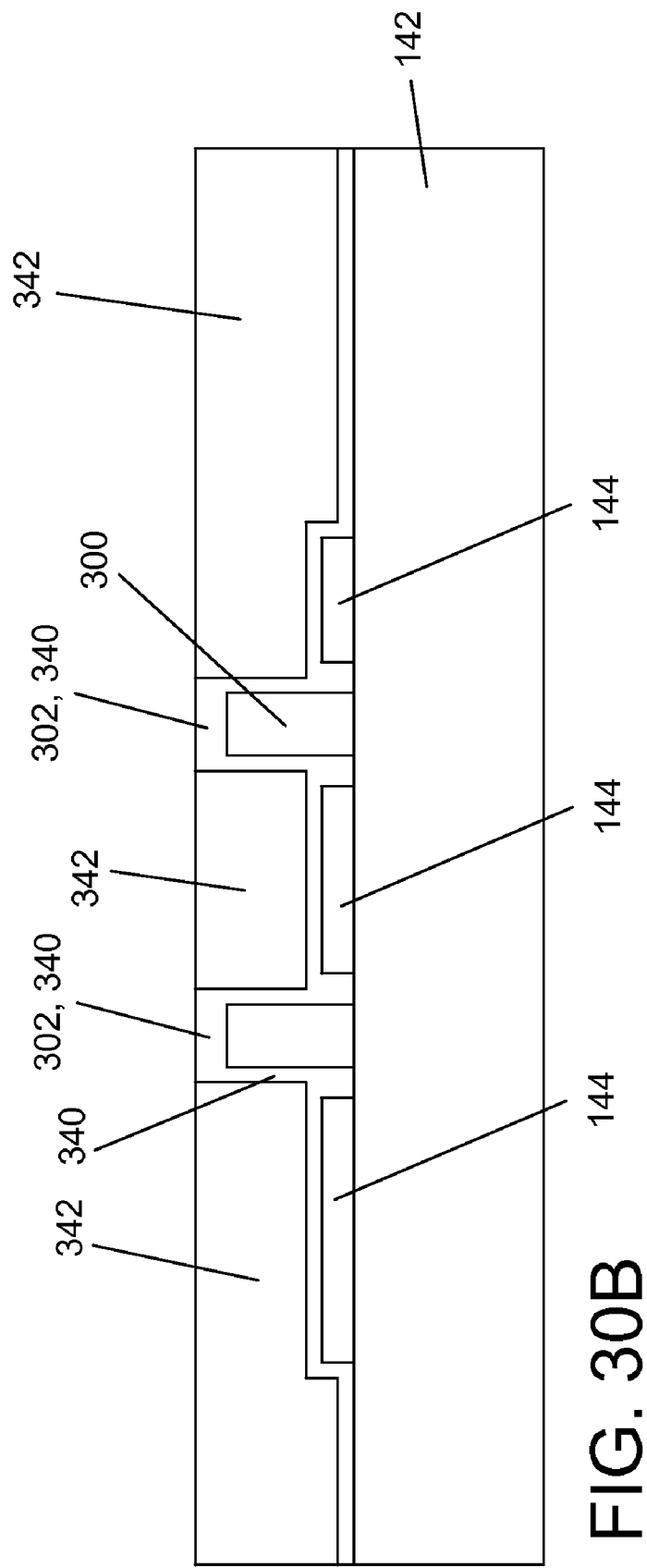

FIGS. 30A-36C show forming an elongated channel member 152 (FIG. 36B) having an insulator member 170 (FIGS. 36B-36C) coupled thereto. FIGS. 30A-B show depositing a fourth insulator layer 340, e.g., silicon nitride ($Si_3N_4$), and an amorphous silicon (a-Si) 342 (e.g., at approximately 400° C.) and planarizing (CMP) to the fourth insulator layer 340 (indicated as 302, 340 because it's a contiguous layer with first insulator layer 302 in this embodiment).

Figure 31:
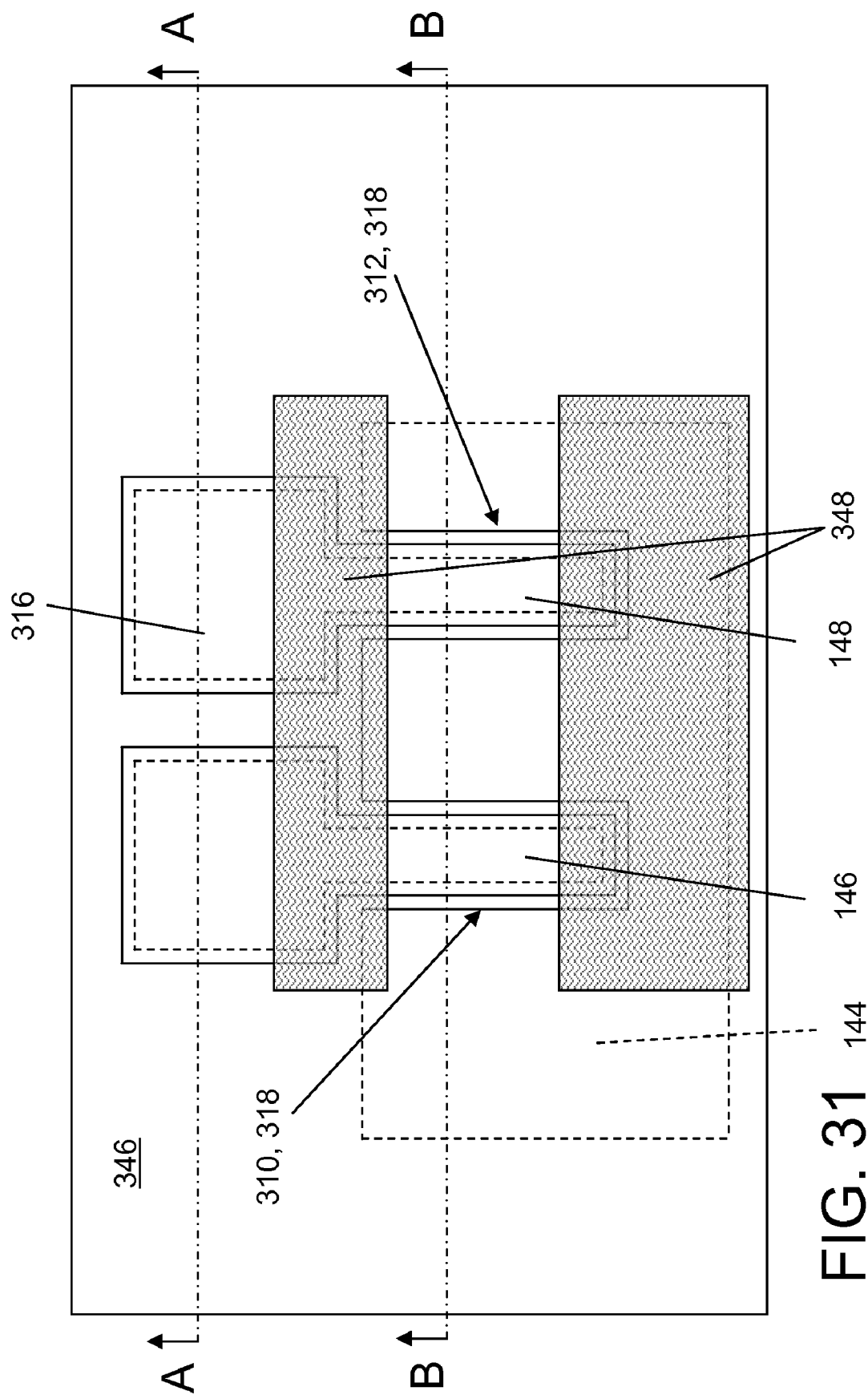
Figure 31A:
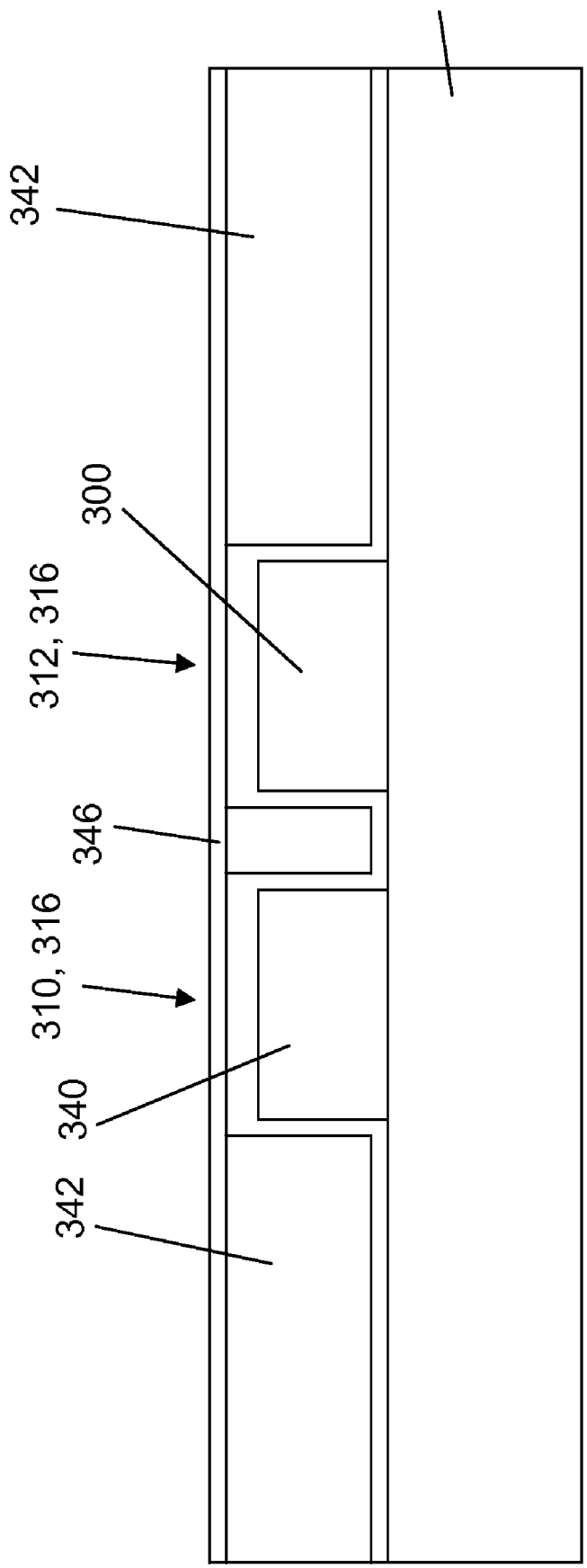
Figure 31B:
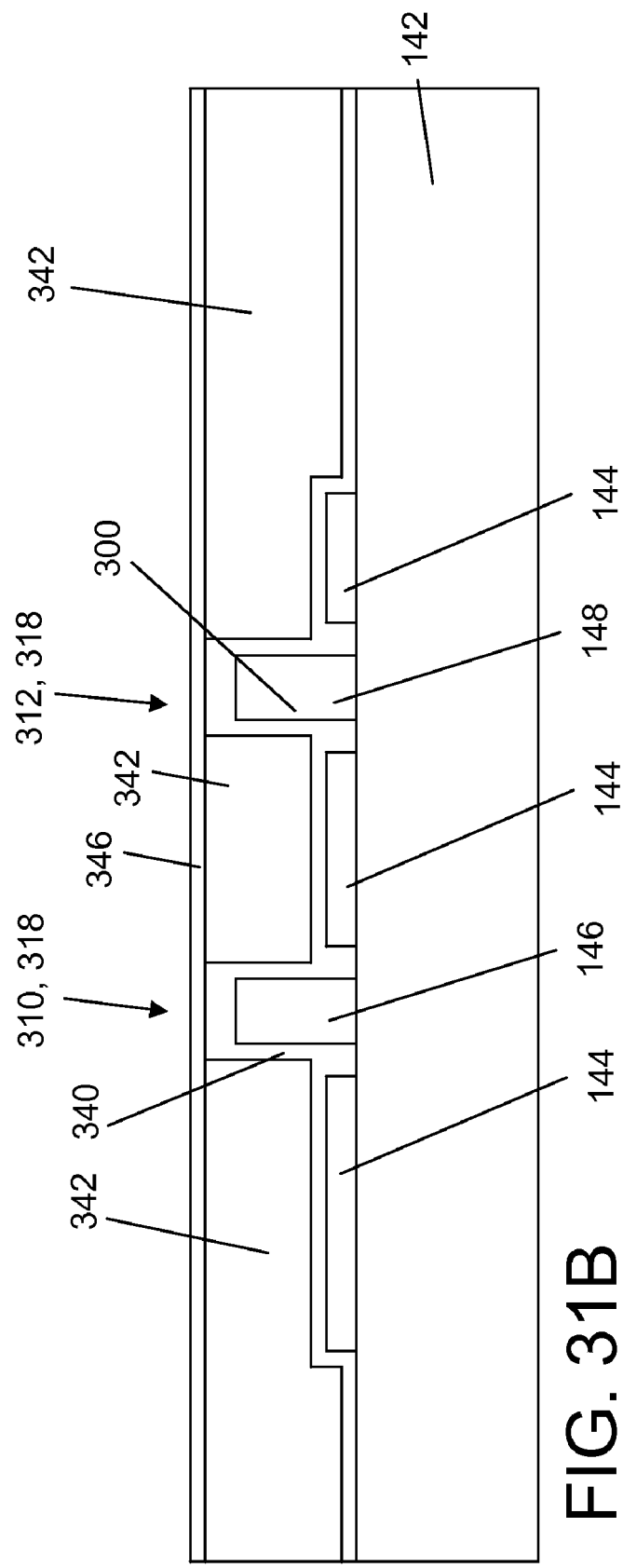
Figure 32:
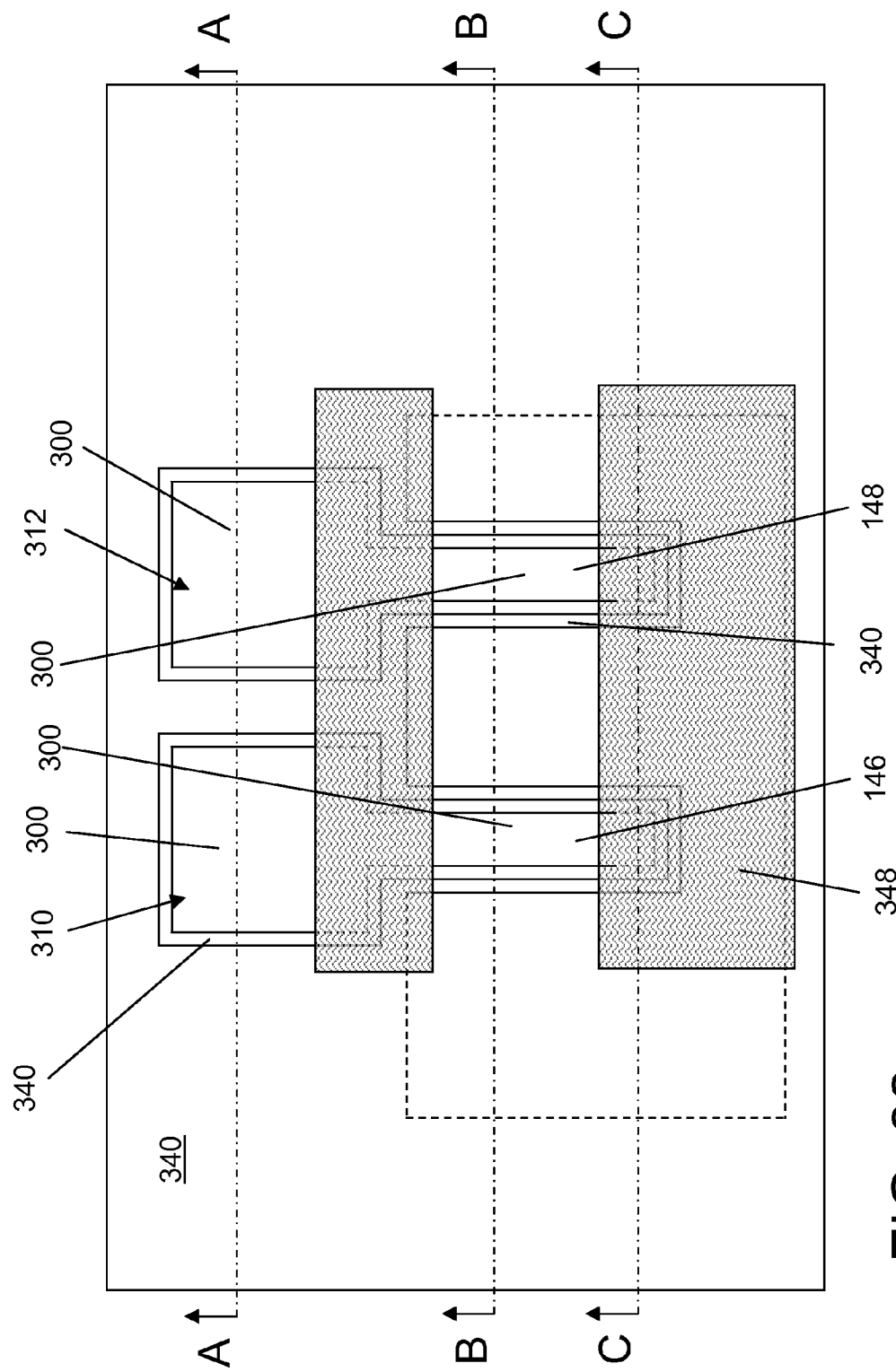
Figure 32A:
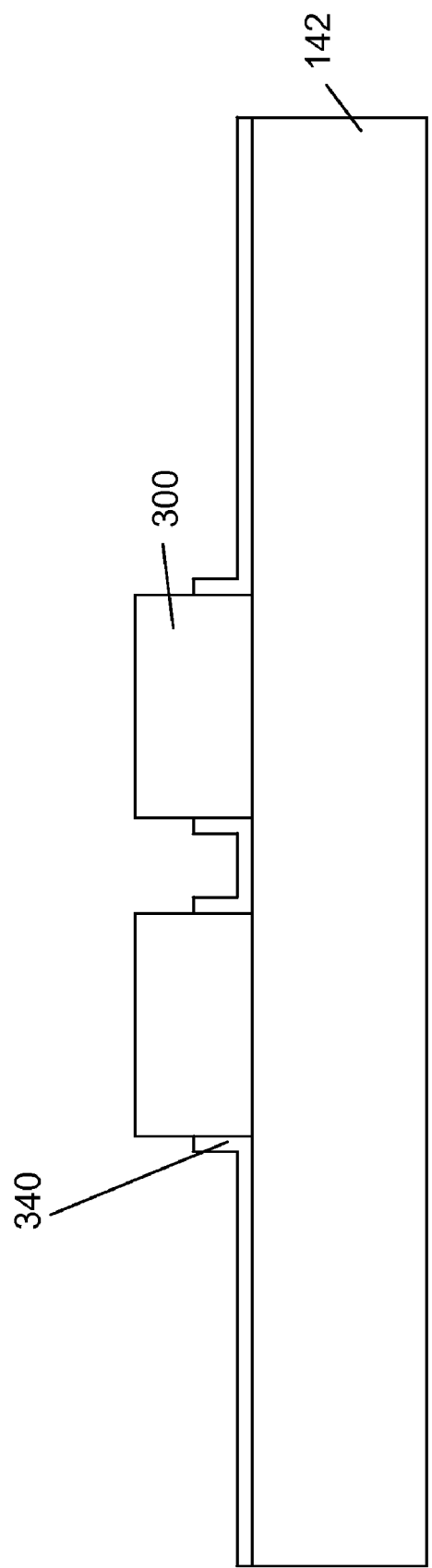
Figure 32B:
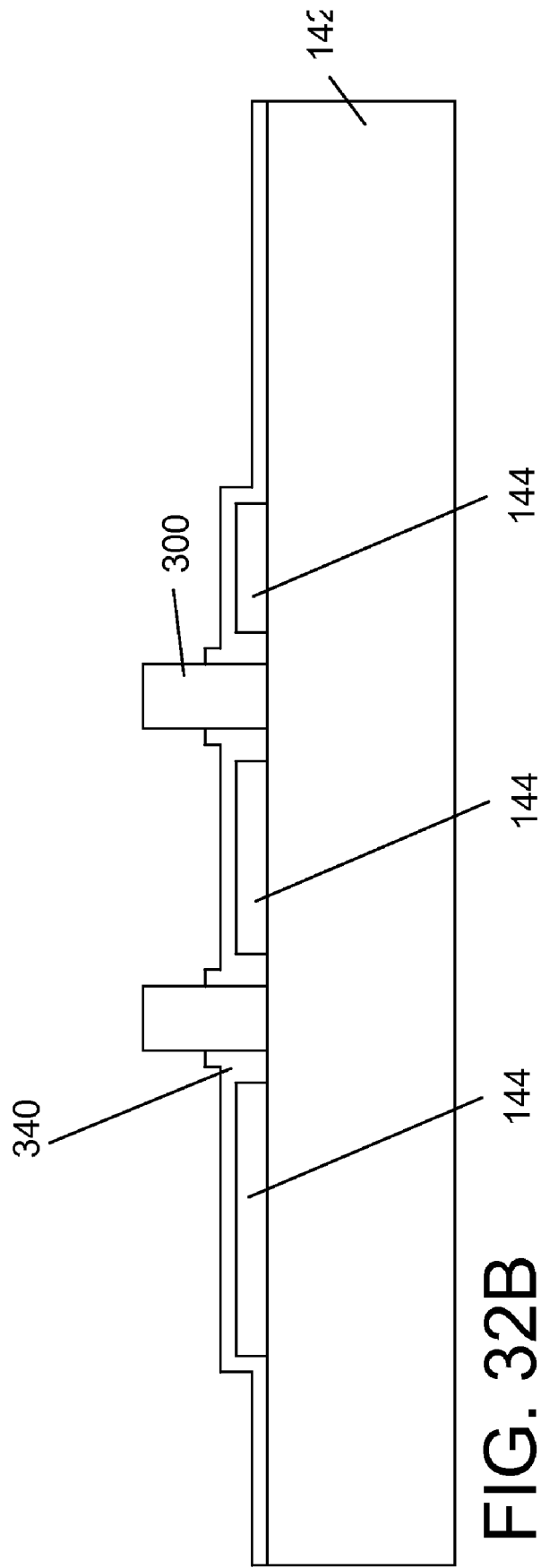
Figure 32C:
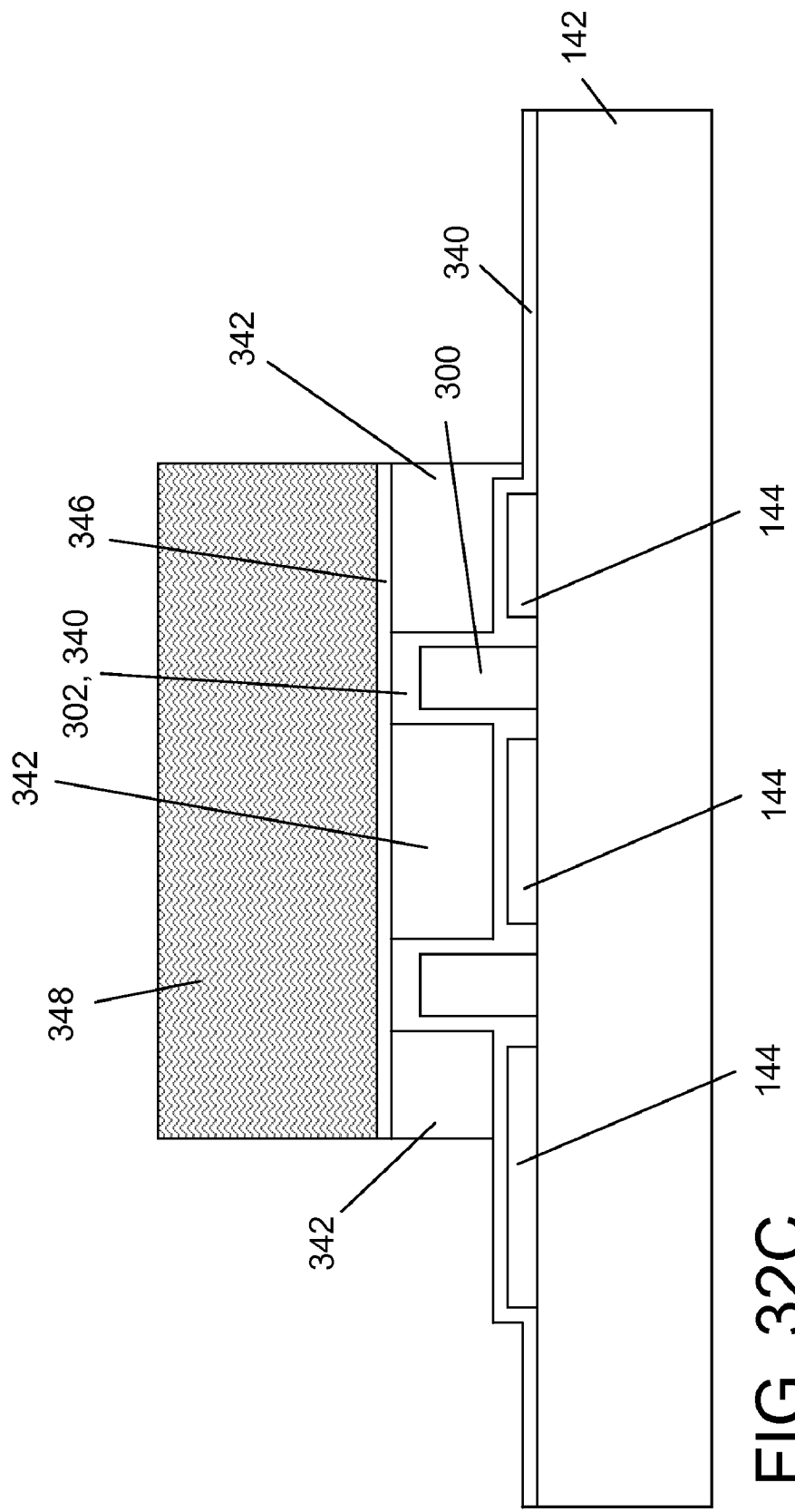

FIGS. 31-31B show depositing a fifth insulator layer 346 (e.g., a thin silicon nitride ($Si_3N_4$) layer) and patterning a photoresist 348 to expose a portion of source region 146 (FIGS. 31, 31B) and drain region 148 (FIGS. 31, 31 B). In one embodiment, photoresist 348 may be patterned over a junction of narrow portion 318 and wider portion 316 of T-shaped pedestals 310, 312. Hence, a portion of source region 146 (FIGS. 31, 31B) and drain region 148 (FIGS. 31, 31 B) and the rest of fifth insulator layer 346 are exposed. FIGS. 32-32C show removing, using photoresist 348, first and fifth insulator layers 302 (FIG. 30B), 346 (FIG. 31) and amorphous silicon 342 (FIG. 31A) and a portion of fourth insulator layer 340 to expose a portion of first metal layer 300. Photoresist 348 is then removed using any appropriate removal process.

Figure 33:
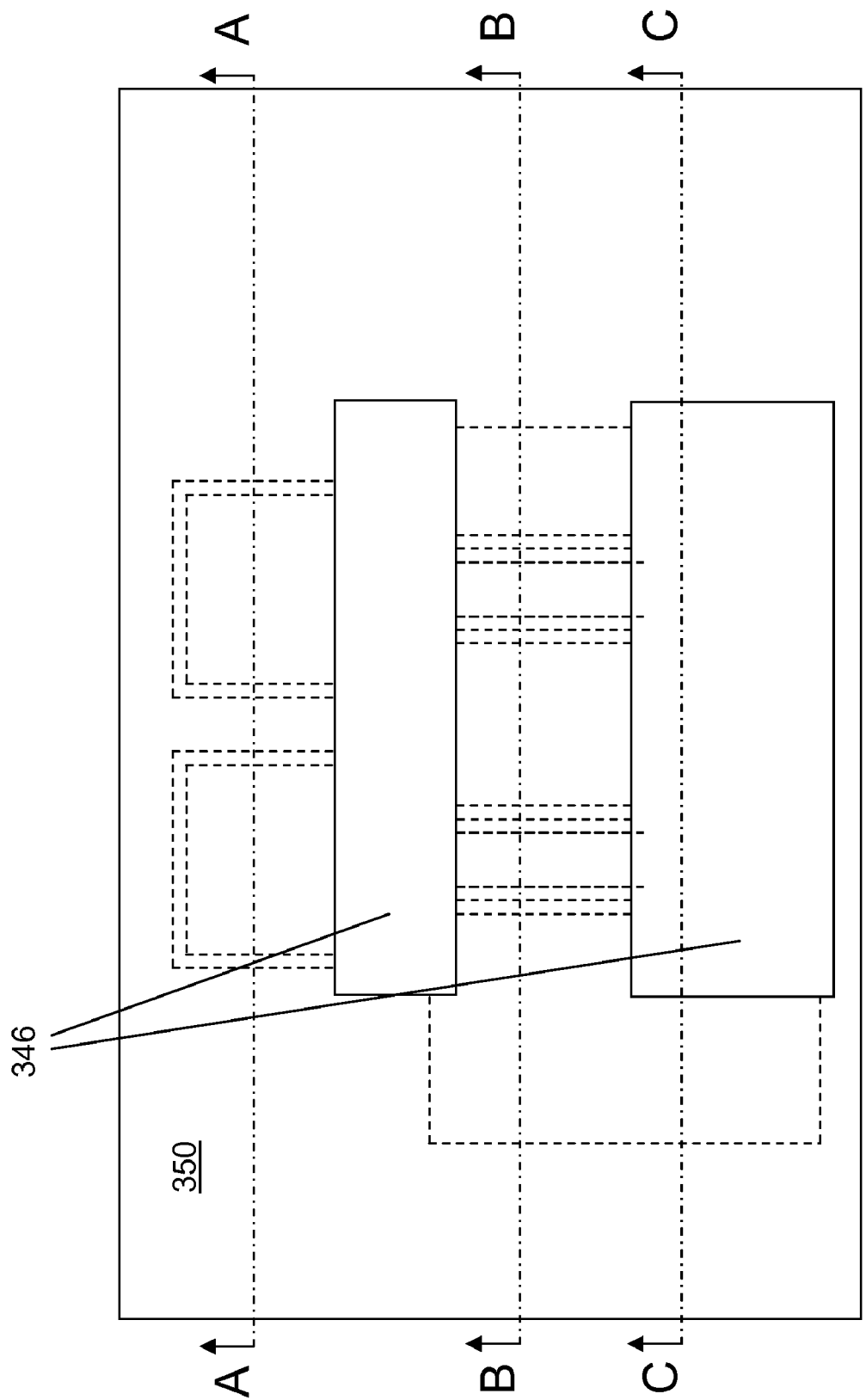
Figure 33A:
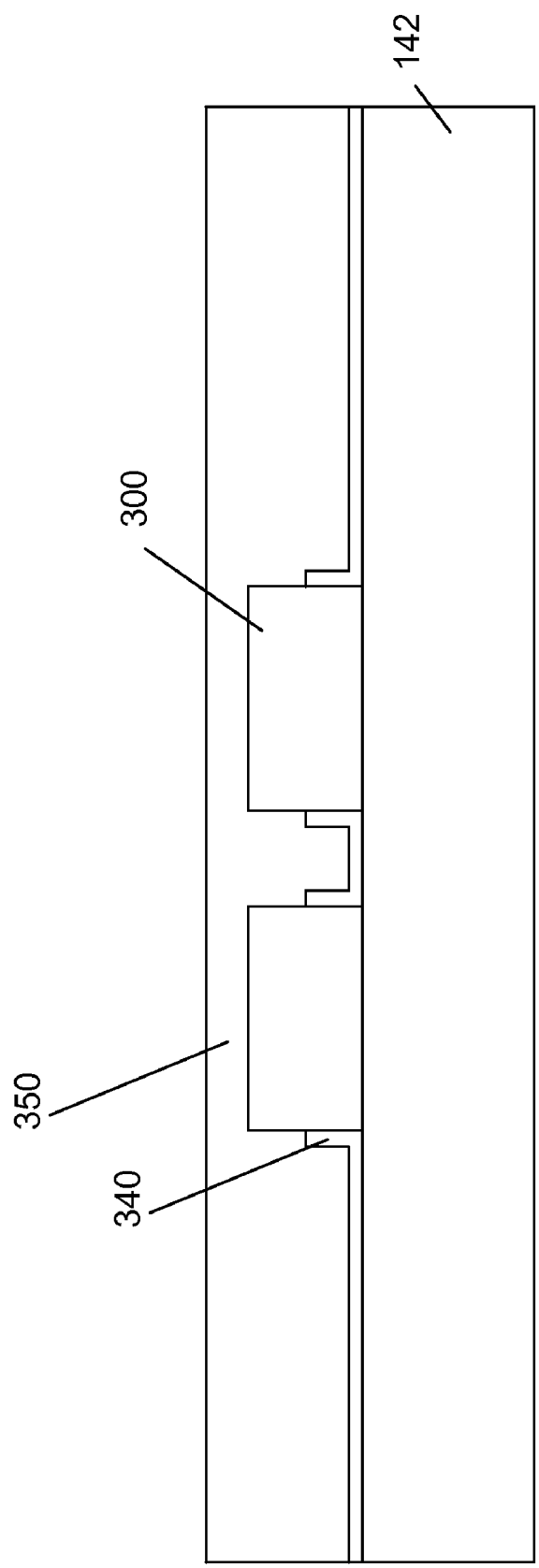
Figure 33B:
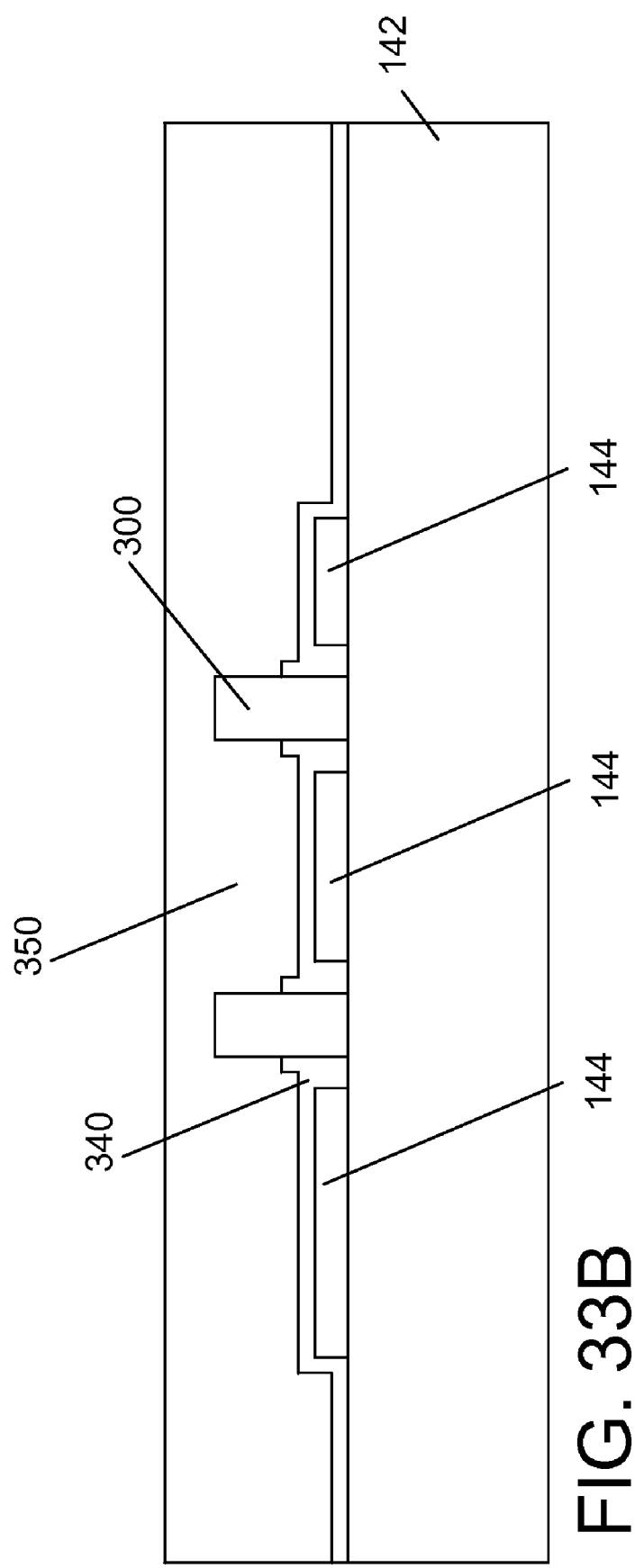
Figure 33C:
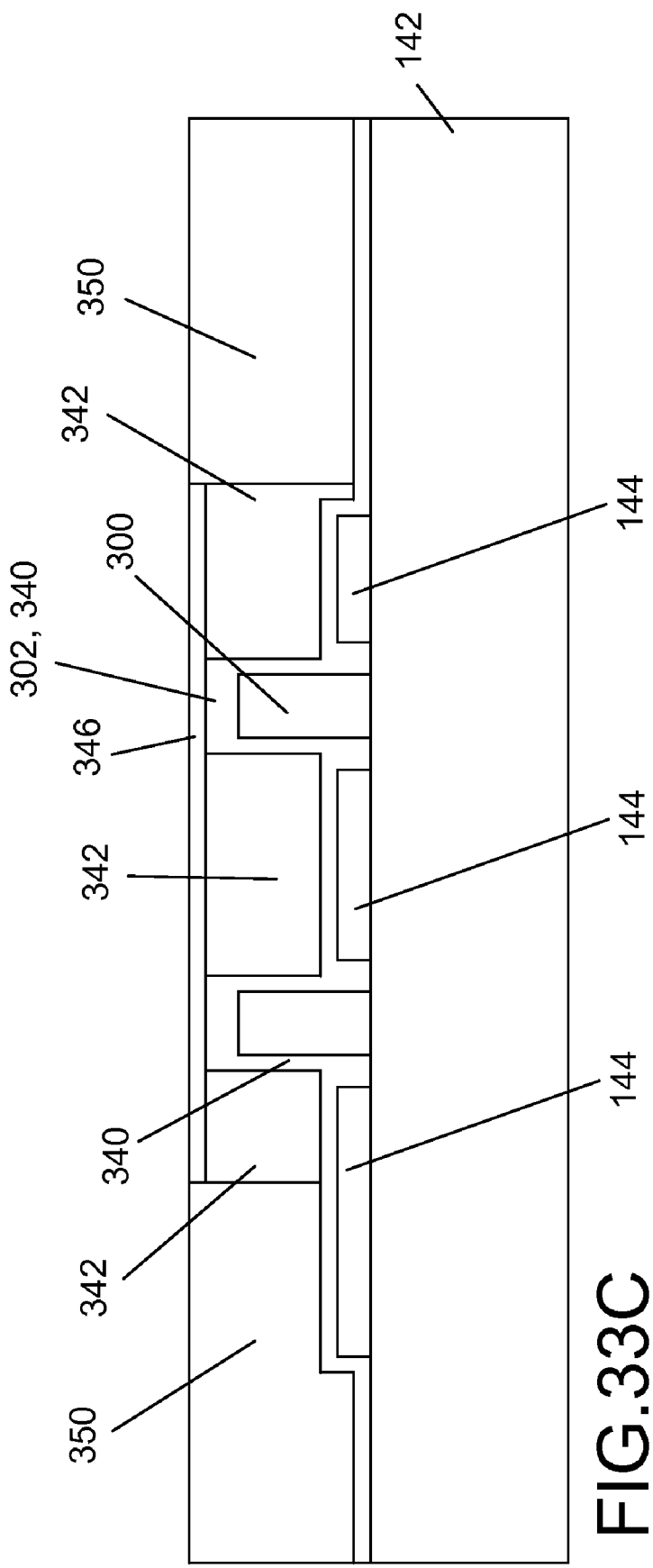
Figure 34:
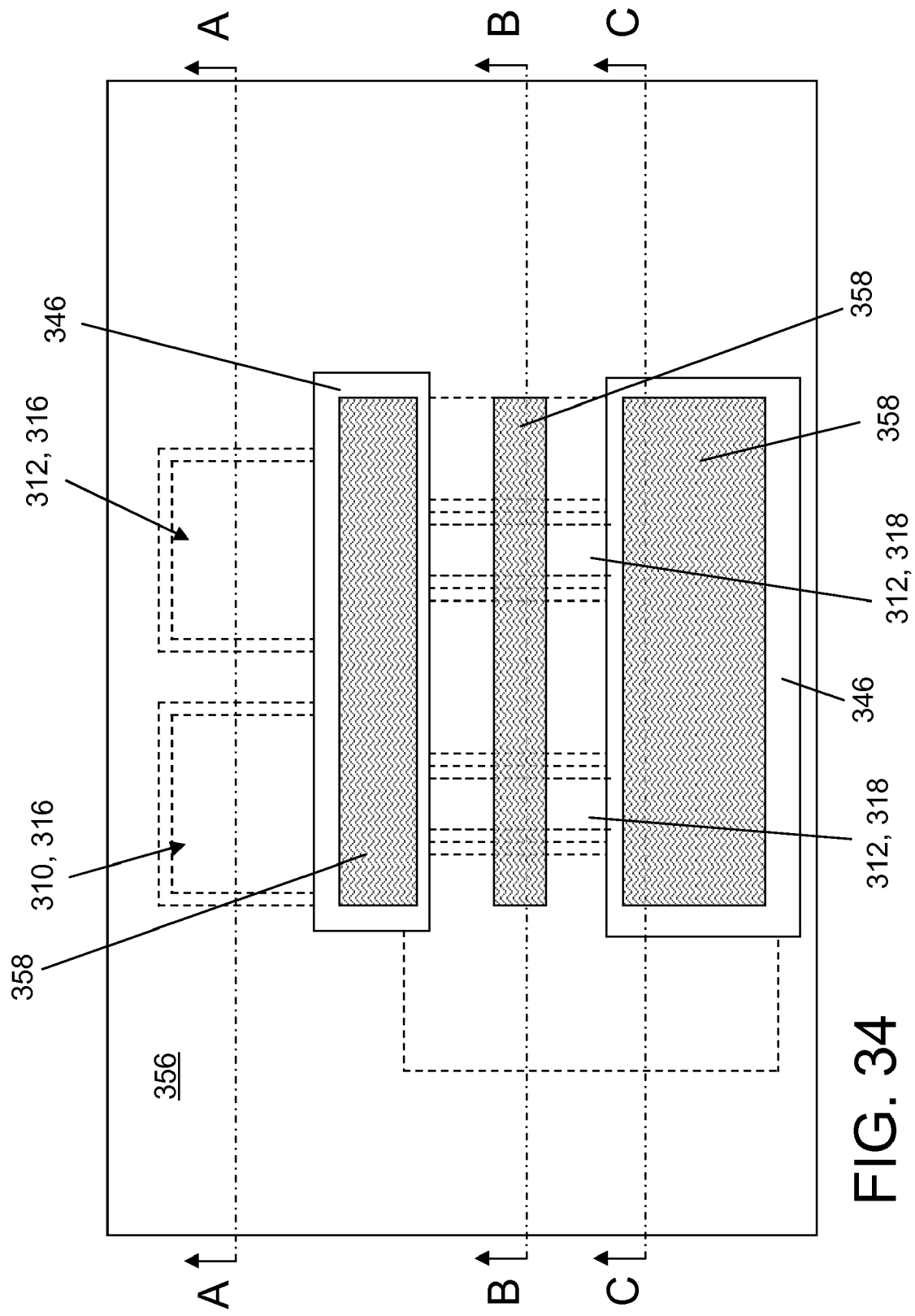
Figure 34A:
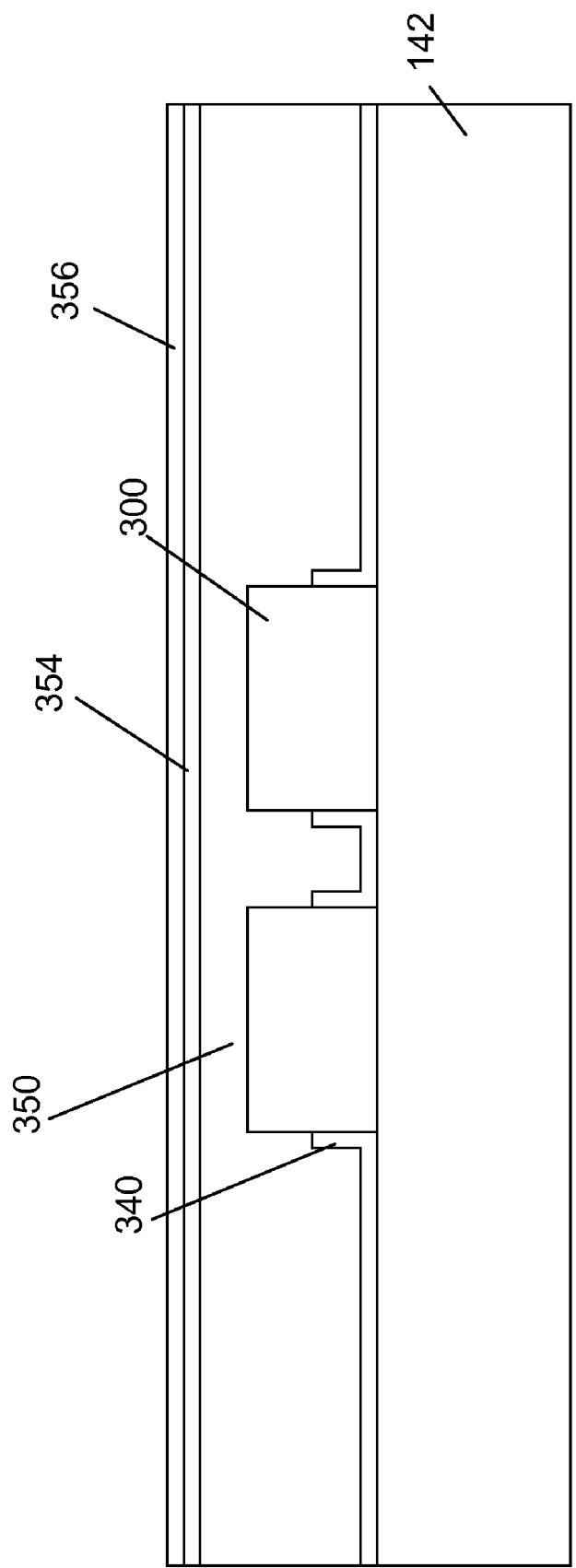
Figure 34B:
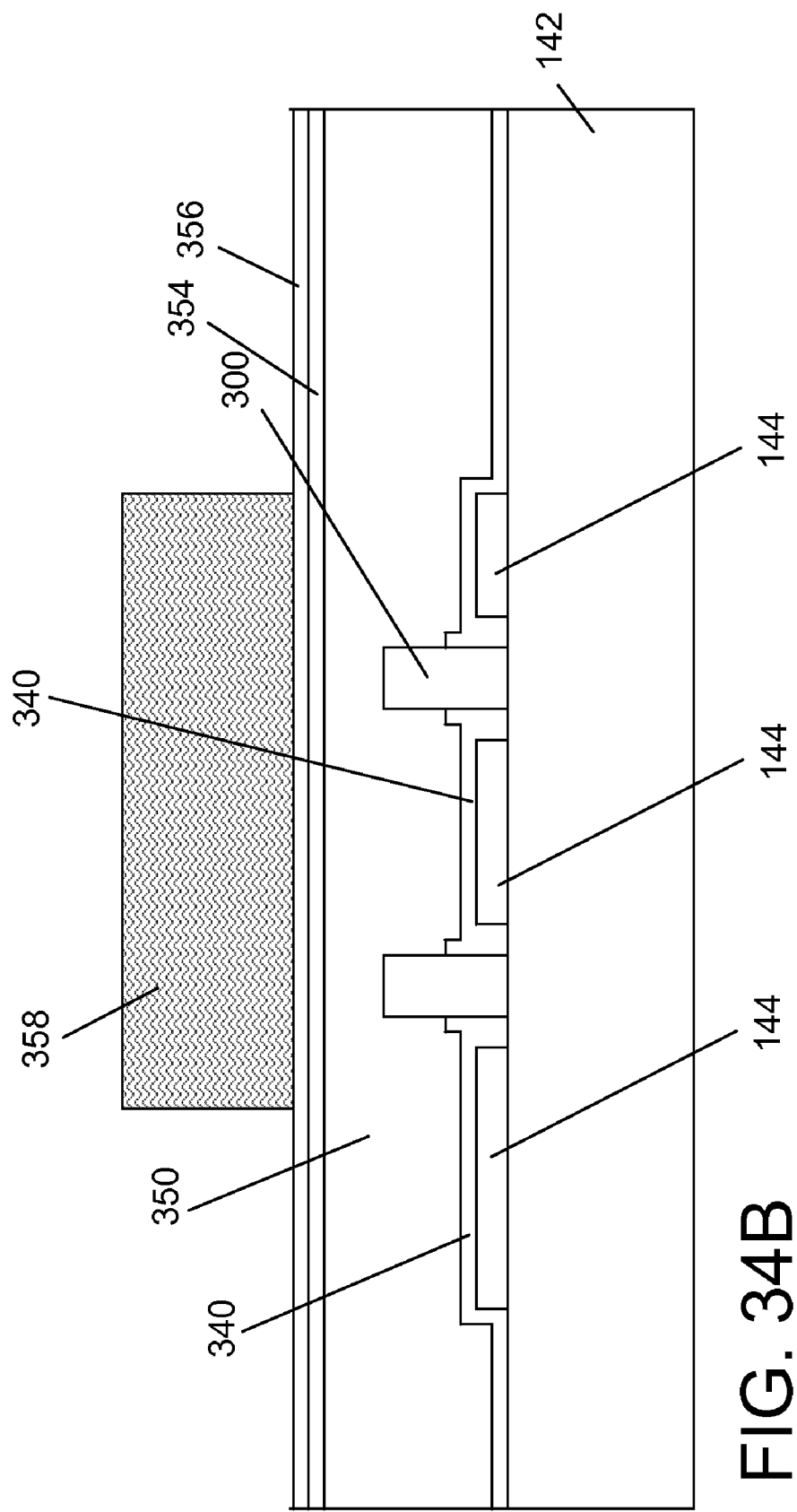
Figure 34C:
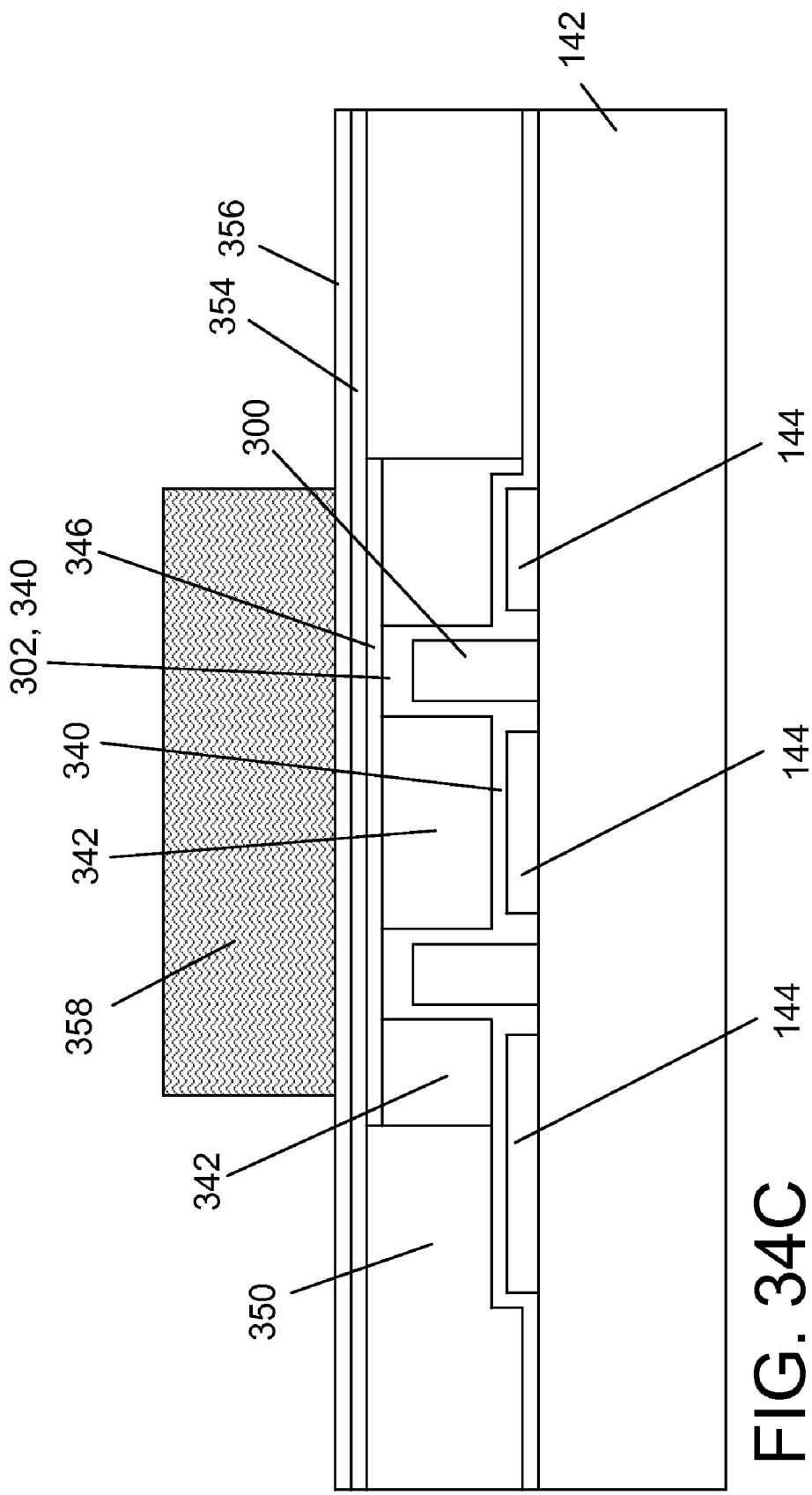
Figure 35:
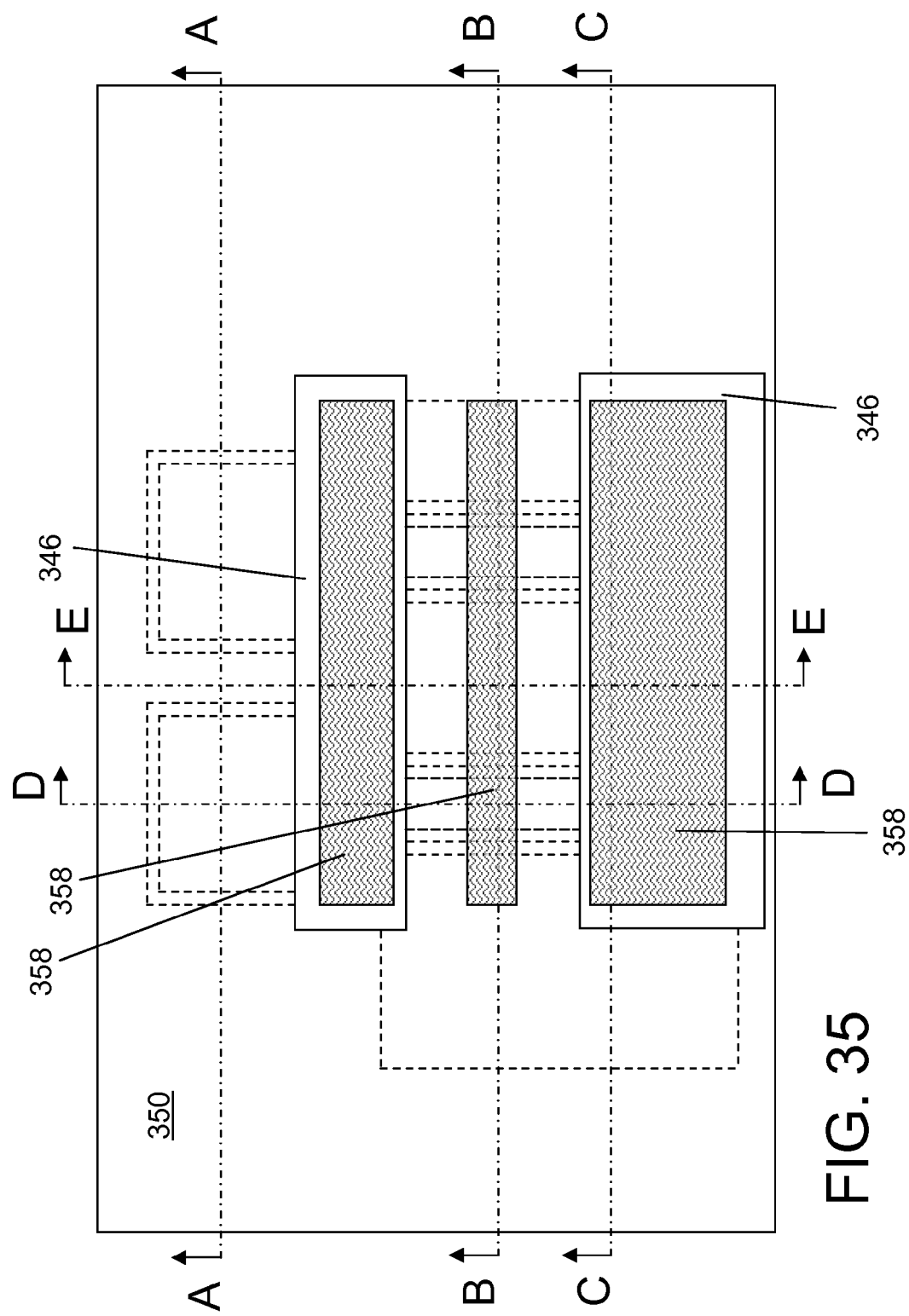
Figure 35A:
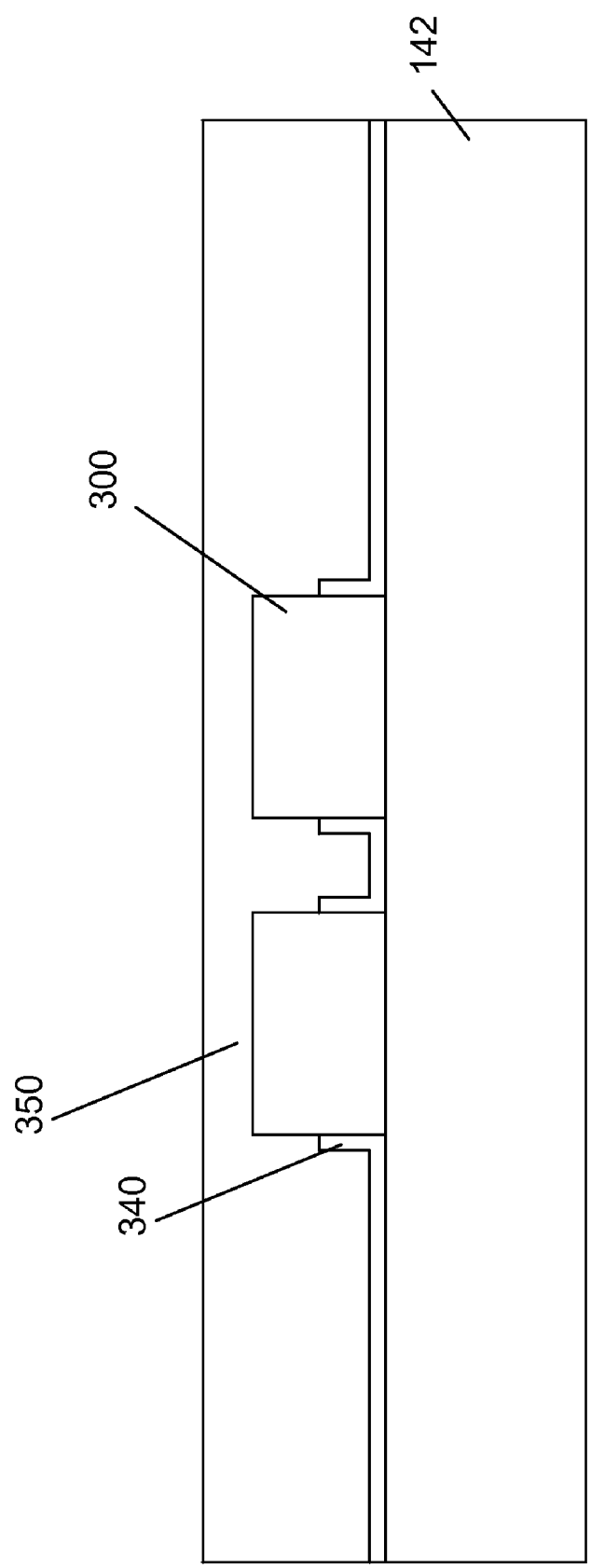
Figure 35B:
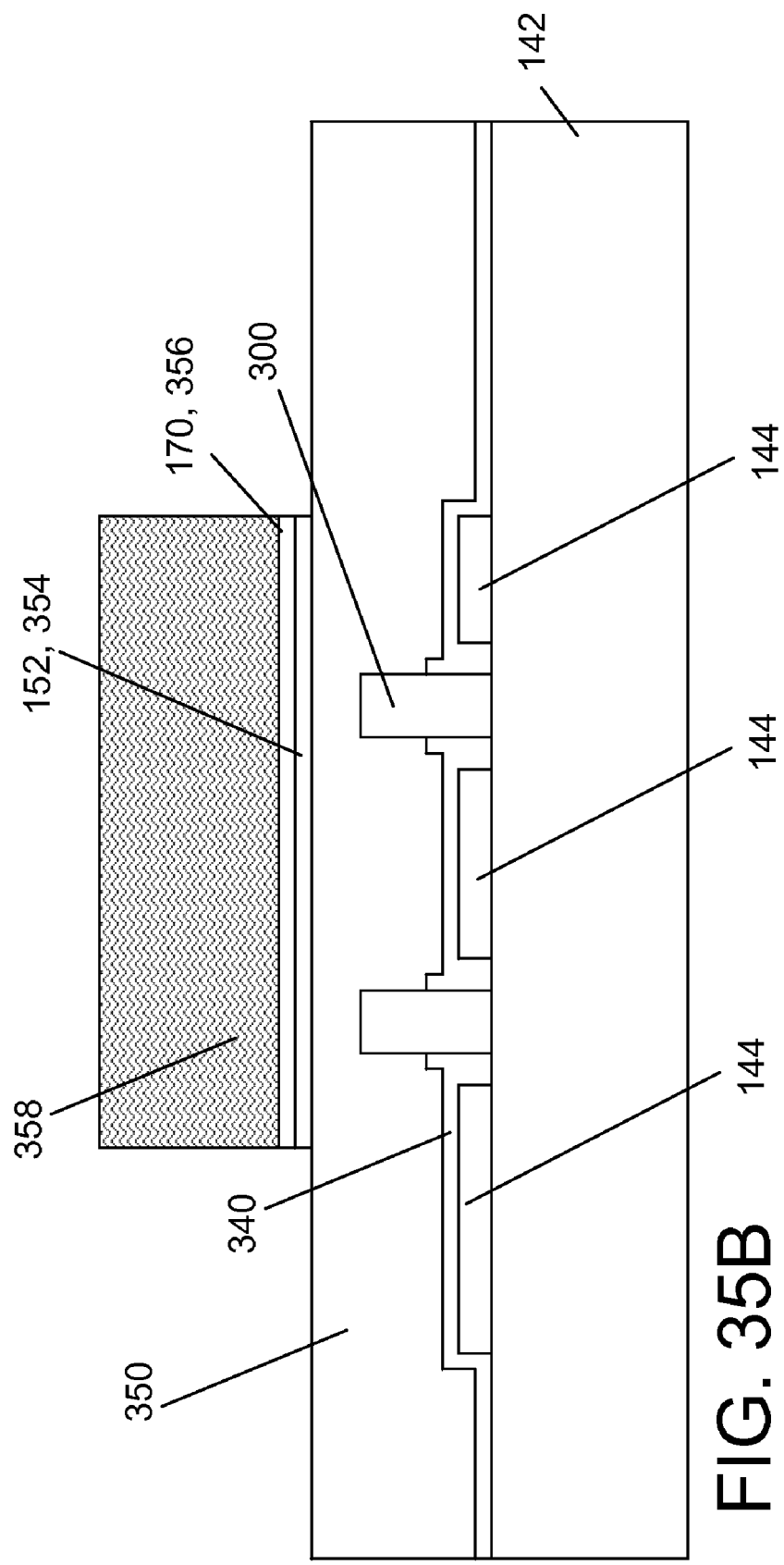
Figure 35C:
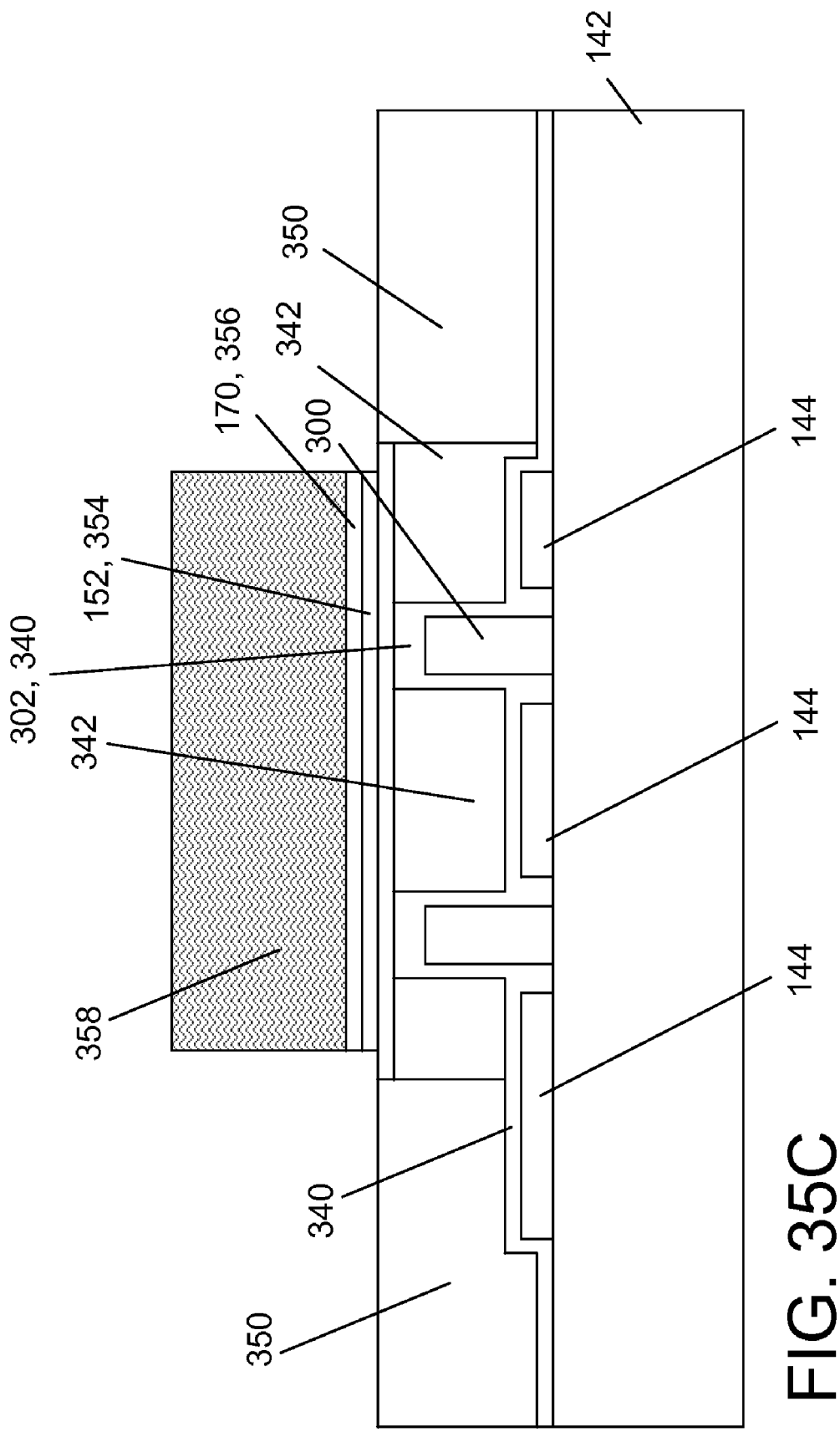
Figure 36:
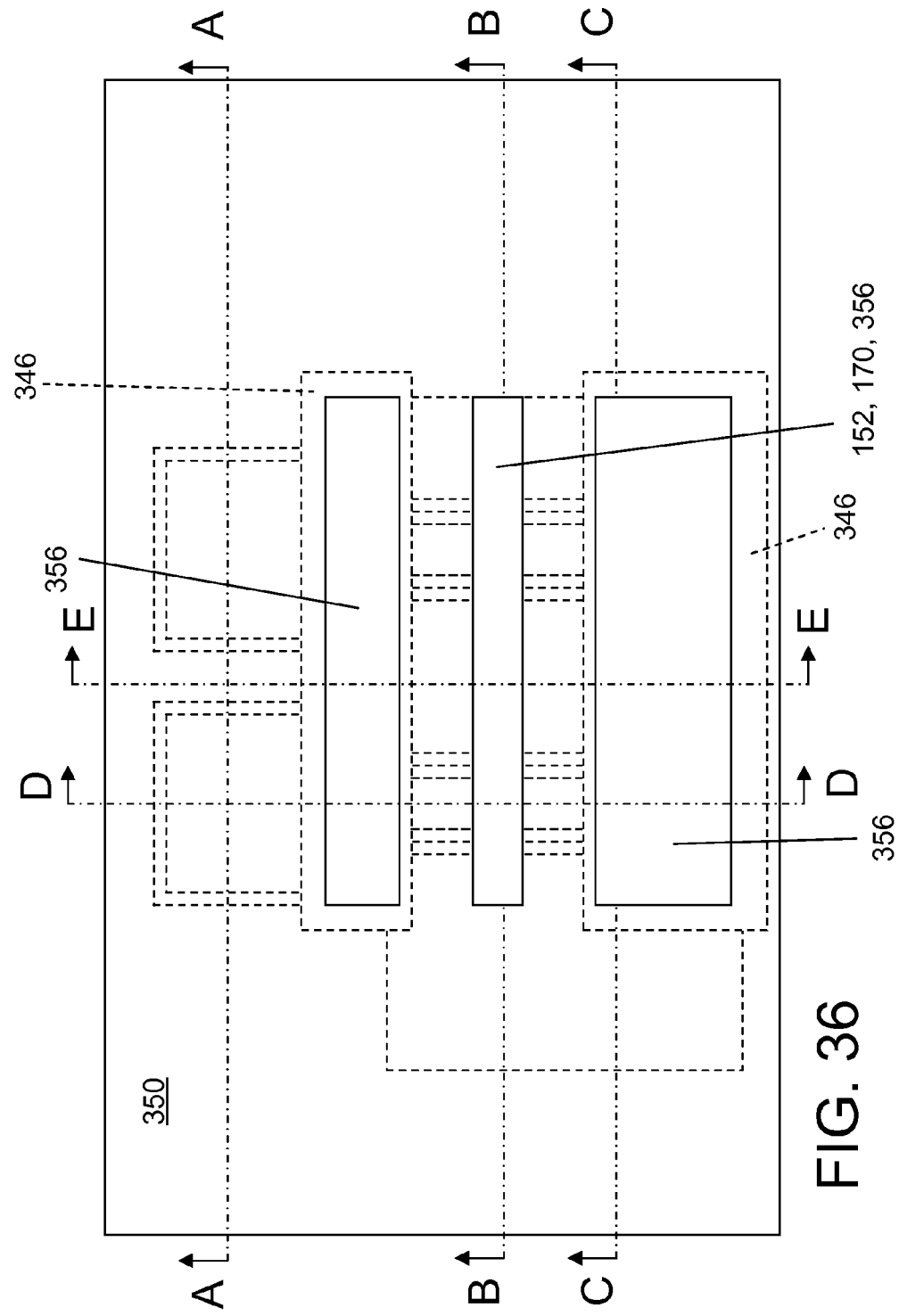
Figure 36B:
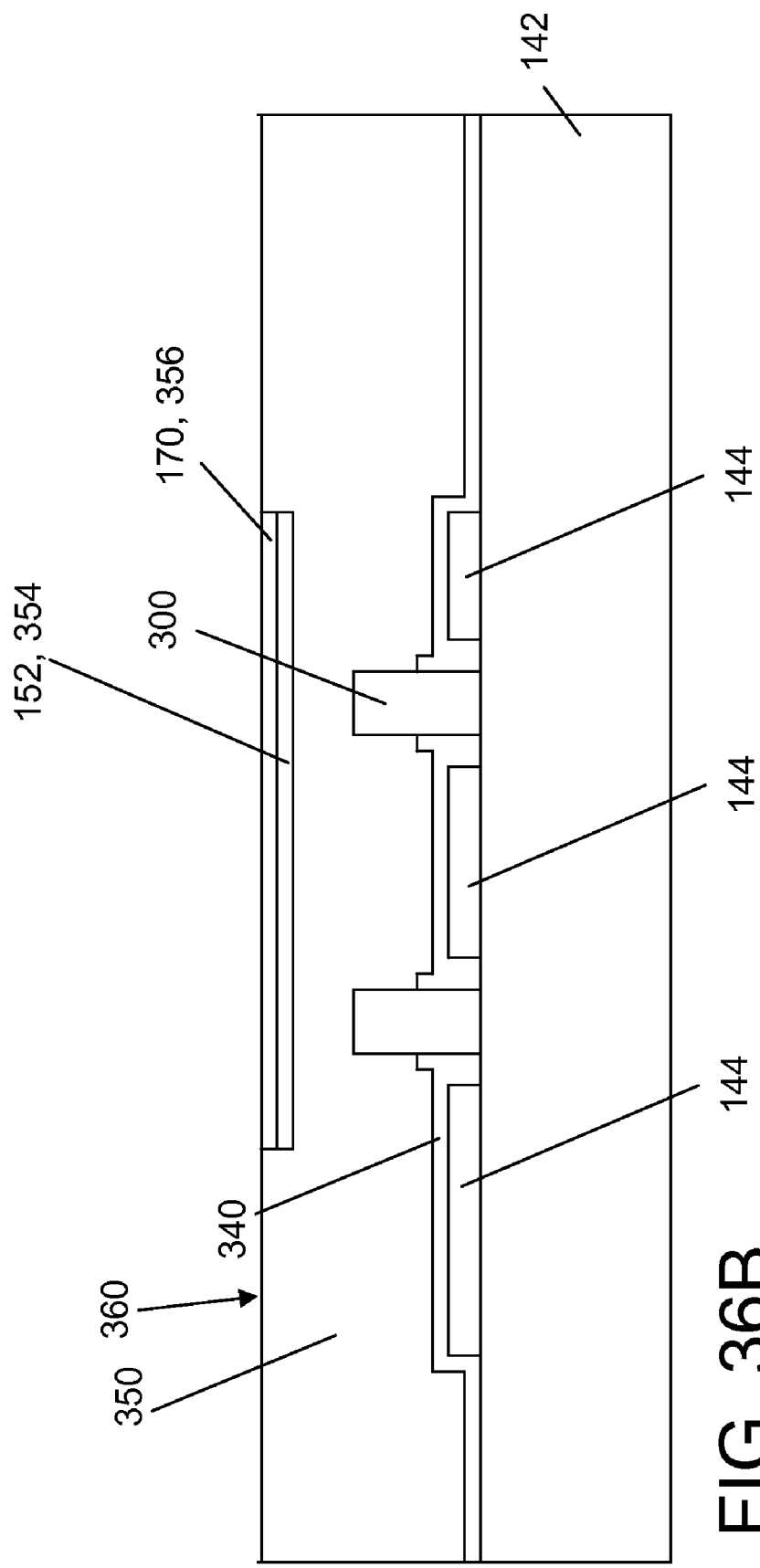
Figure 36C:
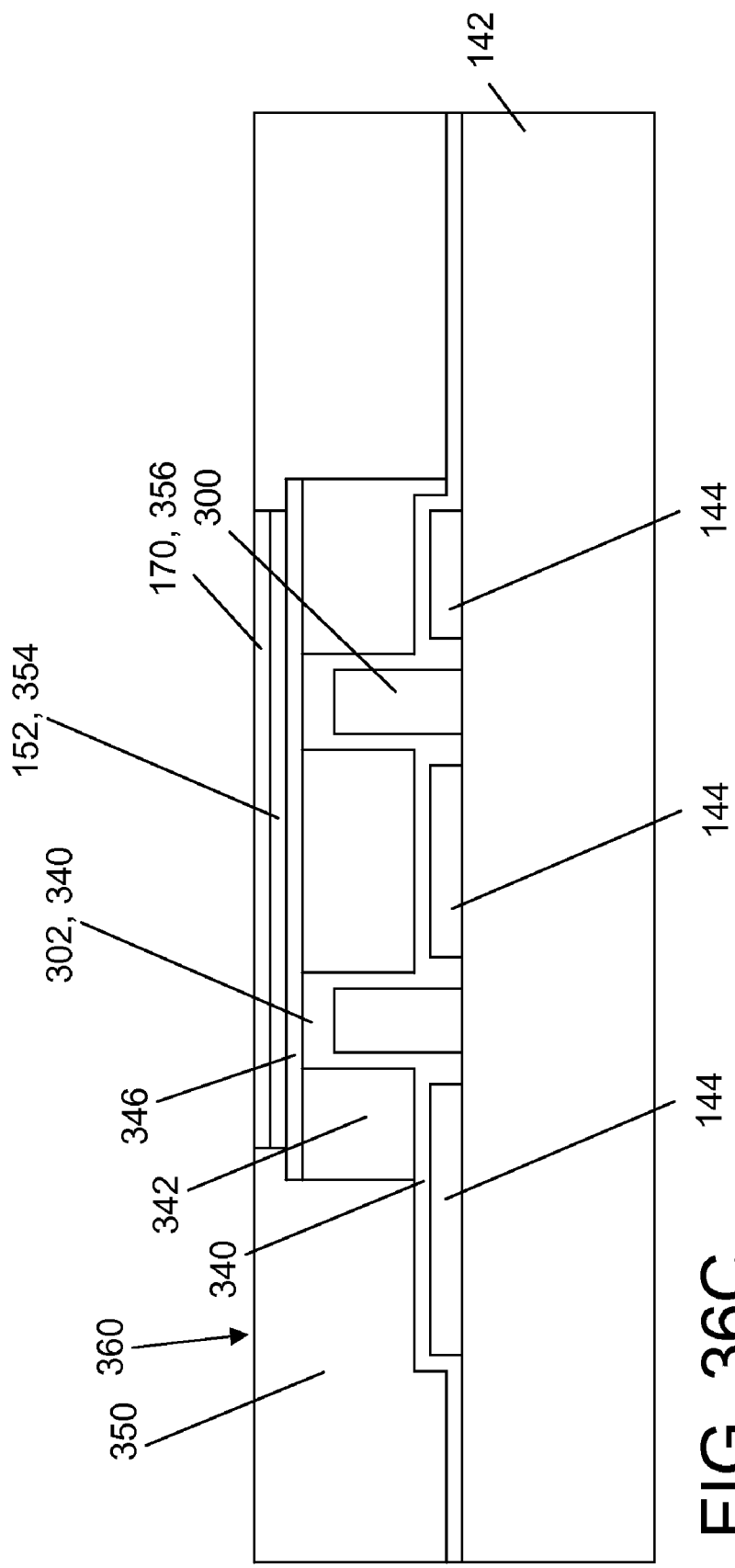
Figure 36D:
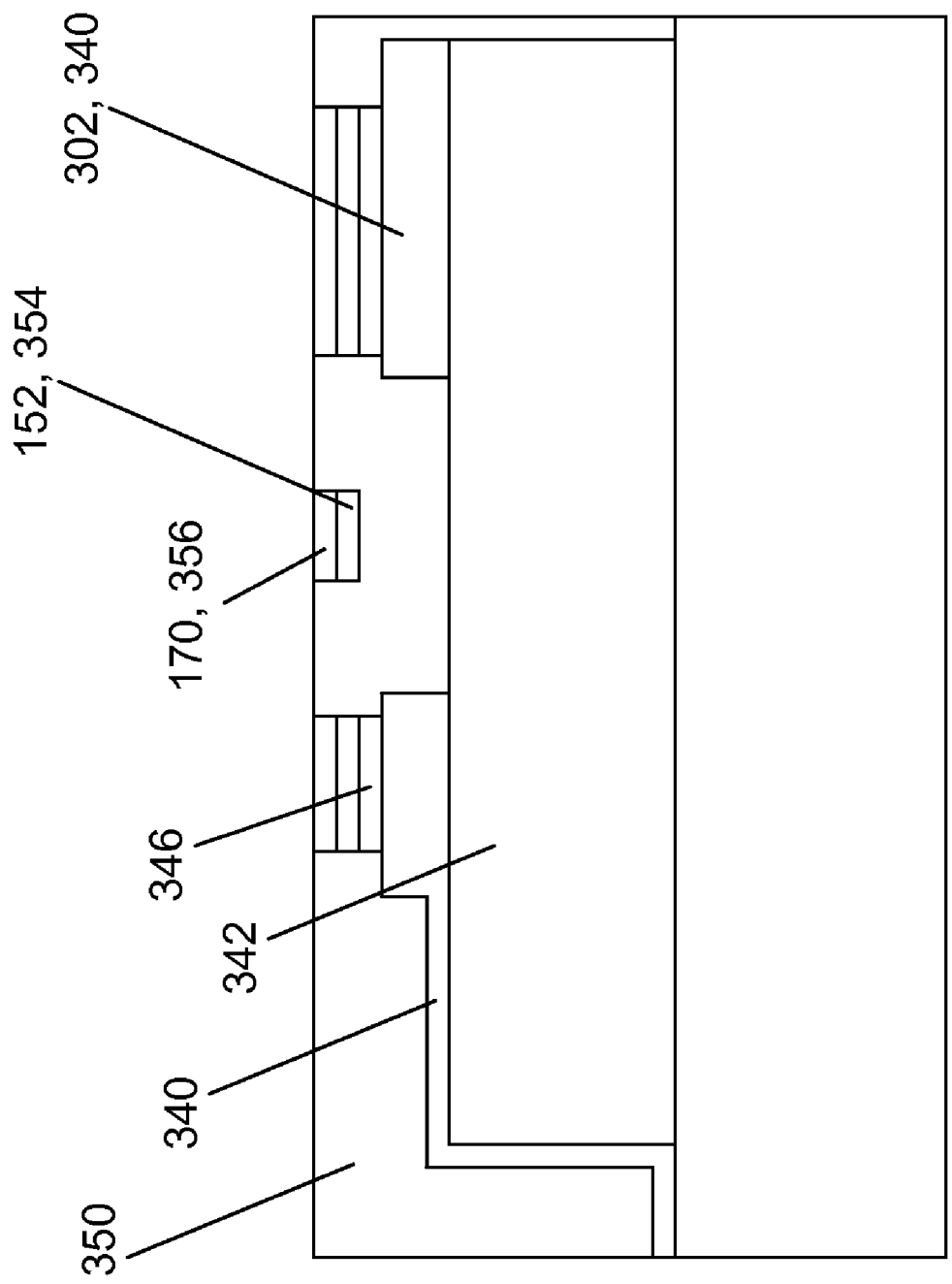
Figure 36E:
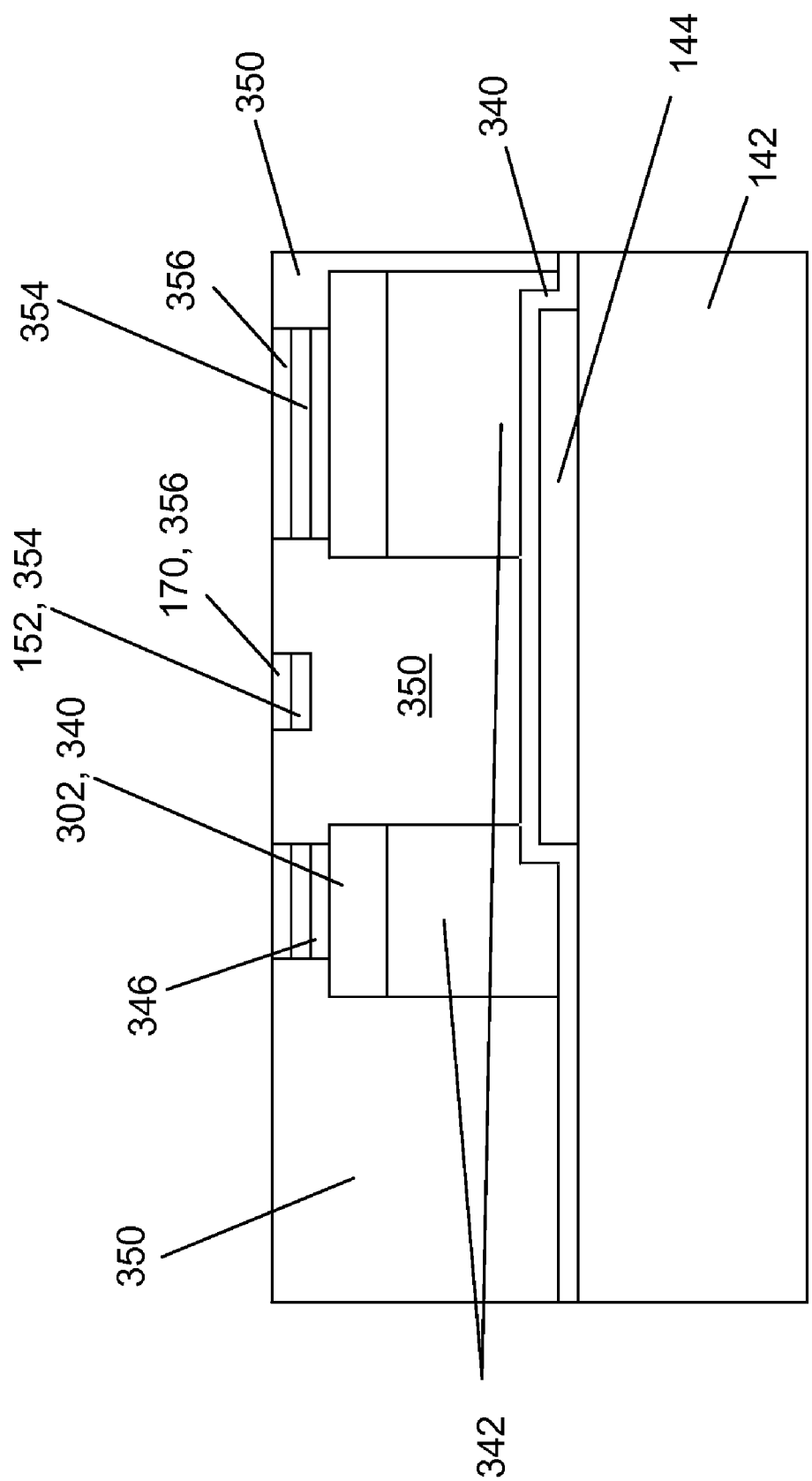

FIGS. 33-33C show depositing a sixth insulator layer 350, e.g., aluminum oxide ($Al_2O_3$) and planarizing (CMP), as best shown in FIG. 33C, to fifth insulator layer 346. FIGS. 34-34C show depositing a third metal layer 354 and depositing a seventh insulator layer 356, e.g., silicon nitride (Si3N4). Third metal layer 354 may include titanium (Ti) having a thickness of, for example, approximately 2-5 nm. FIGS. 34-34C also show patterning a photoresist 358 to cover regions desired to include elongated channel member 152 (FIG. 35B). Photoresist 358 covers a junction between narrow portion 318 and wider portion 316 of T-shaped pedestals 310, 312, a small mid-portion of narrow portions 318, and ends of narrow portions 318. FIGS. 35-35C show removing seventh insulator layer 356 and third metal layer 354 to sixth insulator layer 350 to form elongated channel member 152 (FIG. 35B) and insulator member 170. FIGS. 36-36E show the structure after removing photoresist 358 (FIG. 35).

Figure 37:
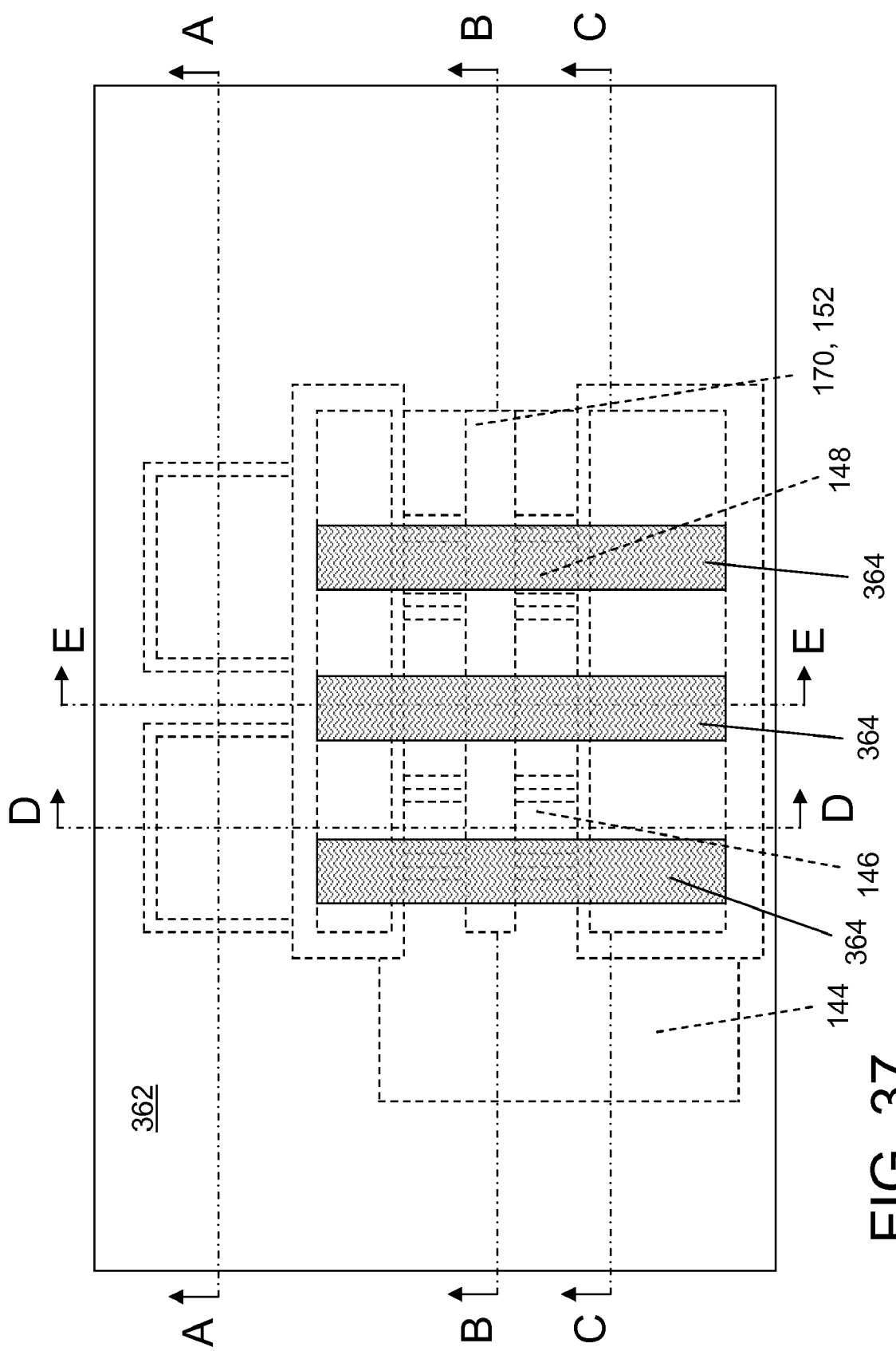
Figure 37B:
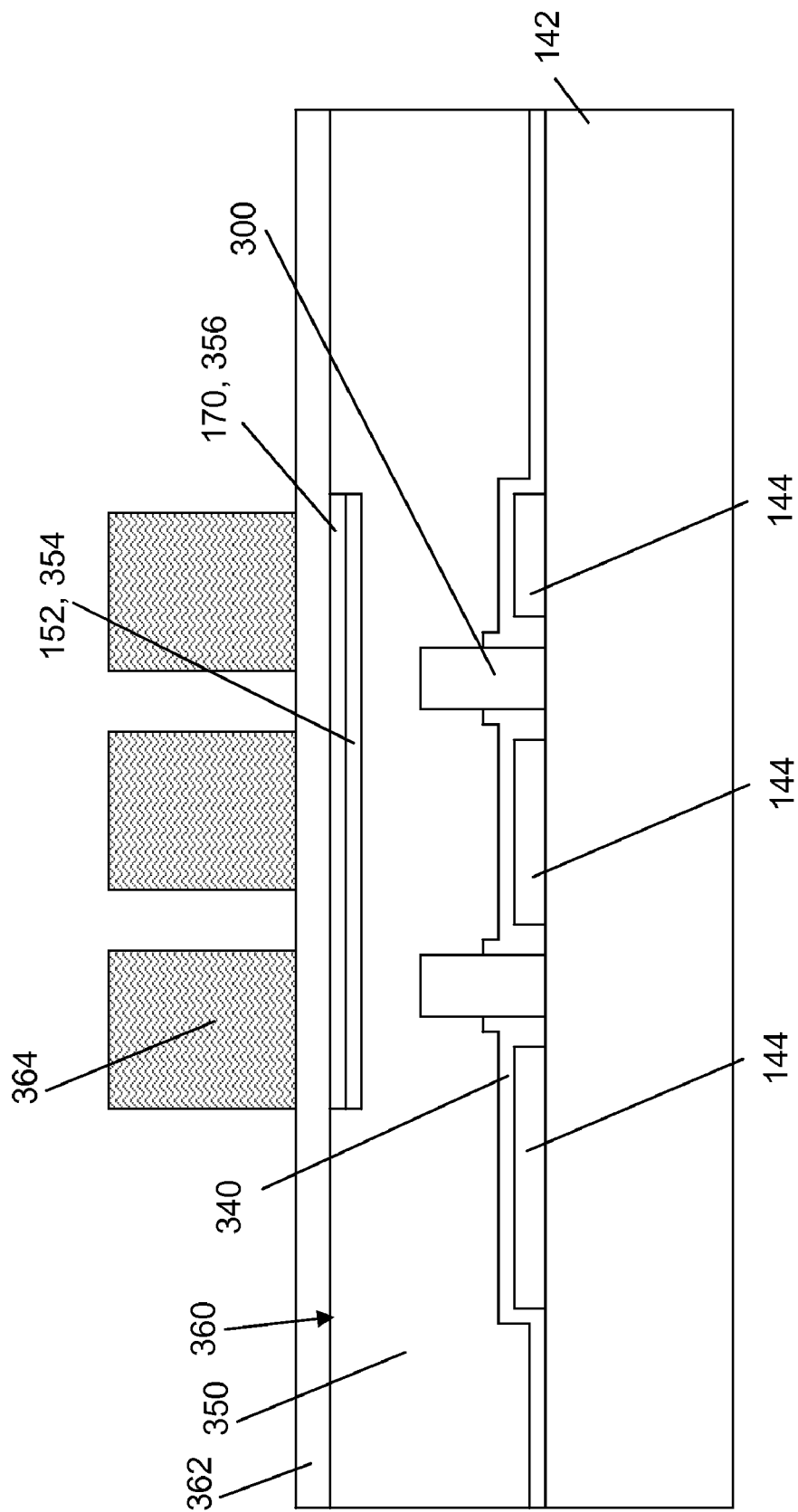
Figure 37C:
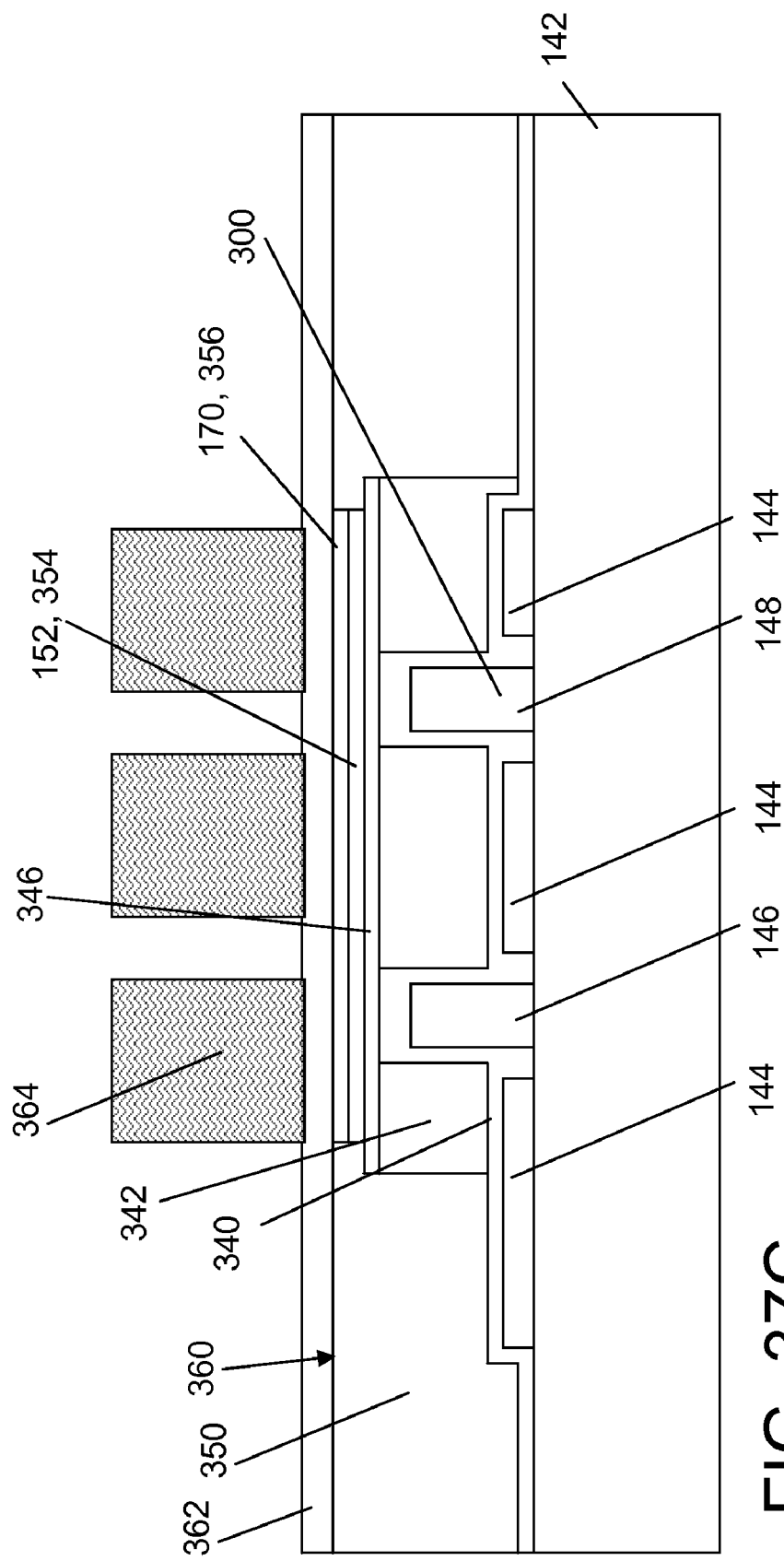
Figure 37D:
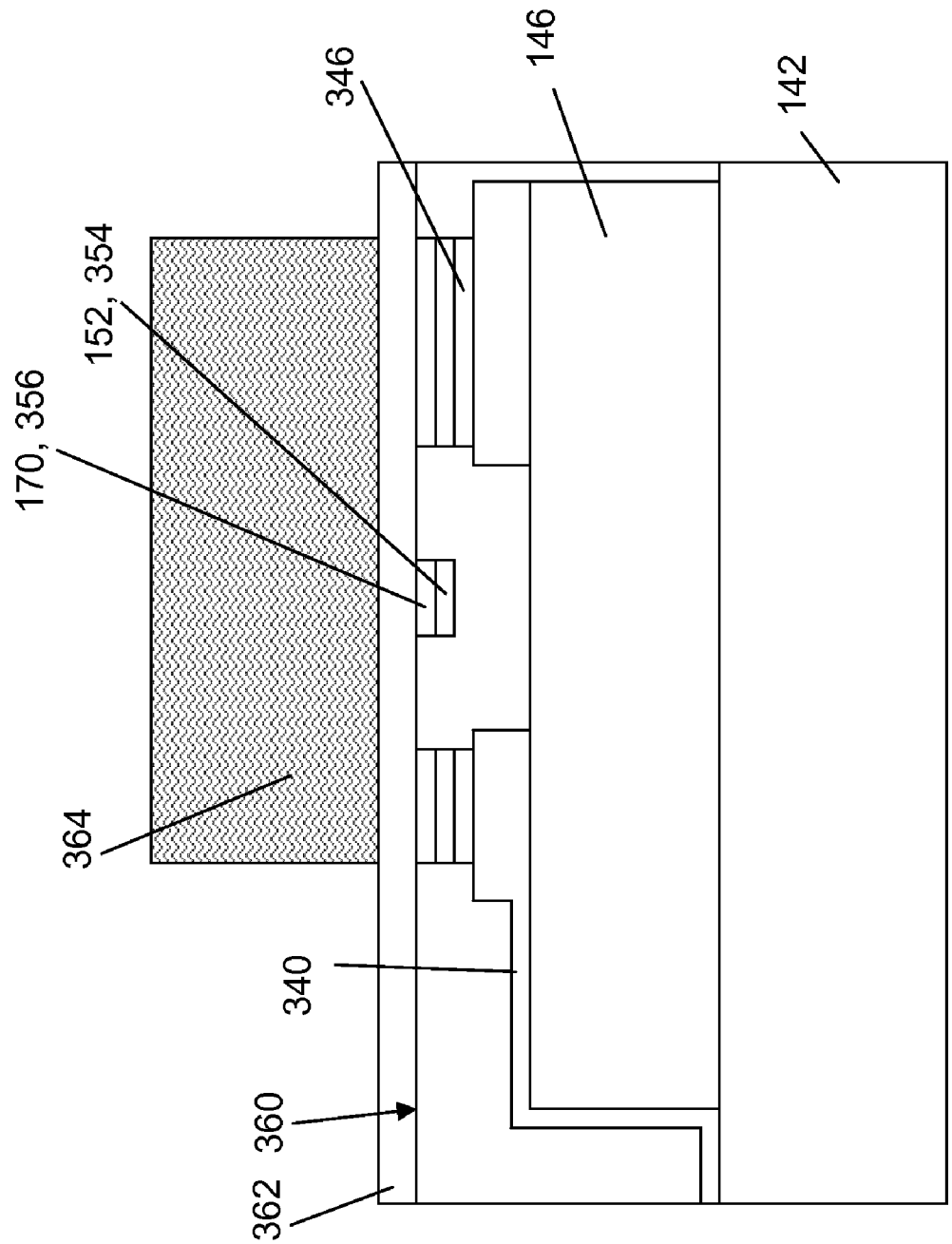
Figure 37E:
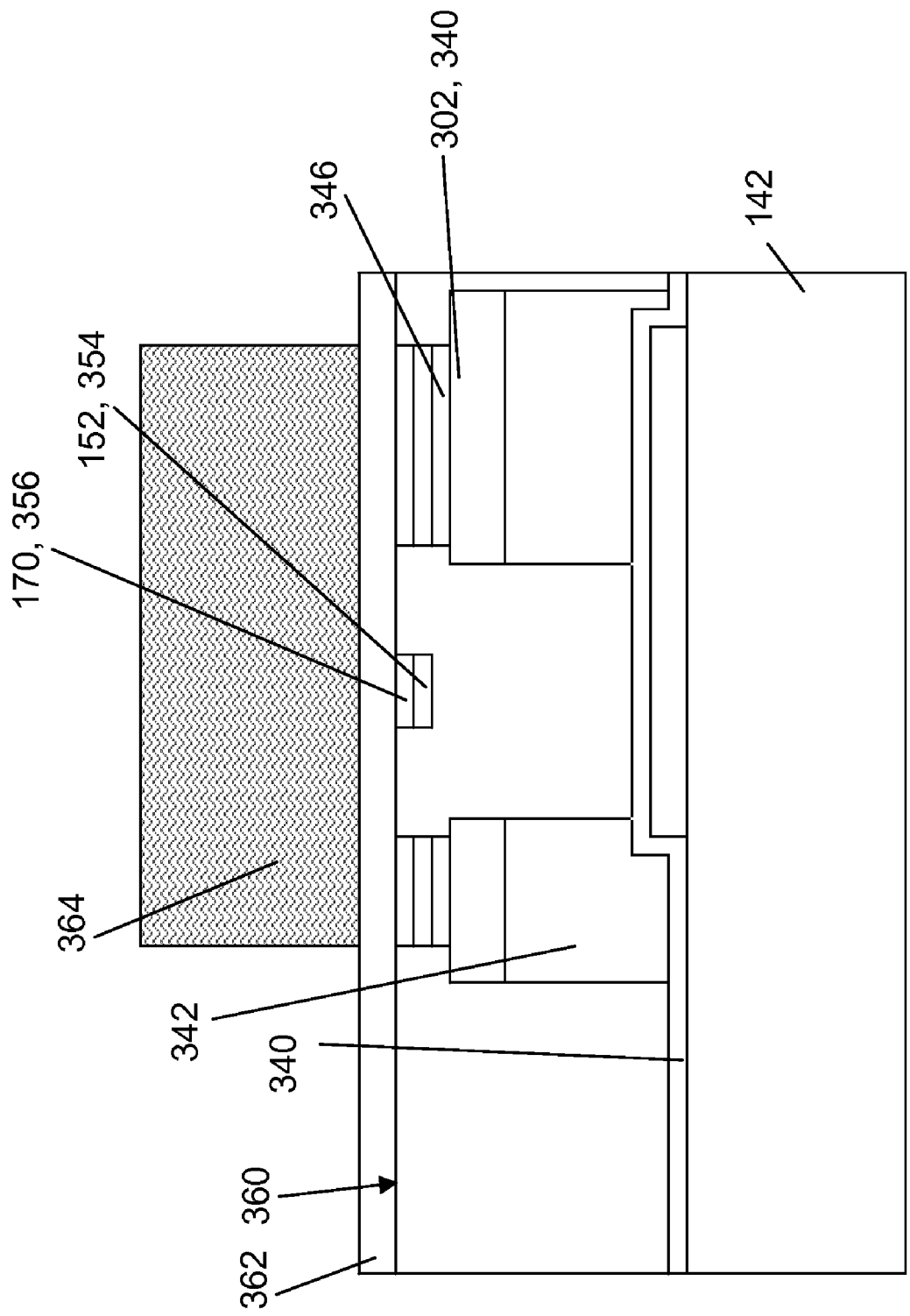

FIGS. 36-38E show forming a plurality of nanotube elements 162 (FIG. 38E) coupled to elongated channel member 152 such that insulator member 170 electrically insulates plurality of nanotube elements 162 from elongated channel member 152. FIGS. 36-36E, in addition to showing completion of elongated channel member 152 and insulator member 170, also show, as best understood by comparing FIGS. 35B-C and FIGS. 36B-C, forming a sacrificial nanotube layer support 360 (FIGS. 36B-C). Sacrificial nanotube layer support 360 may be formed, for example, by depositing aluminum oxide ($Al_2O_3$) and planarizing (CMP) stopping on seventh insulator layer 356 (insulator member 170 (FIG. 36B)). FIGS. 37-37E show growing a carbon nanotube layer 362. Carbon nanotube layer 362 may be formed using any now known or later developed technique.

FIGS. 37-37E also show forming plurality of nanotube elements 162 (FIGS. 38A-E) from carbon nanotube layer 362 (FIGS. 38A-E). In particular, FIGS. 37-37E show patterning a photoresist 364 for carbon nanotube elements 162. Photoresist 364 covers carbon nanotube layer 362 where carbon nanotube elements 162 are desired. Carbon nanotube layer 362 not covered by photoresist 364 is removed, for example, by an isotropic ashing in an oxygen (02) plasma. Photoresist 364 is then removed using any appropriate removal process.

Figure 38:
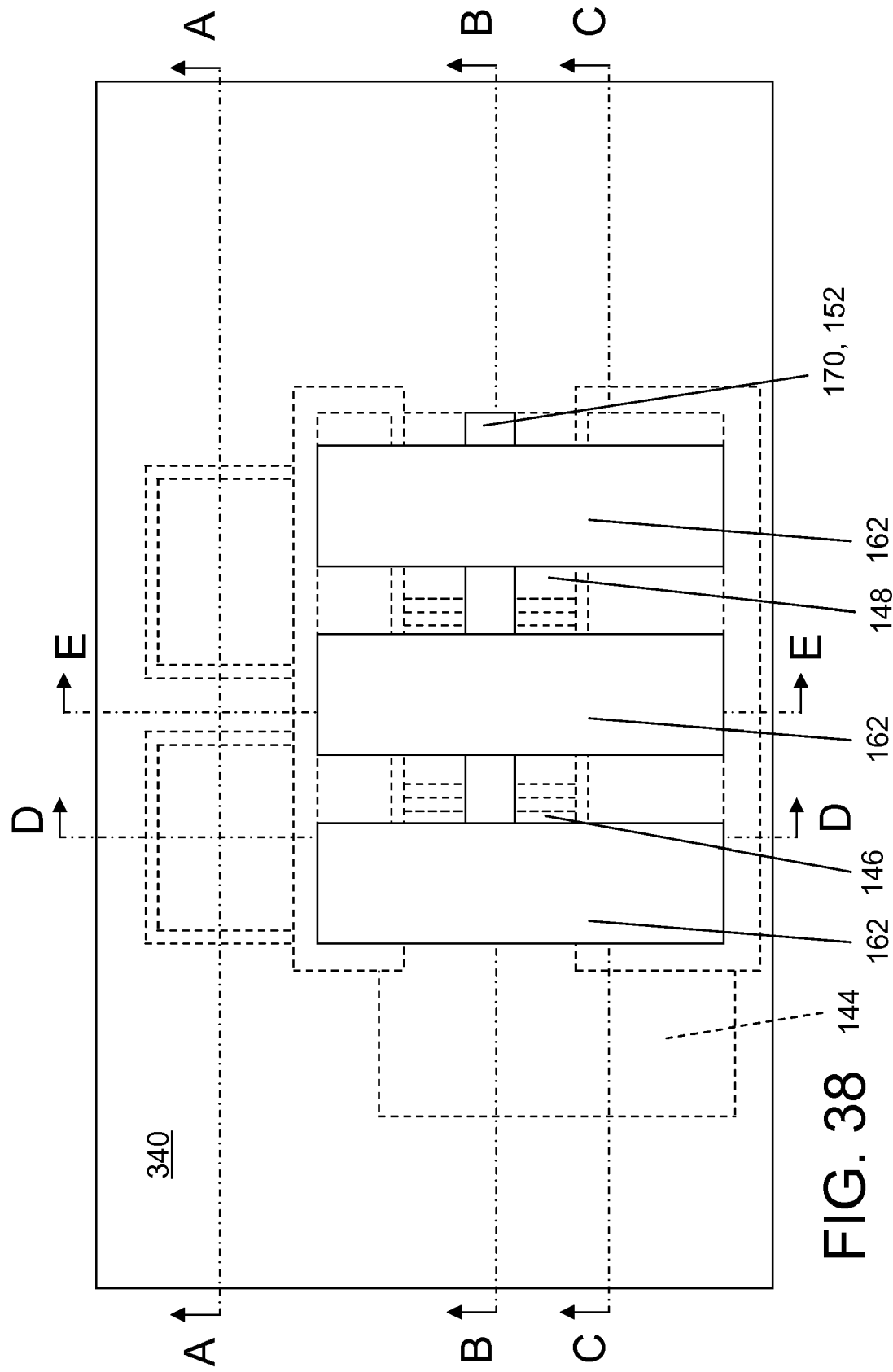
Figure 38B:
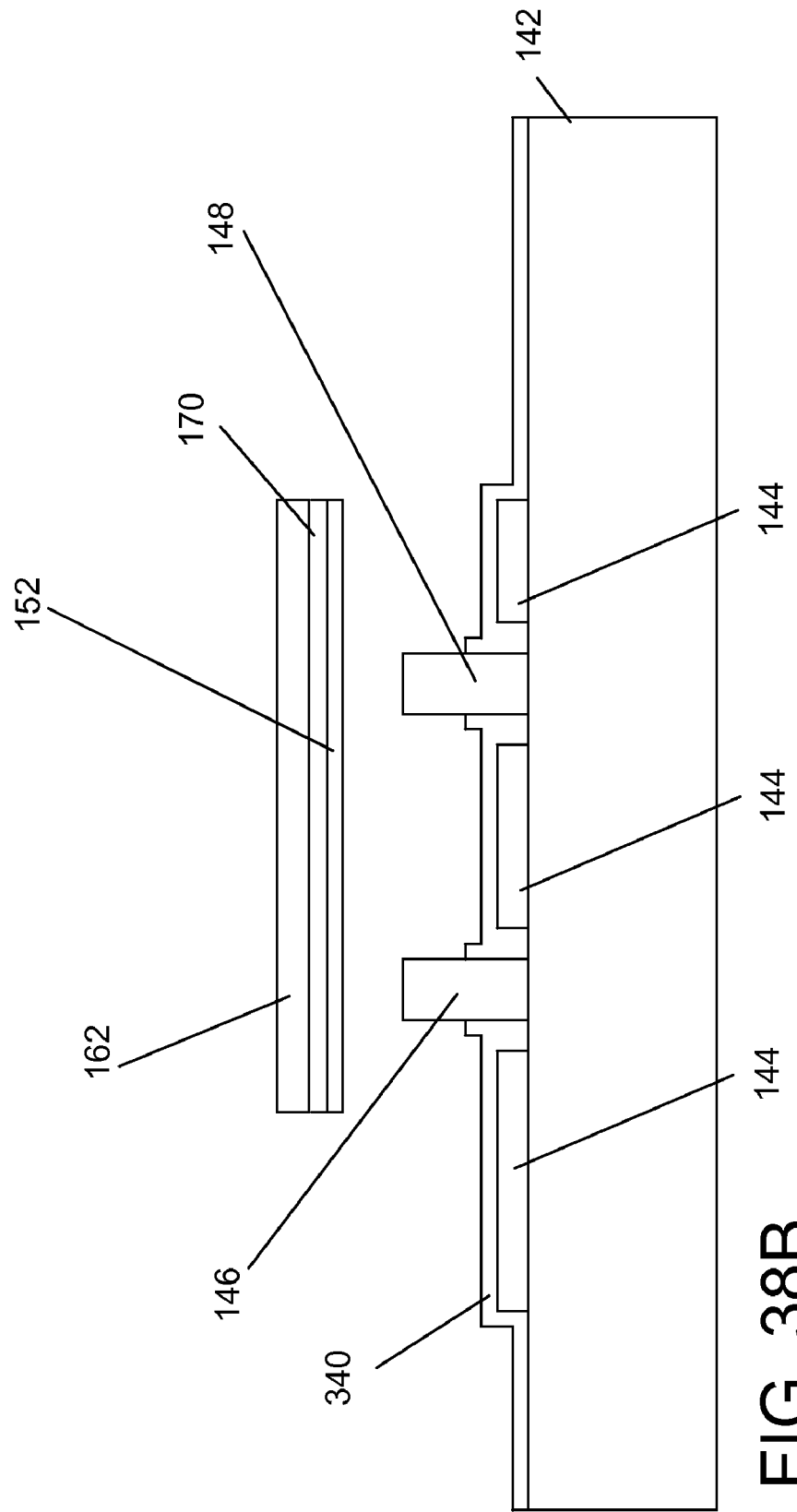
Figure 38C:
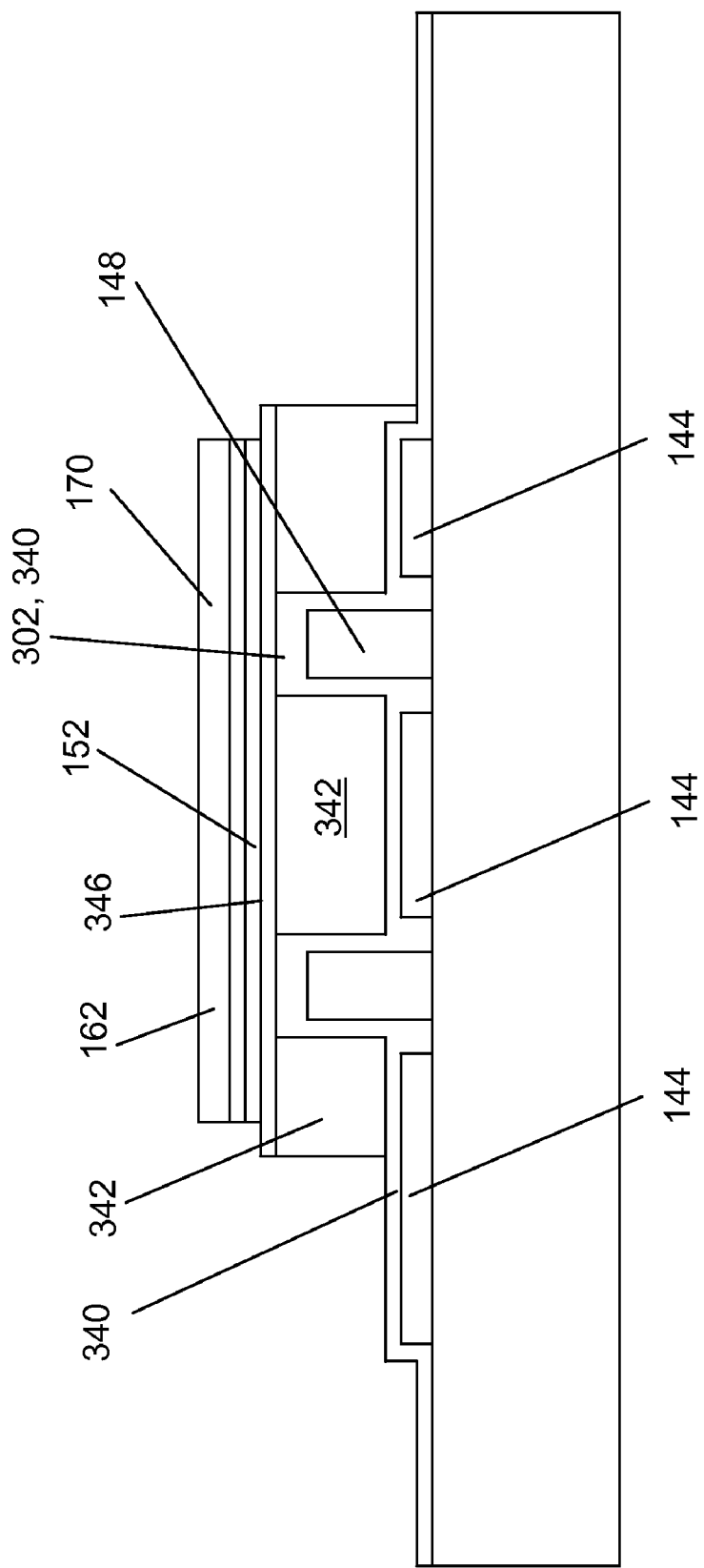
Figure 38D:
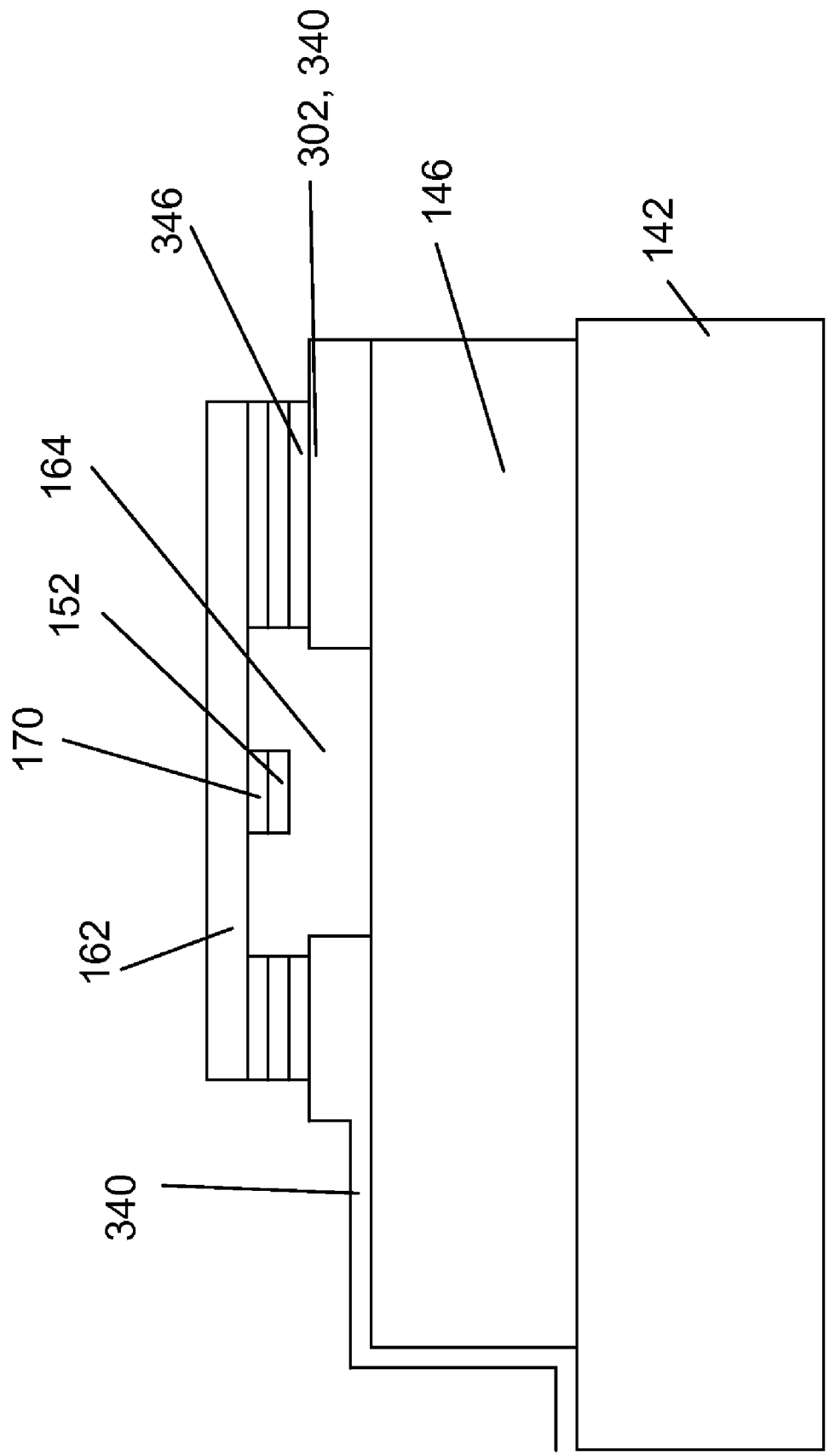
Figure 38E:
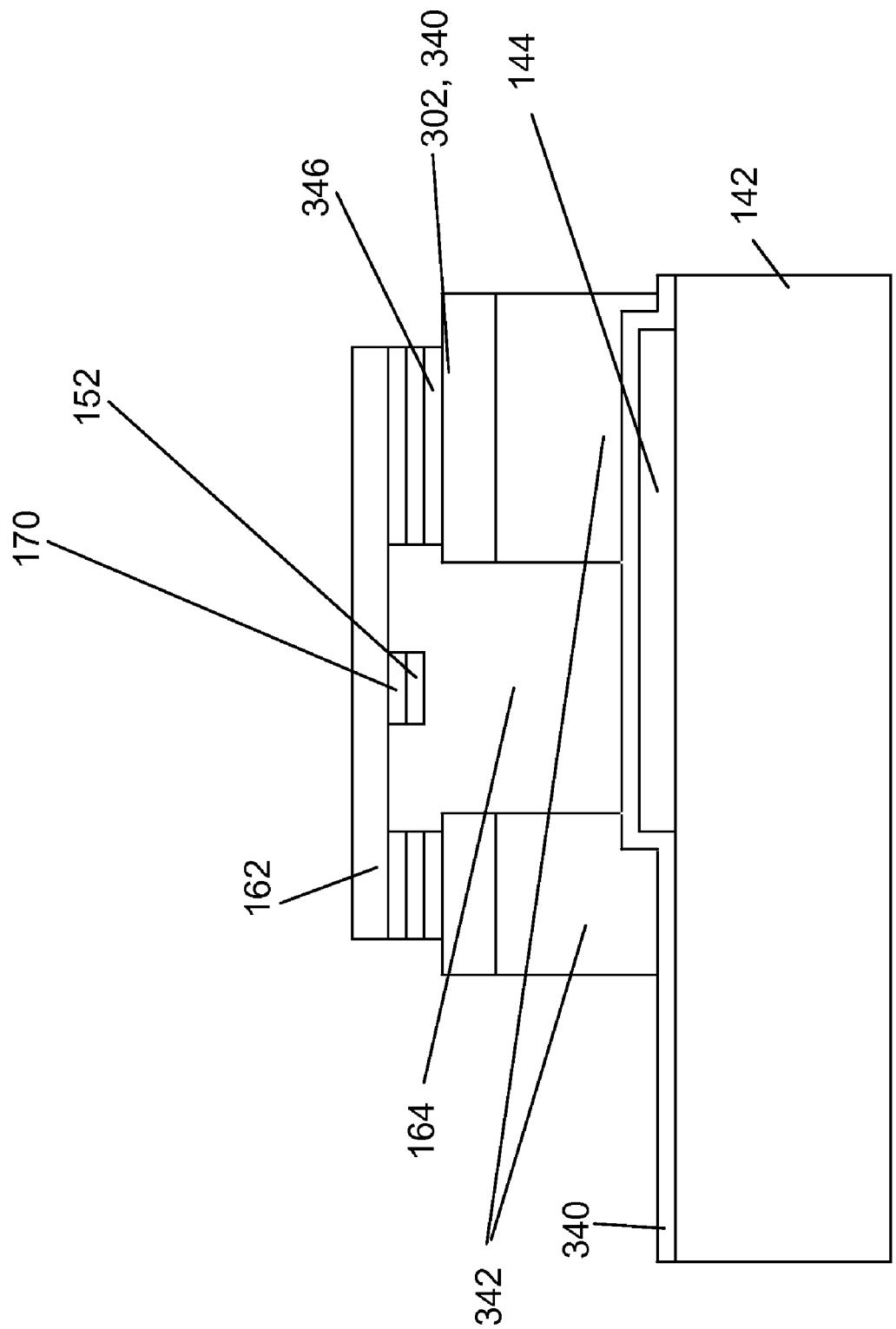

FIGS. 38-38E show removing sacrificial nanotube layer support 360 (FIG. 37D), e.g., aluminum oxide ($Al_2O_3$), to form opening 164 (or void) between source region 146 and drain region 148 and elongated channel member 162. In one embodiment, this process may include etching using tetramethyl ammonium hydroxide (TMAH). Further etching to refine the shapes of source region 146, drain region 148, elongated channel member 162, etc., may also be carried out using any appropriate etching process.

Figure 39B:
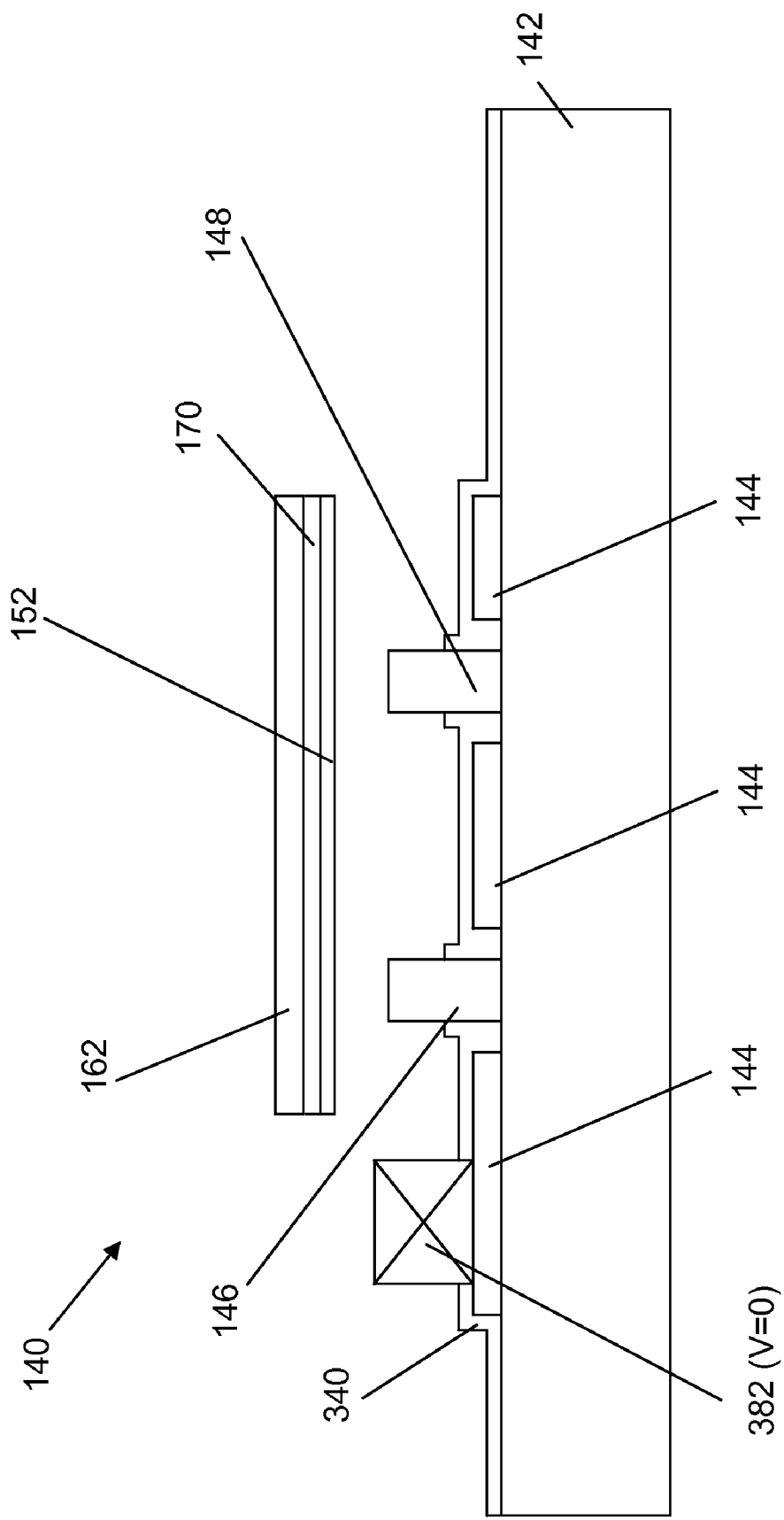
Figure 39C:
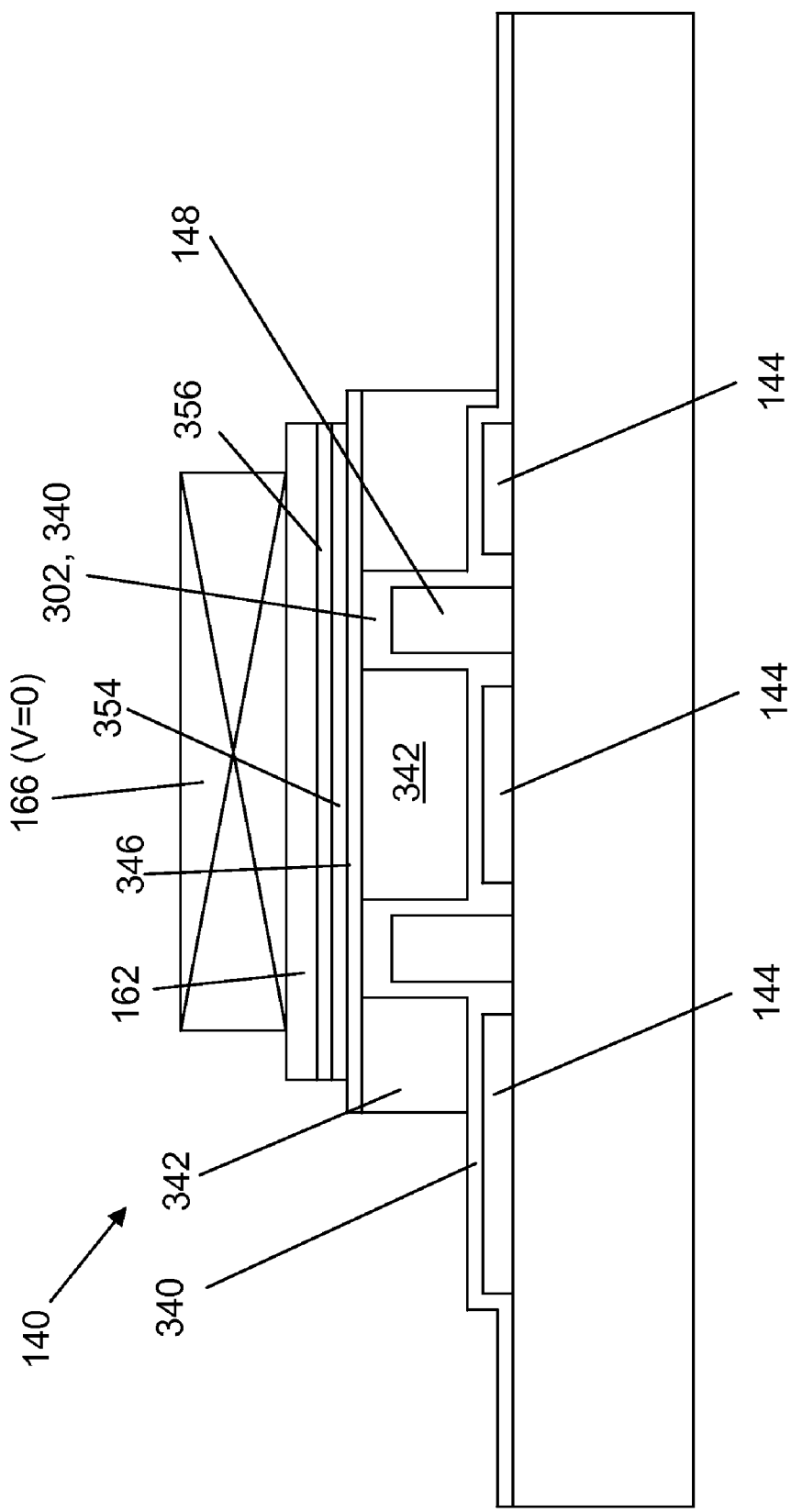
Figure 39D:
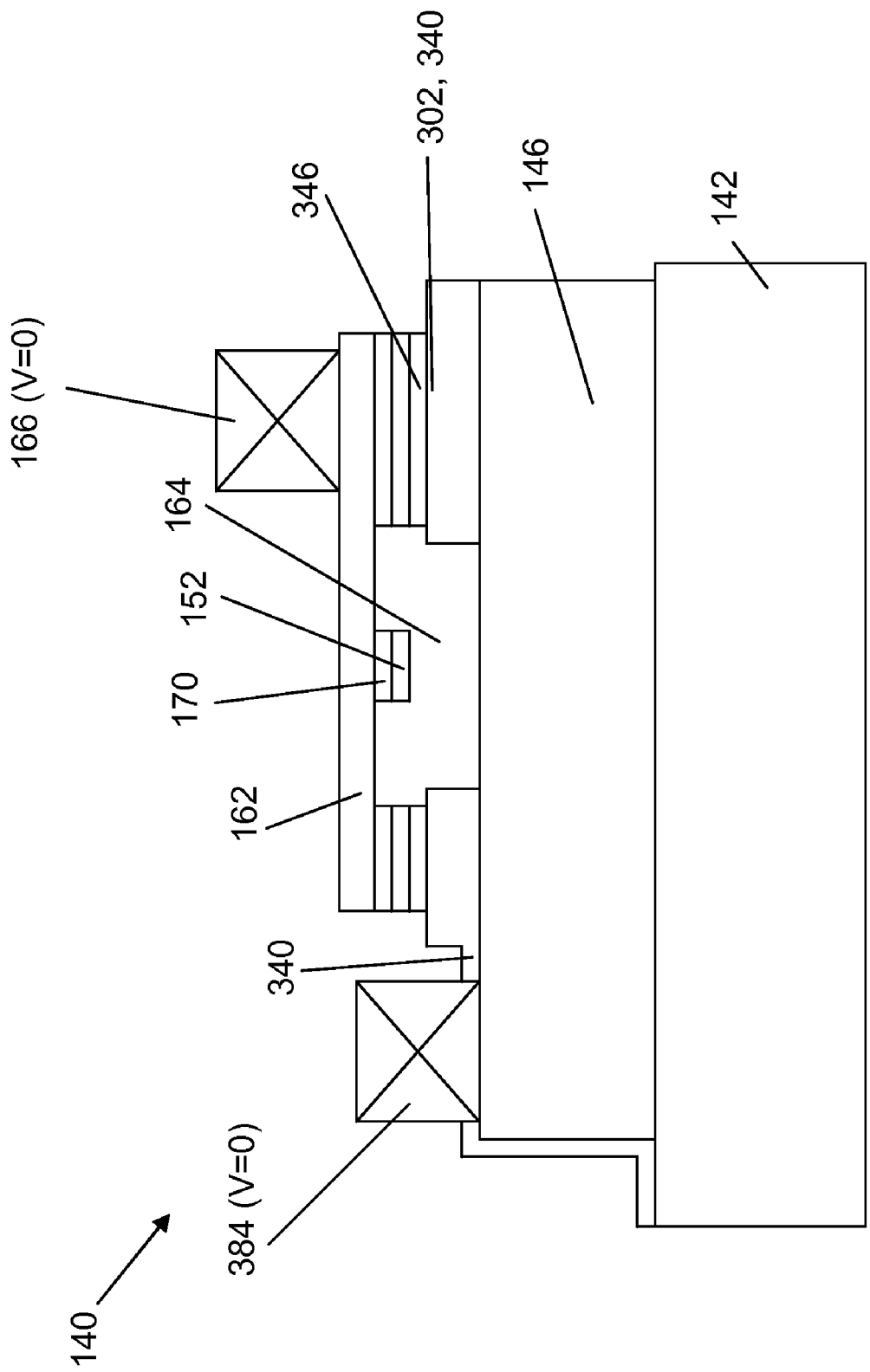
Figure 39E:
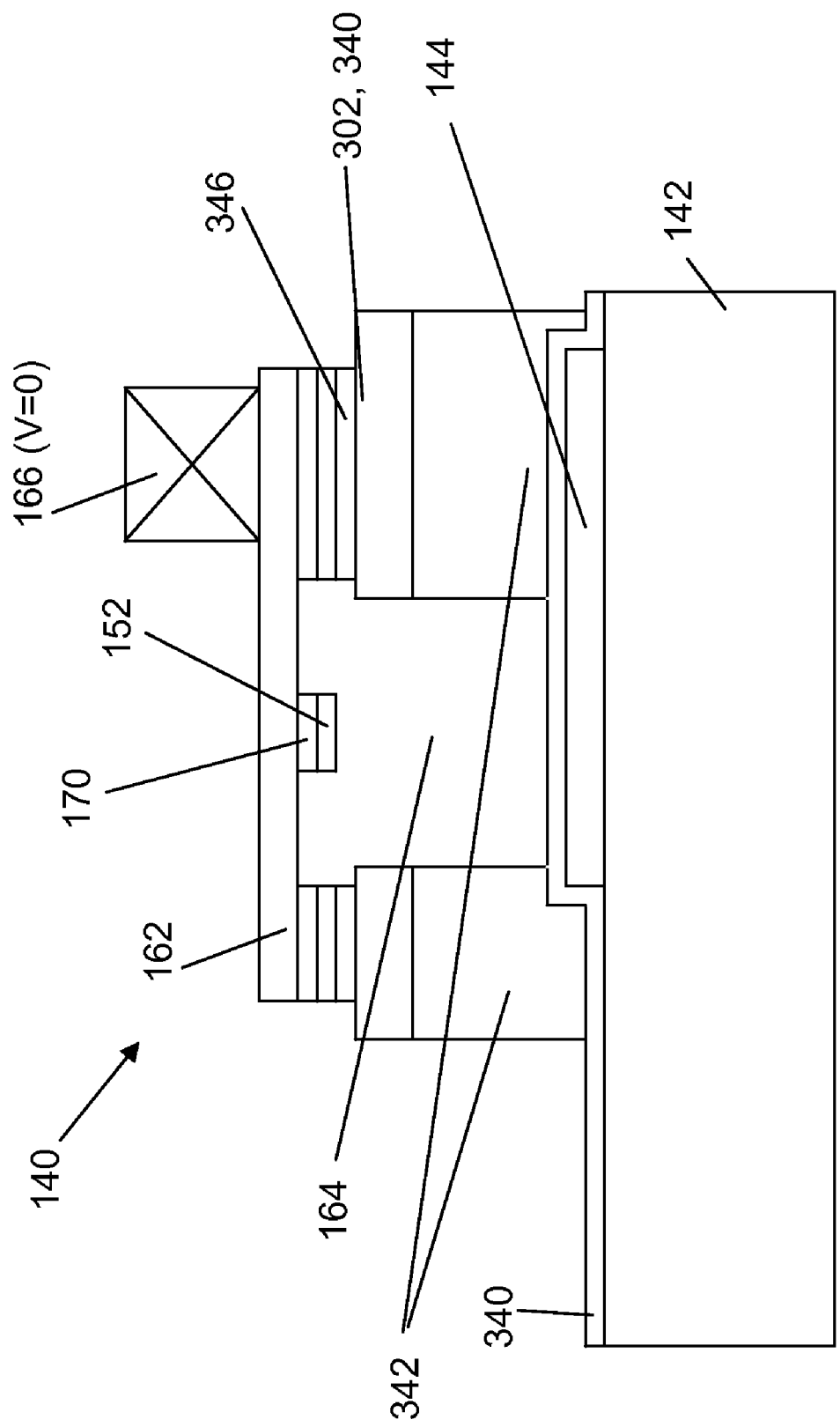

FIGS. 39-39E show an optional step of forming a nanotube contact 166 for electrically connecting each of nanotube elements 162. Nanotube contact 166 may be formed by depositing a metal, such as titanium, and patterning the contact, or may be made by damascene processing. A contact 382 to gate 144, a contact 384 to source region 146 via wider portion 316 and a contact 386 to drain region 148 via wider portion 316 are also shown. Contacts 382, 384, 386 may be formed using any now known or later developed process.

Figure 40:
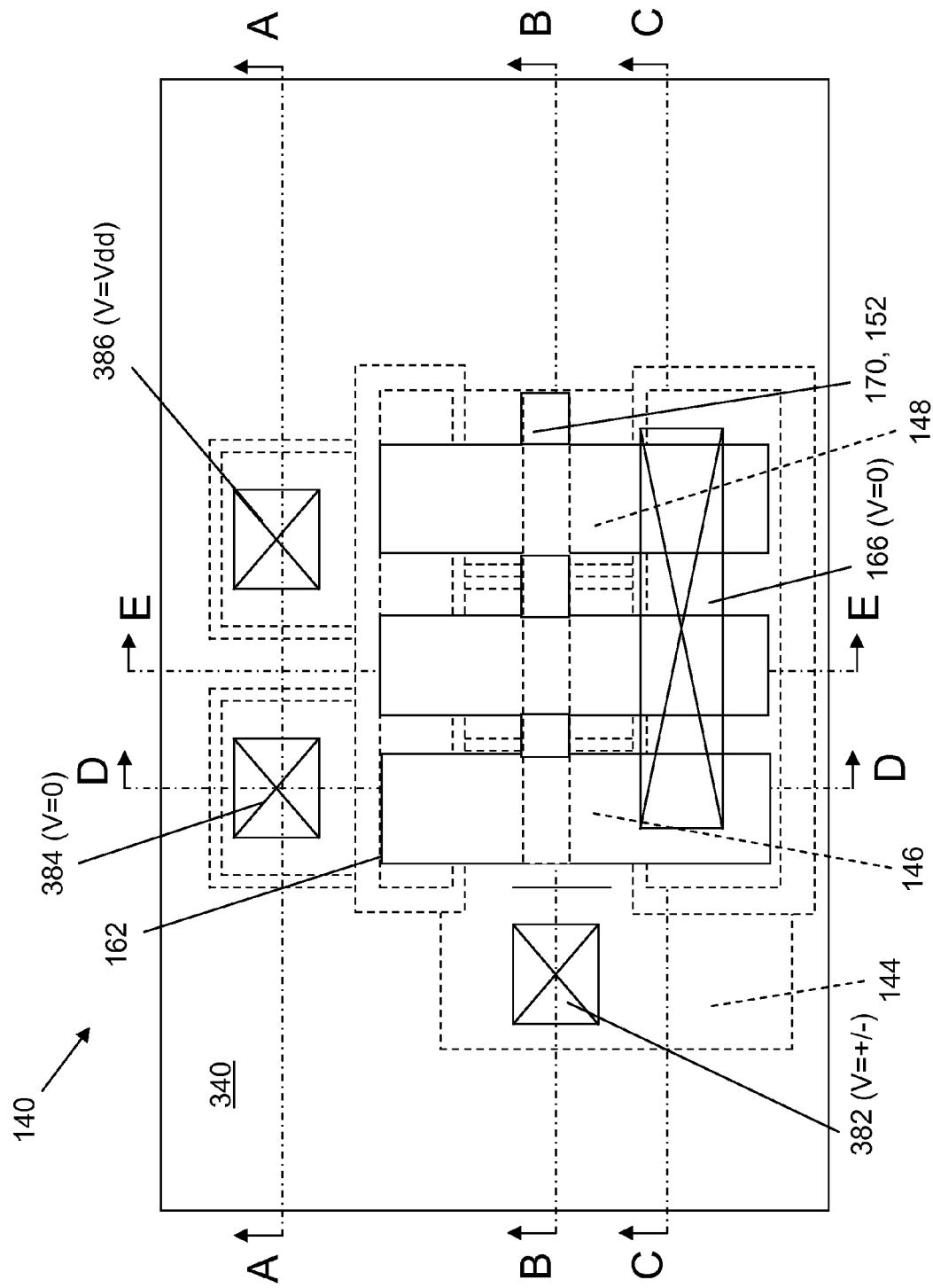
Figure 40B:
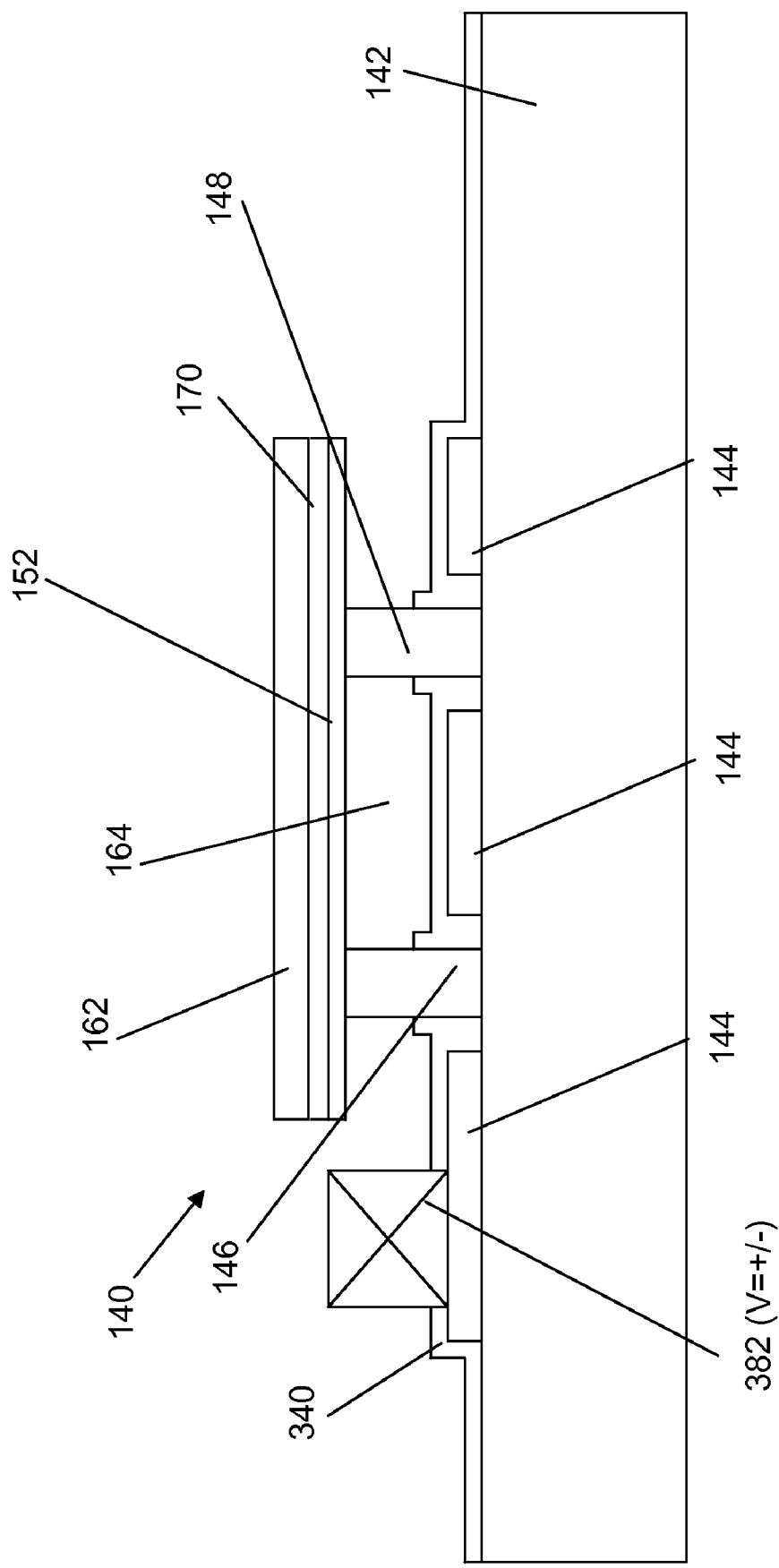
Figure 40C:
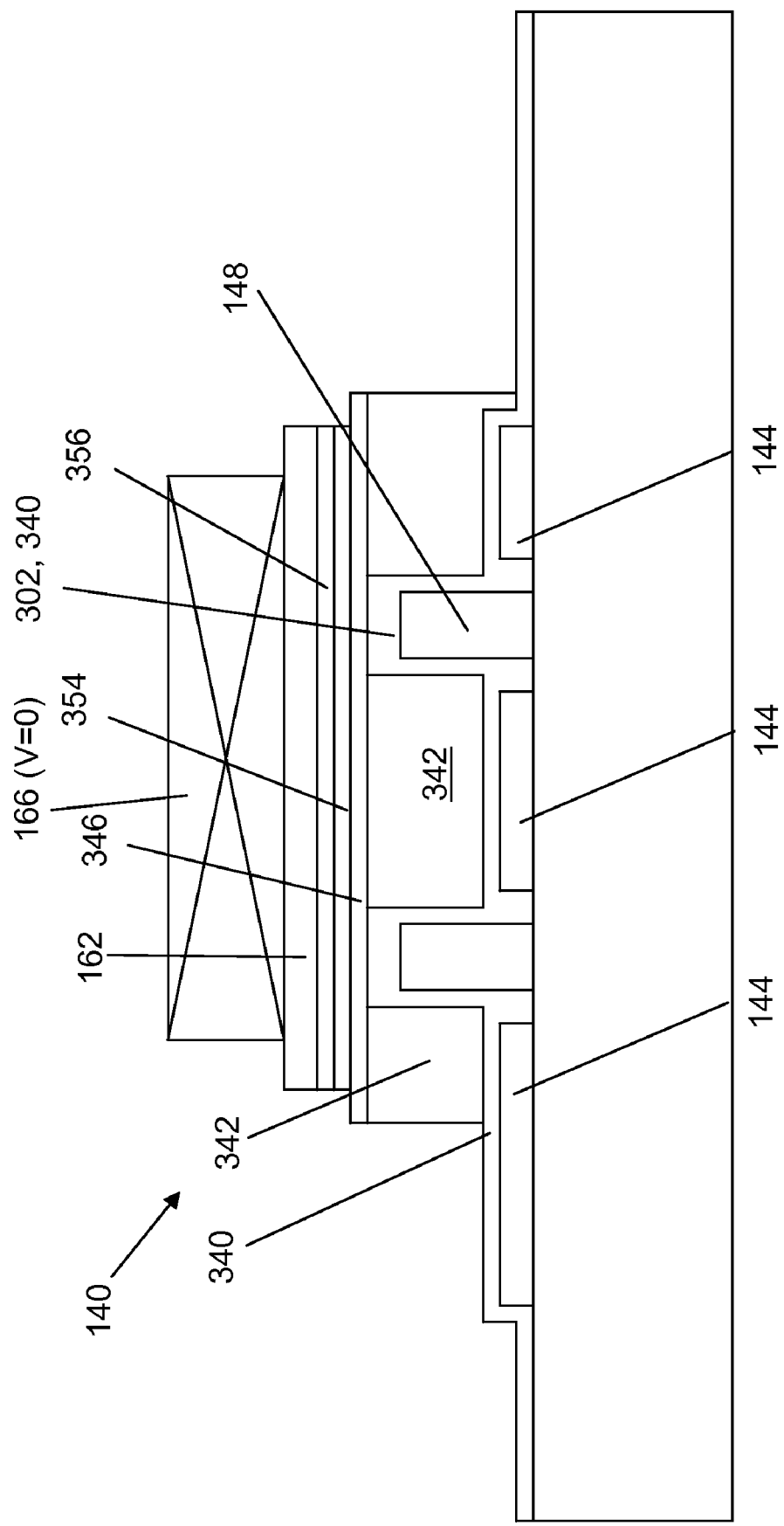
Figure 40D:
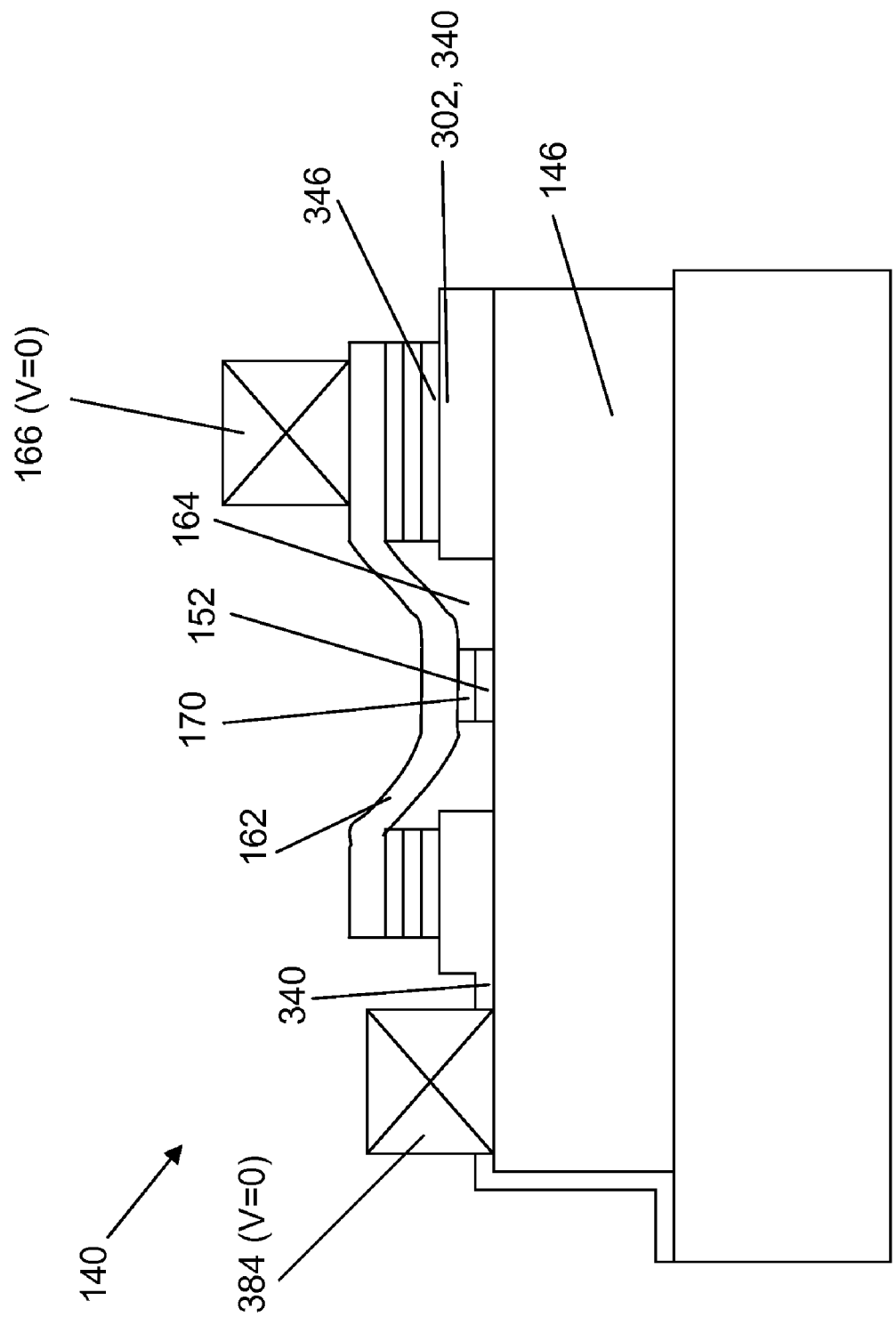
Figure 40E:
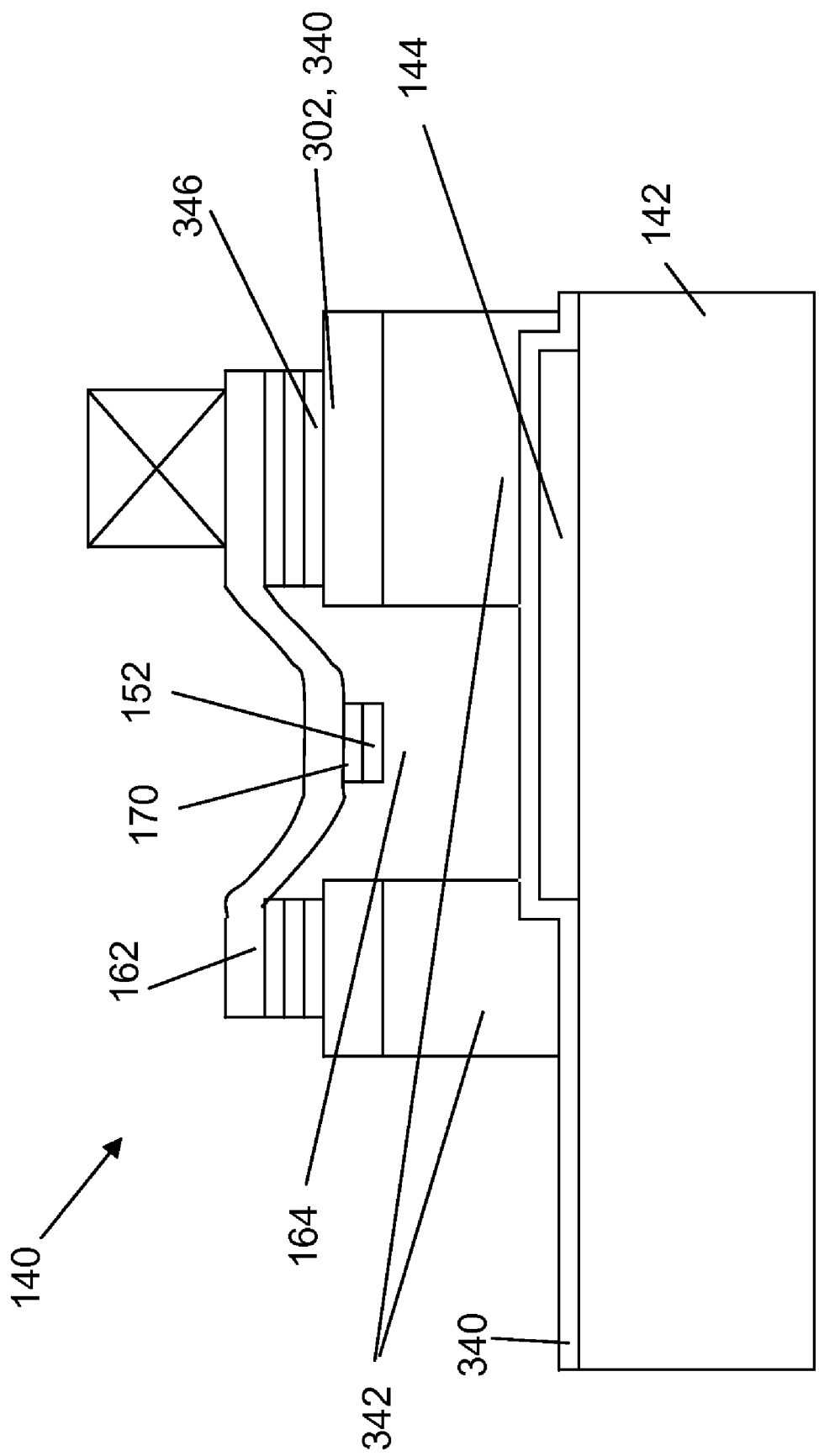

FIGS. 39-39E show NEMT 140 in an off or off state and FIGS. 40-40E show NEMT 140 in an on or on state. In response to an electrical potential applied to gate 144 and nanotube elements 162, nanotube elements 162 are electromechanically deflectable (as shown in FIGS. 40D-E) between the off state and the on state. The on state places elongated channel member 162 in electrical connection with source region 146 and drain region 148 to form a current path.

It is understood that the methods described herein of forming NEMT 100,140 are only illustrative and other methods may also be implemented to arrive at the same structure. In addition, processes may be omitted, combined or the order thereof switched within the scope of the disclosure.

The NEMTs 100, 140 and methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

As used herein, the terms "a", "an" and "the" may refer to one or more than one of an item. The terms "and" and "or" may be used in the conjunctive or disjunctive and will generally be understood to be equivalent to "and/or".

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A nanoelectromechanical transistor (NEMT) comprising:
   an insulative substrate including a gate adjacent thereto, and a source region and a drain region separated from the gate by an insulator;
   an electromechanically deflectable nanotube member; and
   a channel member electrically insulatively coupled to the nanotube member so as to be aligned with the source region and the drain region,
   wherein electromechanical deflection of the nanotube member is controllable, in response to an electrical potential applied to the gate and the nanotube member, between an off state and an on state, the on state placing the channel member in electrical connection with the source region and the drain region to form a current path.

2. The NEMT of claim 1, wherein the channel member is electrically insulatively coupled to the nanotube member by an insulator member.

3. The NEMT of claim 2, wherein the insulator member includes silicon nitride.

4. The NEMT of claim 1, wherein the channel member, the source region and the drain region each include a metal.

5. The NEMT of claim 1, wherein the source region and the drain region are positioned adjacent to a pedestal area in a central region over the gate, and a capacitor region is formed on an opposite side of the source and drain region from the pedestal area.

6. The NEMT of claim 1, wherein the channel member is self-aligned to the source region and the drain region collectively.

7. The NEMT of claim 1, wherein the source region and the drain region are distanced from a central region over the gate, a capacitor region formed in between the source and drain region.

8. The NEMT of claim 1, wherein the nanotube member includes a plurality of nanotube elements extending across an opening in which the source region and the drain region are positioned within the substrate.

9. The NEMT of claim 8, wherein the channel member includes an elongated conductive element electrically insulatively coupled to each of the plurality of nanotube elements.

10. The NEMT of claim 8, further comprising a nanotube contact electrically connecting each of the plurality of nanotube elements.

11. A nanoelectromechanical transistor (NEMT) comprising:
    a substrate including a gate adjacent thereto, a metal source region and a metal drain region;
    an electromechanically deflectable nanotube member; and
    a metal channel member coupled to the nanotube member so as to be aligned with the metal source region and the metal drain region,
    wherein electromechanical deflection of the nanotube member is controllable, in response to an electrical potential applied to the gate and the nanotube member, between an off state and an on state, the on state placing the metal channel member in electrical connection with the metal source region and the metal drain region to form a current path.

12. The NEMT of claim 11, wherein the channel member is electrically insulatively coupled to the nanotube member by an insulator member.

13. The NEMT of claim 11, wherein the source region and the drain region are positioned adjacent to a pedestal area in a central region over the gate, and a capacitor region is formed on an opposite side of the source and drain region from the pedestal area.

14. The NEMT of claim 11, wherein the channel member is self-aligned to the source region and the drain region collectively.

15. The NEMT of claim 11, wherein the source region and the drain region are distanced from a central region over the gate.

16. The NEMT of claim 11, wherein the nanotube member includes a plurality of nanotube elements extending across an opening in which the source region and the drain region are positioned within the substrate.

17. The NEMT of claim 16, wherein the channel member includes an elongated conductive element electrically insulatively coupled to each of the plurality of nanotube elements.

18. The NEMT of claim 16, further comprising a nanotube contact electrically connecting each of the plurality of nanotube elements.

19. A nanoelectromechanical transistor (NEMT) comprising:
    an insulative substrate including a gate adjacent thereto, a source region and a drain region separated from the gate by an insulator, the source region and the drain region positioned at one of: a) a distance from a central region over the gate, and b) adjacent to a pedestal area in a central region over the gate;

an electromechanically deflectable nanotube member; and
a channel member electrically insulatively coupled to the nanotube member so as to be aligned with the source region and the drain region,
wherein electromechanical deflection of the nanotube member is controllable, in response to an electrical potential applied to the gate and the nanotube member, between an off state and an on state, the on state placing the channel member in electrical connection with the source region and the drain region to form a current path.

* * * * *